US012088059B2

United States Patent
Fujii et al.

(10) Patent No.: US 12,088,059 B2
(45) Date of Patent: Sep. 10, 2024

(54) LIGHT EMITTING ELEMENT

(71) Applicant: SONY CORPORATION, Tokyo (JP)

(72) Inventors: Kentaro Fujii, Tokyo (JP); Tatsushi Hamaguchi, Tokyo (JP); Rintaro Koda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 617 days.

(21) Appl. No.: 17/281,532

(22) PCT Filed: Sep. 6, 2019

(86) PCT No.: PCT/JP2019/035195
§ 371 (c)(1),
(2) Date: Mar. 30, 2021

(87) PCT Pub. No.: WO2020/075428
PCT Pub. Date: Apr. 16, 2020

(65) Prior Publication Data
US 2022/0045476 A1    Feb. 10, 2022

(30) Foreign Application Priority Data

Oct. 12, 2018  (JP) ................. 2018-193400

(51) Int. Cl.
*H01S 5/183* (2006.01)
*H01S 5/028* (2006.01)
*H01S 5/343* (2006.01)

(52) U.S. Cl.
CPC ........ *H01S 5/0281* (2013.01); *H01S 5/18369* (2013.01); *H01S 5/343* (2013.01)

(58) Field of Classification Search
CPC .... H01S 5/0281; H01S 5/18369; H01S 5/343; H01S 5/0207; H01S 5/0215;
(Continued)

(56) References Cited

U.S. PATENT DOCUMENTS 9,595,810 B2 *    3/2017  Hamaguchi ............. H01S 5/187
2001/0011730 A1 * 8/2001  Saeki .................... H01L 33/105
257/79
(Continued)

FOREIGN PATENT DOCUMENTS

| JP | 2015-035541 A | 2/2015 |
|---|---|---|
| WO | 2017/018017 A1 | 2/2017 |
| WO | 2018/037679 A1 | 3/2018 |

OTHER PUBLICATIONS

Leonard, et al., "Nonpolar III-Nitride Vertical-Cavity Surface-Emitting Lasers Incorporating an Ion Implanted Aperture", Applied Physics Letters, vol. 107, Jul. 13, 2015, 05 pages.

*Primary Examiner* — Xinning(Tom) Niu
(74) *Attorney, Agent, or Firm* — CHIP LAW GROUP

(57) ABSTRACT

A light emitting element comprising a layered structure configured by layering a first light reflecting layer 41 configured by layering a plurality of thin films, a light emitting structure 20, and a second light reflecting layer 42 configured by layering a plurality of thin films, wherein the light emitting structure 20 is configured by layering, from the first light reflecting layer side, a first compound semiconductor layer 21, an active layer 23, and a second compound semiconductor layer 22, a second electrode 32 and an intermediate layer 70 are formed between the second compound semiconductor layer 22 and the second light reflecting layer 42 from the second compound semiconductor layer side, and the value of a surface roughness of a second surface 72 of the intermediate layer 70 in contact with the second light reflecting layer 42 is less than the value of a surface roughness of a first surface 71 of the intermediate layer 70 facing the second electrode 32.

16 Claims, 33 Drawing Sheets

(58) Field of Classification Search
CPC .. H01S 5/0217; H01S 5/0267; H01S 5/04254; H01S 5/2063; H01S 5/320275; H01S 5/04253; H01S 5/18341; H01S 5/18355; H01S 5/18394; H01S 5/34333; H01S 5/18361; H01S 5/18308; H01S 5/04252
See application file for complete search history.

(56) References Cited

U.S. PATENT DOCUMENTS

| | | | |
|---|---|---|---|
| 2005/0238075 A1* | 10/2005 | Jikutani | H01S 5/2231 372/45.01 |
| 2013/0010822 A1* | 1/2013 | Suzuki | H01S 5/18327 372/44.01 |
| 2018/0138663 A1* | 5/2018 | Lai | H01S 5/04253 |

* cited by examiner

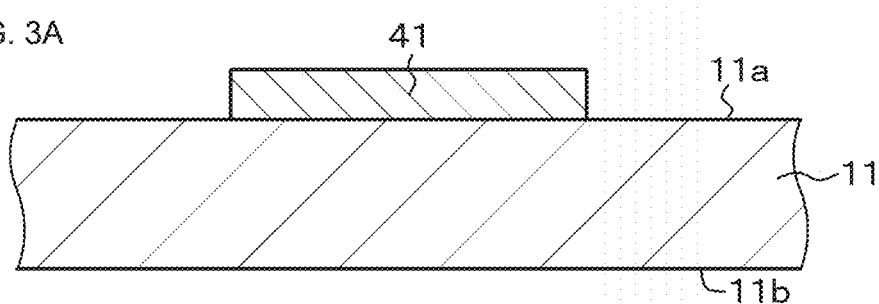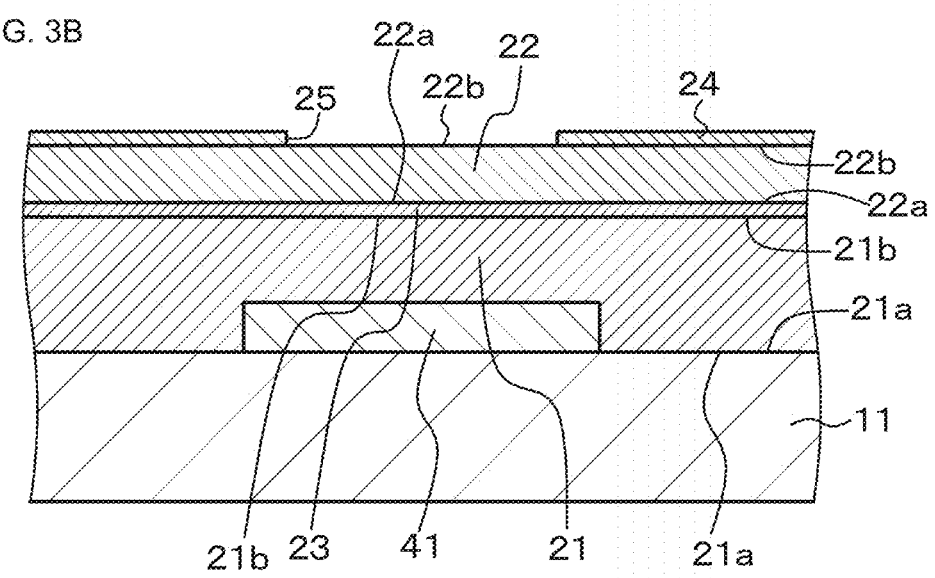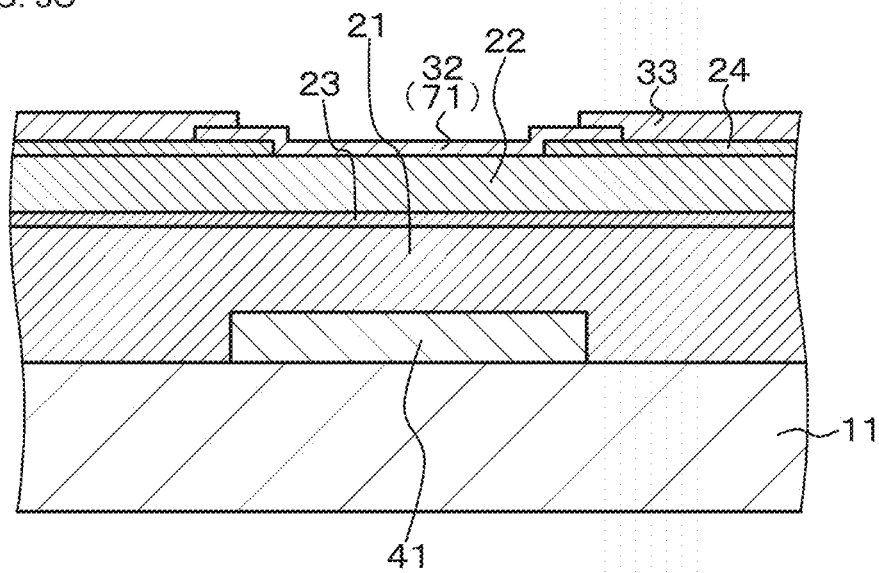

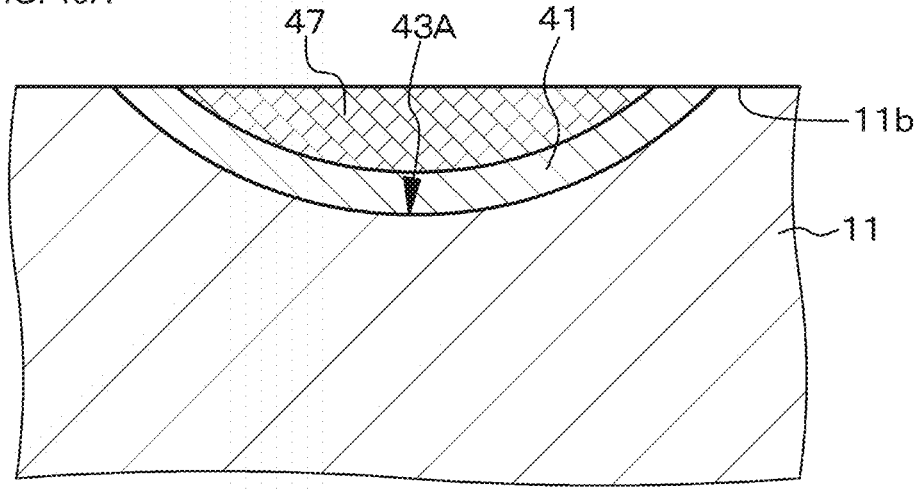
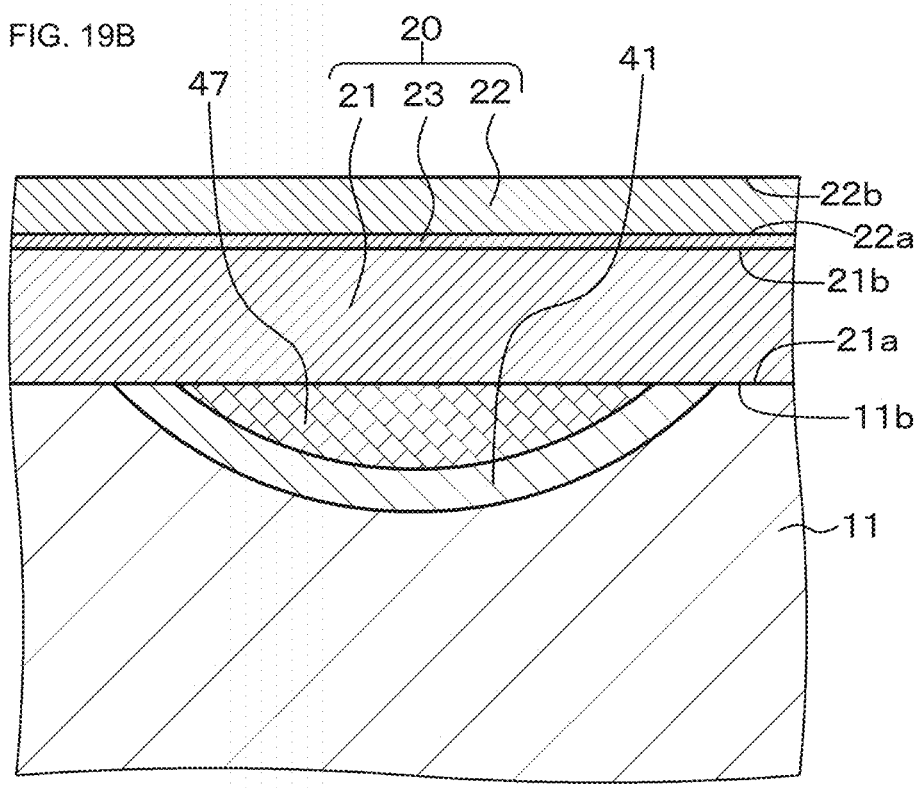

[FIRST LIGHT REFLECTING LAYER]

[FIRST LIGHT REFLECTING LAYER]

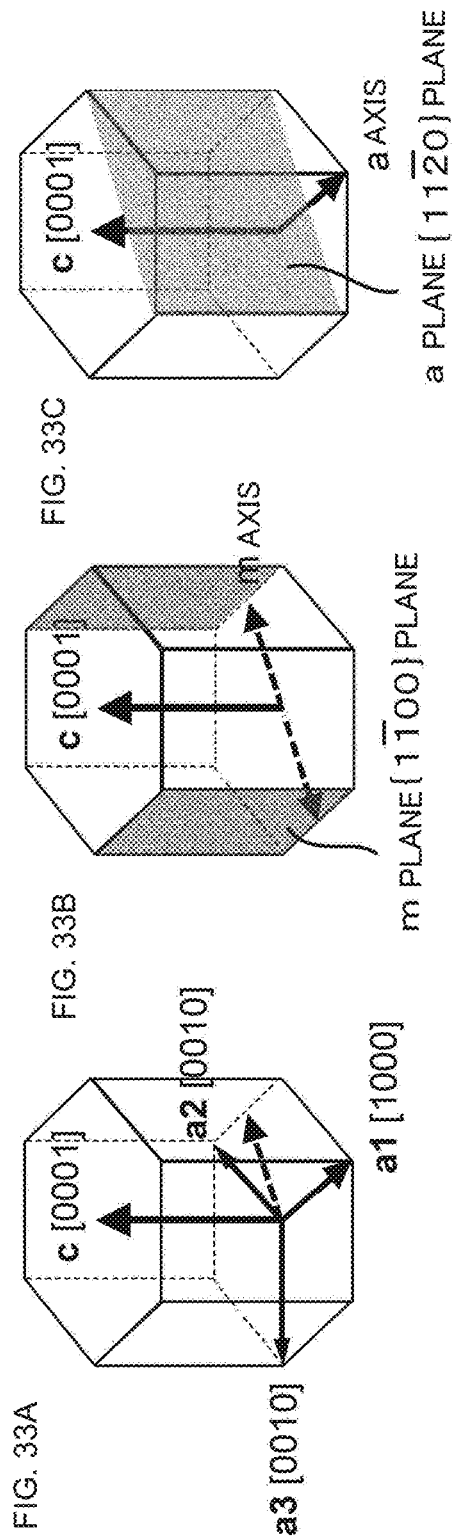
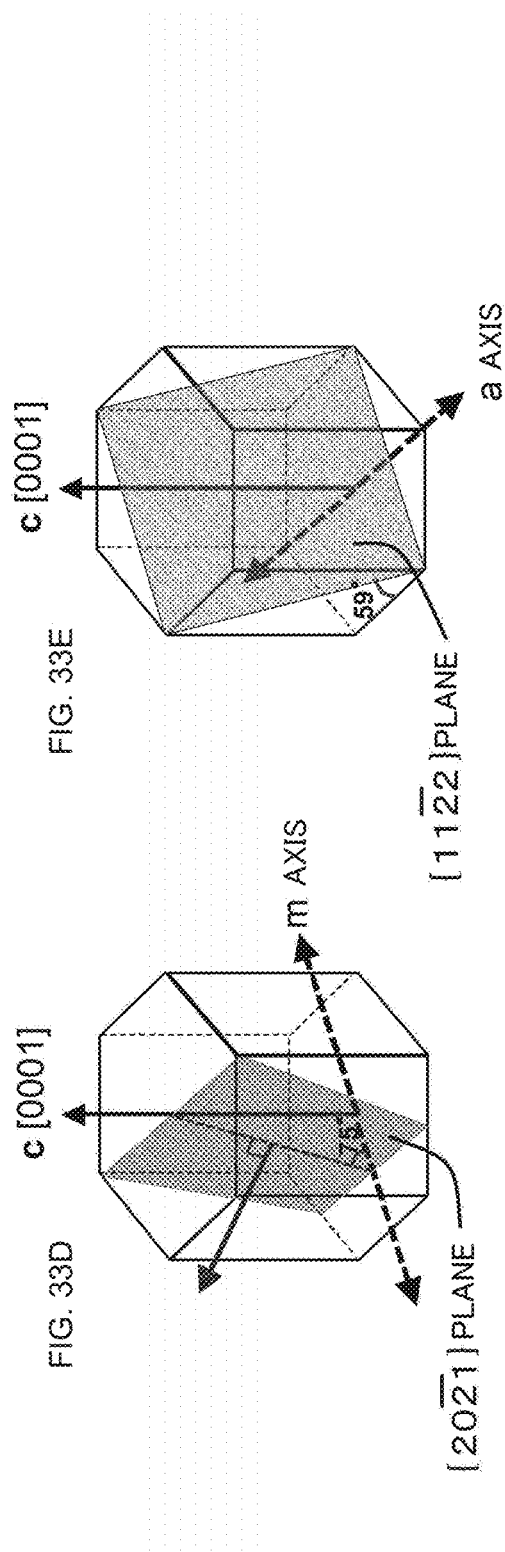

LIGHT EMITTING ELEMENT

CROSS REFERENCE TO RELATED APPLICATIONS

This application is a U.S. National Phase of International Patent Application No. PCT/JP2019/035195 filed on Sep. 6, 2019, which claims priority benefit of Japanese Patent Application No. JP 2018-193400 filed in the Japan Patent Office on Oct. 12, 2018. Each of the above-referenced applications is hereby incorporated herein by reference in its entirety.

TECHNICAL FIELD

The present disclosure relates to a light emitting element (specifically, a surface-emitting laser element called a vertical cavity laser, VCSEL).

BACKGROUND ART

For example, as disclosed in document "Nonpolar III-nitride vertical-cavity surface-emitting lasers incorporating an ion implanted aperture", in a surface-emitting laser element, laser oscillations are generated by causing light resonation between two light reflecting layers (Distributed Bragg Reflector layers, DBR layers). A light emitting structure is formed between the two DBR layers.

The light emitting structure is configured of an n-type GaN-based compound semiconductor layer, an active layer composed of MQW, and a p-type GaN-based compound semiconductor layer. Further, an ITO layer constituting one electrode (second electrode) is formed on the p-type GaN-based compound semiconductor layer, and a spacer layer composed of $Ta_2O_5$ having a thickness of ⅛ wavelength and a p-side DBR layer is sequentially formed on the ITO layer.

CITATION LIST

Non Patent Literature

[NPL 1]
"Nonpolar III-nitride vertical-cavity surface-emitting lasers incorporating an ion implanted aperture", APPLIED PHYSICS LETTERS 107, 011102 (2015).

SUMMARY

Technical Problem

In the surface-emitting laser element, the thickness of the active layer is very small as compared with the distance (cavity length) through which light reciprocates between the two DBR layers. Therefore, in order to lower the oscillation threshold value of the surface-emitting laser element, it is necessary to reduce the internal loss and loss in the DBR layer. Although the loss in DBR layer is reduced by increasing the light reflectance in the DBR layer, it is very important to suppress other types of loss in order to lower the oscillation threshold value. However, where unevenness occurs on the surface of the second electrode on the p-side DBR layer side, light scattering loss occurs at the interface between the second electrode side and the p-side DBR layer, and the oscillation threshold value cannot be lowered.

Therefore, an object of the present disclosure is to provide a light emitting element having a configuration and a structure in which light scattering loss is unlikely to occur.

Solution to Problem

A light emitting element of the present disclosure for achieving the above object includes:
a layered structure configured by layering
a first light reflecting layer configured by layering a plurality of thin films,
a light emitting structure, and
a second light reflecting layer configured by layering a plurality of thin films,
wherein
the light emitting structure is configured by layering, from the first light reflecting layer side,
a first compound semiconductor layer,
an active layer, and
a second compound semiconductor layer,
an electrode (hereinafter, may be referred to as a "second electrode") and an intermediate layer are formed between the second compound semiconductor layer and the second light reflecting layer from the second compound semiconductor layer side, and
assuming that the surface of the intermediate layer facing the electrode (second electrode) is a first surface and the surface of the intermediate layer in contact with the second light reflecting layer is a second surface, the value of a surface roughness of the second surface is less than the value of a surface roughness of the first surface.

BRIEF DESCRIPTION OF DRAWINGS

FIGS. 3A, 3B and 3C are schematic partial end views of a layered structure and the like for explaining a method for manufacturing the light emitting element of Embodiment 1.

FIGS. 19A and 19B are schematic partial end views of a layered structure and the like for explaining a method for manufacturing a light emitting element of Embodiment 9.

FIGS. 33A, 33B, 33C, 33D, and 33E are schematic views showing the crystal structure of a hexagonal nitride semiconductor for explaining a polar plane, a non-polar plane, and a semi-polar plane in a nitride semiconductor crystal.

DESCRIPTION OF EMBODIMENTS

Figure 1A:
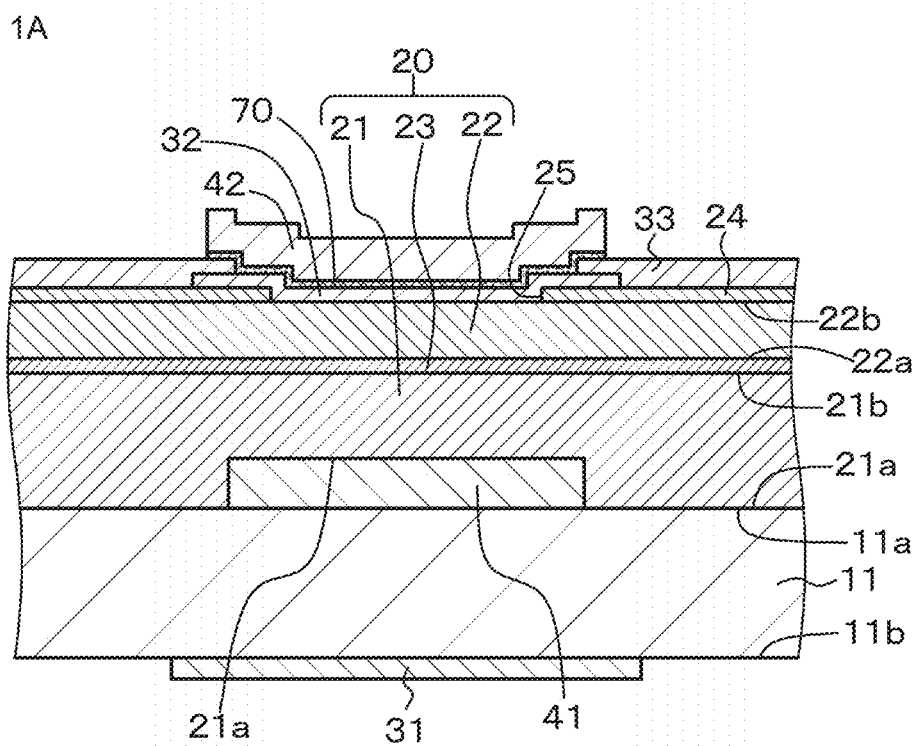
FIGS. 1A and 1B are a schematic partial cross-sectional view of the light emitting element of Embodiment 1 and an enlarged schematic partial cross-sectional view of the vicinity of the intermediate layer, respectively.

Hereinafter, the present disclosure will be described based on embodiments with reference to the drawings, but the present disclosure is not limited to the embodiments, and various numerical values and materials in the embodiments are merely illustrative. The description will be given in the following order.

1. General Description of Light Emitting Element of Present Disclosure
2. Embodiment 1 (light emitting element of the present disclosure)
3. Embodiment 2 (modification of Embodiment 1)
4. Embodiment 3 (modifications of Embodiment 1 and Embodiment 2)
5. Embodiment 4 (modifications of Embodiment 1 to Embodiment 3)
6. Embodiment 5 (modifications of Embodiment 1 to Embodiment 4)
7. Embodiment 6 (modifications of Embodiment 1 to Embodiment 5, light emitting elements having a fourth-A configuration)
8. Embodiment 7 (modification of Embodiment 6, light emitting element having a fourth-B configuration)
9. Embodiment 8 (modifications of Embodiment 6 and Embodiment 7, light emitting elements having a fifth configuration)
10. Embodiment 9 (modification of Embodiment 8)
11. Embodiment 10 (modifications of Embodiment 6 to Embodiment 9, light emitting elements having a first configuration)
12. Embodiment 11 (modifications of Embodiment 6 to Embodiment 10, light emitting elements having a second-A configuration)
13. Embodiment 12 (modification of Embodiment 11, light emitting element having a second-B configuration)
14. Embodiment 13 (modifications of Embodiment 11 and Embodiment 12, light emitting elements having a second-C configuration)
15. Embodiment 14 (modifications of Embodiment 11 to Embodiment 13, light emitting elements having a second-D configuration)
16. Embodiment 15 (modifications of Embodiment 11 to Embodiment 14)
17. Embodiment 16 (modifications of Embodiment 6 to Embodiment 10, a light emitting element having a third-A configuration, a light emitting element having a third-B configuration, a light emitting element having a third-C configuration, and a light emitting element having a third-D configuration)
18. Other <General Description of Light Emitting Element of Present Disclosure>

In a preferred mode of the light emitting element of the present disclosure, the value of the root mean square roughness Rq of the second surface of an intermediate layer in a region within a radius of 20 μm from a light emitting center is 1.0 nm or less. Alternatively, in a preferred mode, the value of the root mean square roughness Rq of the second surface of the intermediate layer in a region where the emission intensity is (1/e) or more of the maximum emission intensity is 1.0 nm or less. The value of the root mean square roughness Rq of the first surface of the intermediate layer is about 1.5 nm to 3.0 nm. The surface roughness is defined in JIS B 610:2001, and can be specifically measured on the basis of observations based on an atomic force microscope (AFM) or a cross-sectional TEM.

In a preferred mode of the light emitting element of the present disclosure including the above-mentioned various preferred modes, the value of the root mean square roughness Rq of the second surface of the intermediate layer in a region within a radius of 1 μm from a light emitting center is 2.0 nm or less.

Further, in a preferred mode of the light emitting element of the present disclosure including the above-mentioned various preferred modes, the optical thickness of the intermediate layer is larger than the optical thickness of the first layer of the second light reflecting layer in contact with the intermediate layer. In this case, assuming that the refractive index of the material constituting the intermediate layer is $n_M$, the refractive index of the material constituting the first layer of the second light reflecting layer in contact with the intermediate layer is $n_1$, and the wavelength of the main light emitted from the light emitting element is $\lambda_0$, in a preferred mode, the intermediate layer has a thickness exceeding $(\lambda_0/4 n_M)$, and the first layer of the second light reflecting layer in contact with the intermediate layer has a thickness of $(\lambda_0/4n_1)$, and in a more preferred mode, the intermediate layer has a thickness exceeding $(\lambda_0/2 n_M)$. Alternatively, in a preferred mode, the optical thickness of the intermediate layer is more than twice the optical thickness of the first layer of the second light reflecting layer in contact with the intermediate layer. In this way, by making the optical thickness of the intermediate layer larger than the optical thickness of the first layer of the second light reflecting layer in contact with the intermediate layer, the second surface of the intermediate layer becomes less susceptible to the influence of the state of unevenness of the surface of the second electrode facing the intermediate layer. As a result, a state in which the value of the surface roughness of the second surface of the intermediate layer is smaller than the value of the surface roughness of the first surface can be reliably achieved.

Further, in a desirable configuration of the light emitting element of the present disclosure including the various preferred modes described above, assuming that the refractive index of the material constituting the electrode (second electrode) is $n_0$, and the refractive index of the material constituting the intermediate layer is $n_M$, $$0.8 < n_0/n_M < 1.2,$$

preferably $$0.9 < n_0/n_M < 1.1,$$

and more preferably $$0.95 < n_0/n_M < 1.05$$

is satisfied. Alternatively, in a desirable configuration, assuming that the refractive index of the material constituting the electrode (second electrode) is no, and the refractive index of the material constituting the intermediate layer is $n_M$, $$|n_0 - n_M| \leq 0.1$$

is satisfied. In this way, by reducing the difference (or relative difference) between the refractive index $n_0$ of the material constituting the second electrode and the refractive index $n_M$ of the material constituting the intermediate layer, generation of light reflection at the interface between the second electrode and the intermediate layer is suppressed. As a result, generation of light scattering loss at the interface between the second electrode and the intermediate layer can be reliably suppressed.

Further, in a possible mode of the light emitting element of the present disclosure including various preferred modes and configurations described above, the material constituting the intermediate layer and the material constituting the first layer of the second light reflecting layer in contact with the intermediate layer are different, and the material constituting the intermediate layer and the material constituting the second layer of the second light reflecting layer in contact with the first layer are the same. A light emitting element having such a structure is referred to as a "light emitting element having a first structure" for convenience. Alternatively, a mode is possible in which the material constituting the intermediate layer and the material constituting the first layer of the second light reflecting layer in contact with the intermediate layer are different, the material constituting the intermediate layer and the material constituting the second layer of the second light reflecting layer in contact with the first layer are different, and the material constituting the first layer of the second light reflecting layer and the material constituting the second layer of the second light reflecting layer are different. A light emitting element having such a structure is referred to as a "light emitting element having a second structure" for convenience.

The material constituting the intermediate layer is referred to as "material-A" for convenience, the material constituting the first layer of the second light reflecting layer is referred to as "material-B" for convenience, and the material constituting the second layer of the second light reflecting layer is referred to as "material-C" for convenience. In the light emitting element having the first structure and the light emitting element having the second structure, the second light reflecting layer has a layered structure of material-B, material-C, material-B, material-C, material-B . . . from the light emitting structure side. Further, in the light emitting element having the first structure, the relationship of material-A=material-C≠material-B is valid, and in the light emitting element having the second structure, the relationships of material-A≠material-B material-A≠material-C material-B≠material-C are valid.

Further, in a possible mode of the light emitting element of the present disclosure including various preferred modes and configurations described above, the active layer is located in the vicinity of the maximum amplitude portion (the maximum amplitude portion occurring in a standing wave of light formed inside the layered structure) of light field intensity distribution of the light emitted from the light emitting element, and the intermediate layer is located in the vicinity of the minimum amplitude portion (the minimum amplitude portion occurring in a standing wave of light formed inside the layered structure) of the light field intensity distribution. Here, assuming that the position where the maximum amplitude portion occurs is $PS_{max\text{-}0}$, and the positions where the amplitude of (maximum amplitude portion)×0.95 occurs across the position $PS_{max-0}$ are $PS_{max-1}$ and $PS_{max-2}$, "in the vicinity of the maximum amplitude portion" indicates a region extending from the position $PS_{max-1}$ to the position $PS_{max-2}$. Further, assuming that the position where the minimum amplitude portion occurs is $PS_{min-0}$, and the positions where the amplitude of (minimum amplitude portion)×1.05 occurs across the position $PS_{min-0}$ are $PS_{min-1}$ and $PS_{min-2}$, "in the vicinity of the minimum amplitude portion" indicates a region extending from the position $PS_{min-1}$ to the position $PS_{min-2}$.

Further, the light emitting element of the present disclosure including various preferred modes and configurations described above can have a configuration in which the first compound semiconductor layer is formed on a substrate having a plurality of parallel grooves (vertical streaks) on the surface. In this case, a configuration is possible in which the substrate is composed of a GaN substrate having a {20-21} plane as the main surface. By forming the light emitting structure on such a substrate, it is possible to control the polarization of light emitted from the light emitting element. Here, the GaN substrate having the {20-21} plane which is a semi-polar plane is a GaN substrate in which the main surface is a surface where a c-plane is tilted by about 75 degrees in an in-axis direction.

In general, a configuration is possible in which the layered structure is formed on a main surface composed of a semi-polar plane or a non-polar plane (non-polar plane) of a GaN substrate. In this case, a configuration is possible in which an angle between the plane orientation of the main surface and the c-axis is 45 degrees or more and 80 degrees or less. Furthermore, a configuration is possible in which the main surface of the GaN substrate is composed of a {20-21} plane. For convenience, the notation {h k $\bar{\text{i}}$ l} plane {h $\bar{\text{k}}$ i l} plane of crystal planes exemplified below in, for example, the hexagonal system is referred to as {hk-il} plane and {h-kil} plane in the present description.

The polar plane, non-polar plane, and semi-polar plane in a nitride semiconductor crystal will be described below with reference to FIGS. 33A, 33B, 33C, 33D, and 33E. In FIGS. 33A, 33B, 33C, 33D, and 33E, FIG. 33A is a schematic view showing the crystal structure of a hexagonal nitride semiconductor. FIG. 33B, is a schematic view showing an m-plane and a {1-100} plane, which are non-polar planes, and the m-plane shown by the gray plane is a plane perpendicular to an m-axis direction. FIG. 33C, is a schematic view showing an a-plane and a {11-20} plane, which are non-polar planes, and the a-plane shown by the gray plane is a plane perpendicular to an a-axis direction. FIG. 33D, is a schematic view showing a {20-21} plane which is a semi-polar plane. The [20-21] direction perpendicular to the {20-21} plane shown by the gray plane is inclined by 75 degrees from the c-axis to the m-axis direction. FIG. 33E, is a schematic view showing a {11-22} plane which is a semi-polar plane. A [11-22] direction perpendicular to the {11-22} plane shown by the gray plane is inclined by 59 degrees from the c-axis to the a-axis direction. Table 1 below shows the angles formed by the plane orientations of various crystal planes and the c-axis. Planes represented by {11-2n} planes such as {11-21} plane, {11-22} plane, and {11-24} plane, {1-101} plane, {1-102} plane, and {1-103} plane are semi-polar planes.

TABLE 1

| Plane orientation | Angle with c-axis (degrees) |
|---|---|
| {1-100} | 90.0 |
| {11-20} | 90.0 |
| {20-21} | 75.1 |
| {11-21} | 72.9 |
| {1-101} | 62.0 |
| {11-22} | 58.4 |
| {1-102} | 43.2 |
| {1-103} | 32.0 |

In a possible mode of the light emitting element of the present disclosure including the preferred modes and configurations described above, the first compound semiconductor layer, the active layer and the second compound semiconductor layer (light emitting structure) are composed of a GaN-based compound semiconductor material. However, the present invention is not limited to this mode, and the light emitting structure may be configured of a GaAs-based compound semiconductor layer. Specific examples of the GaN-based compound semiconductor include GaN, AlGaN, InGaN, and AlInGaN. Further, these compound semiconductors may include, if desired, a boron (B) atom, a thallium (Tl) atom, an arsenic (As) atom, a phosphorus (P) atom, and an antimony (Sb) atom. The active layer preferably has a quantum well structure. Specifically, it may have a single quantum well structure (SQW structure) or a multiple quantum well structure (MQW structure). The active layer having a quantum well structure has a structure in which at least one well layer and at least one a barrier layer are layered, and a combination of (a compound semiconductor constituting the well layer and a compound semiconductor constituting the barrier layer) can be exemplified by $(In_yGa_{(1-y)}N, GaN)$, $(In_yGa_{(1-y)}N, In_zGa_{(1-z)}N)$ [where y>z], and $(In_yGa_{(1-y)}N, AlGaN)$. The first compound semiconductor layer can be configured of a first conductive type (for example, n type) compound semiconductor, and the second compound semiconductor layer can be configured of a second conductive type (for example, p type), which is different from the first conductive type, compound semiconductor. The first compound semiconductor layer and the second compound semiconductor layer are also referred to as a first clad layer and a second clad layer. It is preferable that a current constriction structure be formed between the second electrode and the second compound semiconductor layer. The first compound semiconductor layer and the second compound semiconductor layer may be layers having a single-layer structure, layers having a multilayer structure, or layers having a superlattice structure. Further, the layer may be provided with a composition gradient layer and a concentration gradient layer.

In order to obtain a current constriction structure, a current constriction layer composed of an insulating material (for example, $SiO_x$, $SiN_x$, or $AlO_x$) may be formed between the second electrode and the second compound semiconductor layer, or a mesa structure may be formed by etching the second compound semiconductor layer by an RIE method and the like, or some of the layers of the layered second compound semiconductor layer may be partially oxidized from the lateral direction to form a current constriction region, or an impurity may be ion-injected into the second compound semiconductor layer to form a region having reduced conductivity, or these methods may be combined as appropriate. However, the second electrode needs to be electrically connected to the portion of the second compound semiconductor layer through which the current flows due to the current constriction.

In the following description, the surface of the first compound semiconductor layer that is opposite to the active layer (light emitting layer) may be referred to as the second surface of the first compound semiconductor layer, and the surface of the first compound semiconductor that is opposite to the second surface of the first compound semiconductor layer may be referred to as the first surface of the first compound semiconductor layer. The surface of the second compound semiconductor layer that is opposite to the active layer may be referred to as the first surface of the second compound semiconductor layer, and the surface of the second compound semiconductor layer that is opposite to the first surface of the second compound semiconductor layer may be referred to as the second surface of the second compound semiconductor layer.

A method for forming various compound semiconductor layers constituting the light emitting element can be exemplified by, but is not limited to, metal organic vapor phase deposition methods (MOCVD method, Metal Organic-Chemical Vapor Deposition method, MOVPE method, Metal Organic-Vapor Phase Epitaxy method), molecular beam epitaxy method (MBE method), hydride vapor deposition method (HVPE method) in which a halogen contributes to transport or reaction, atomic layer deposition method (ALD method, Atomic Layer Deposition method), migration enhanced epitaxy method (MEE method, Migration-Enhanced Epitaxy method), plasma assisted physical vapor phase deposition method (PPD method), and the like. Here, examples of an organic gallium source gas in the MOCVD method include trimethylgallium (TMG) gas and triethylgallium (TEG) gas, and examples of a nitrogen source gas include ammonia gas and hydrazine gas. In the formation of a GaN-based compound semiconductor layer having an n-type conductivity, for example, silicon (Si) may be added as an n-type impurity (n-type dopant), and in the formation of a GaN-based compound semiconductor layer having a p-type conductivity, for example, magnesium (Mg) may be added as a p-type impurity (p-type dopant). When aluminum (Al) or indium (In) is included as a constituent atom of the GaN-based compound semiconductor layer, trimethylaluminum (TMA) gas may be used as an Al source, or trimethylindium (TMI) gas may be used as an In source. Further, monosilane gas ($SiH_4$ gas) may be used as a Si source, and biscyclopentadienylmagnesium gas, methylcyclopentadienylmagnesium, and biscyclopentadienylmagnesium ($Cp_2Mg$) may be used as a Mg source. Ge, Se, Sn, C, Te, S, O, Pd, and Po can be mentioned, in addition to Si, as n-type impurities (n-type dopants), and Zn, Cd, Be, Ca, Ba, C, Hg, and Sr can be mentioned, in addition to Mg, as p-type impurities (p-type dopants).

A first electrode electrically connected to the first compound semiconductor layer is formed, and a second electrode is formed in contact with the second compound semiconductor layer. The first electrode is formed in contact with the first compound semiconductor layer or is electrically connected to the first compound semiconductor layer through a substrate. In a possible mode, the first electrode is composed of a metal or an alloy, and in a possible mode, the second electrode is composed of a transparent conductive material. By configuring the second electrode of a transparent conductive material, the current can be spread in the lateral direction (in-plane direction of the second compound semiconductor layer), and the current can be efficiently supplied to the element region. The second electrode is formed on the second surface of the second compound semiconductor layer. Here, the "element region" refers to a region in which a constricted current is injected, a region in which light is confined due to a difference in refractive index or the like, a region in which laser oscillation occurs in a region sandwiched between the first light reflecting layer and the second light reflecting layer, or a region that actually contributes to laser oscillation in a region sandwiched between the first light reflecting layer and the second light reflecting layer.

The value of the root mean square roughness Rq of the second surface of the intermediate layer in the element region, or a region surrounded by the current constriction region or the current constriction layer is preferably 1.0 nm or less.

The light emitting element of the present disclosure including various preferred modes described above can be embodied such that the light generated in the active layer is emitted to the outside through the second light reflecting layer (hereinafter, for convenience, can be referred to as "a light emitting element of a second light-reflecting layer emission type"), or such that the light generated in the active layer is emitted to the outside through the first light reflecting layer (hereinafter, for convenience, can be referred to as "a light emitting element of a first light-reflecting layer emission type"). In the light emitting element of a first light-reflecting layer emission type, the substrate (light emitting element manufacturing substrate) may be removed in some cases. In a possible mode, when the substrate (light emitting element manufacturing substrate), the second light reflecting layer is fixed to a support substrate. The light emitting element may have a configuration composed of a surface-emitting laser element (vertical cavity laser, VCSEL) that emits light from the top surface of the first compound semiconductor layer through the first light reflecting layer, or may have a configuration composed of a surface-emitting laser element that emits light from the top surface of the second compound semiconductor layer through the second light reflecting layer.

Where the substrate (light emitting element manufacturing substrate) is to be removed, for example, it is possible to form the first light reflecting layer and the first compound semiconductor layer on the substrate, sequentially form the active layer, the second compound semiconductor layer, the second electrode, the intermediate layer, and the second light reflecting layer on the first compound semiconductor layer, and then remove the substrate by using the first light reflecting layer as a stopper layer. Specifically, for example, it is possible to form the first light reflecting layer and the first compound semiconductor layer on a substrate, sequentially form the active layer, the second compound semiconductor layer, the second electrode, the intermediate layer, and the second light reflecting layer on the first compound semiconductor layer, next fix the second light reflecting layer to the support substrate, and then remove the substrate by using the first light reflecting layer as a stopper layer, and expose the first compound semiconductor layer (the first surface of the first compound semiconductor layer) and the first light reflecting layer. Further, the first electrode may be formed on the first compound semiconductor layer (the first surface of the first compound semiconductor layer). Alternatively, where the removal amount is controlled based on the removal rate (polishing rate) of the substrate, the stopper layer may not be used.

In a possible mode, the substrate (light emitting element manufacturing substrate) can be removed based on a chemical/mechanical polishing method (CMP method). First, a part of the substrate may be removed or the thickness of the substrate may be reduced by a wet etching method using an alkaline aqueous solution such as sodium hydroxide aqueous solution or potassium hydroxide aqueous solution, ammonia solution+hydrogen peroxide solution, sulfuric acid solution+hydrogen peroxide solution, hydrochloric acid solution+hydrogen peroxide solution, phosphoric acid solution+hydrogen peroxide solution, or the like, a dry etching method, a lift-off method using a laser, a mechanical polishing method, and the like or a combination thereof, and then a chemical/mechanical polishing method may be carried out to expose the first compound semiconductor layer (the first surface of the first compound semiconductor layer) and the first light reflecting layer.

The substrate (light emitting element manufacturing substrate) can be exemplified by a GaN substrate, a sapphire substrate, a GaAs substrate, a SiC substrate, an alumina substrate, a ZnS substrate, a ZnO substrate, an AlN substrate, a LiMgO substrate, a $LiGaO_2$ substrate, a $MgAL_2O_4$ substrate, an InP substrate, a Si substrate, and these substrates provided with an underlayer or a buffer layer formed on the surface (main surface) of the substrate. Where a GaN-based compound semiconductor layer is to be formed on a substrate, it is preferable to use a GaN substrate because the defect density is low. It is known that polarity/non-polarity/semi-polarity and characteristics of a GaN substrate change depending on the growth surface, but any main surface (second surface) of the GaN substrate can be used for forming a compound semiconductor layer. Further, regarding the main surfaces of these substrates, depending on a crystal structure (for example, a cubic type, a hexagonal type, or the like), crystal orientation planes such as so-called A plane, B plane, C plane, R plane, M plane, N plane, S plane, and the like, planes obtained by making these planes offset in a specific direction, and the like can also be used. Alternatively, as described above, a configuration may be also used in which the substrate is composed of a GaN substrate having a {20-21} plane as a main surface.

The support substrate may be configured of, for example, various substrates exemplified by light emitting element manufacturing substrates, or may be configured of an insulating substrate composed of AlN and the like, a semiconductor substrate composed of Si, SiC, Ge and the like, a metal substrate, or an alloy substrate, but it is preferable to use a conductive substrate, and from viewpoints of mechanical properties, elastic deformation, plastic deformability, heat dissipation, and the like, it is preferable to use a metal substrate or an alloy substrate. As the thickness of the support substrate, for example, 0.05 mm to 1 mm can be exemplified. As a method for fixing the second light reflecting layer to the supporting substrate, a known method such as a solder bonding method, a room temperature bonding method, a bonding method using a pressure-sensitive adhesive tape, a bonding method using wax bonding, and a method using an adhesive can be used. However, from a viewpoint of ensuring conductivity, it is desirable to use the solder bonding method or the room temperature bonding method. For example, where a silicon semiconductor substrate, which is a conductive substrate, is used as the support substrate, it is desirable to use a method capable of bonding at a low temperature of 400° C. or lower in order to suppress warpage due to a difference in thermal expansion coefficient. Where a GaN substrate is used as the support substrate, a bonding temperature may be 400° C. or higher.

Where the substrate is removed in the light emitting element of the first light reflecting layer emission type, the arrangement state of the first light reflecting layer and the first electrode on the first surface of the first compound semiconductor layer can be exemplified by a state in which the first light reflecting layer and the first electrode are in contact with each other, or by a state in which the first light reflecting layer and the first electrode are separated from each other, and in some cases, by a state in which the first electrode is formed even on an edge portion of the first light reflecting layer, or a state in which the first light reflecting layer is formed even on an edge portion of the first electrode. Here, in a case of the state in which the first light reflecting layer is formed even on an edge portion of the first electrode, the first electrode needs to have an opening having a certain size in order to prevent absorption of fundamental mode light of laser oscillation as much as possible. The size of the opening varies depending on the wavelength in the fundamental mode and the optical confinement structure in a lateral direction (in-plane direction of the first compound semiconductor layer), and therefore is not limited, but is preferably approximately on the order of several times the oscillation wavelength Xo. Alternatively, the first light reflecting layer and the first electrode are separated from each other, that is, have an offset. A configuration is possible in which the separation distance is within 1 mm.

Further, in the light emitting element of the present disclosure including the various preferred modes described above, the surface roughness Ra of the second compound semiconductor layer (the second surface of the second compound semiconductor layer) is preferably 1.0 nm or less.

The first electrode desirably has a single-layer configuration or a multilayer configuration including at least one kind of metal (inclusive of alloy) selected from the group consisting of, for example, gold (Au), silver (Ag), palladium (Pd), platinum (Pt), nickel (Ni), Ti (titanium), vanadium (V), tungsten (W), chromium (Cr), Al (aluminum), Cu (copper), Zn (zinc), tin (Sn) and indium (In), and can be specifically exemplified by Ti/Au, Ti/Al, Ti/Al/Au, Ti/Pt/Au, Ni/Au, Ni/Au/Pt, Ni/Pt, Pd/Pt and Ag/Pd. The layer before the "/" in the multilayer configuration is located closer to the active layer. The same applies to the following description. The first electrode can be formed by a PVD method such as a vacuum vapor deposition method or a sputtering method.

Examples of the transparent conductive material constituting the second electrode include an indium-based transparent conductive material [specifically, for example, indium-tin oxide (including ITO, Indium Tin Oxide, Sn-doped $In_2O_3$, crystalline ITO and amorphous ITO), indium-zinc oxide (IZO, Indium Zinc Oxide), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO], tin-based transparent conductive material [specifically, for example, tin oxide ($SnO_2$), ATO (Sb-doped $SnO_2$), FTO (F-doped $SnO_2$)], zinc-based transparent conductive material [specifically, for example, zinc oxide (including ZnO, Al-doped ZnO (AZO) and B-doped ZnO), gallium-doped zinc oxide (GZO), AlMgZnO (aluminum oxide- and magnesium oxide-doped zinc oxide)], and NiO. Alternatively, as the second electrode, a transparent conductive film having gallium oxide, titanium oxide, niobium oxide, antimony oxide, nickel oxide and the like as a base layer can be mentioned, and transparent conductive materials such as a spinel-type oxide and an oxide having an $YbFe_2O_4$ structure can be mentioned. However, the material constituting the second electrode depends on the arrangement state of the second light reflecting layer and the second electrode, but is not limited to the transparent conductive material, and a metal such as palladium (Pd), platinum (Pt), nickel (Ni), gold (Au), cobalt (Co), and rhodium (Rh) can also be used. The second electrode may be configured of at least one of these materials. The second electrode can be formed by, for example, a PVD method such as a vacuum vapor deposition method or a sputtering method. Alternatively, a low-resistance semiconductor layer can be used as the transparent electrode layer, and in this case, specifically, an n-type GaN-based compound semiconductor layer can also be used. Furthermore, when the layer adjacent to the n-type GaN-based compound semiconductor layer is of a p-type, the electrical resistance at the interface can be reduced by joining the two layers via a tunnel junction.

A pad electrode may be provided on the first electrode or the second electrode for electrical connection to an external electrode or circuit. The pad electrode desirably has a single-layer configuration or a multilayer configuration including at least one kind of metal selected from the group consisting of titanium (Ti), aluminum (Al), platinum (Pt), gold (Au), nickel (Ni), and palladium (Pd). Alternatively, the pad electrode may have a multilayer configuration such as a Ti/Pt/Au multilayer configuration, a Ti/Au multilayer configuration, a Ti/Pd/Au multilayer configuration, a Ti/Pd/Au multilayer configuration, a Ti/Ni/Au multilayer configuration, or a Ti/Ni/Au/Cr/Au multilayer configuration. Where the first electrode includes an Ag layer or an Ag/Pd layer, a cover metal layer composed of, for example, Ni/TiW/Pd/TiW/Ni is preferably formed on a surface of the first electrode, and a pad electrode composed of, for example, a multilayer configuration of Ti/Ni/Au or a multilayer configuration of Ti/Ni/Au/Cr/Au is preferably formed on the cover metal layer.

The material (material-A) constituting the intermediate layer can be exemplified by materials constituting the light reflecting layer described hereinbelow. However, in the light emitting element having the first structure and the light emitting element having the second structure, it is necessary to satisfy the relationship of material-A, material-B, and material-C as described hereinabove. The intermediate layer may have a single-layer structure or a multilayer structure.

The light reflecting layer (distributed Bragg reflector layer, (DBR layer)) is constituted by, for example, a semiconductor multilayer film (for example, an AlInGaN film) or a dielectric multilayer film. Examples of a dielectric material include an oxide, a nitride (for example, $SiN_X$, $AlN_X$, $AlGaN$, $GaN_X$, $BN_X$, or the like), a fluoride, and the like of Si, Mg, Al, Hf, Nb, Zr, Sc, Ta, Ga, Zn, Y, B, Ti, or the like. Specific examples thereof include $SiO_X$, $TiO_X$, $NbO_X$, $ZrO_X$, $TaO_X$, $ZnO_X$, $AlO_X$, $HfO_X$, $SiN_X$, $AlN_X$, and the like. In addition, the light reflecting layer can be obtained by alternately layering two or more kinds of dielectric films including dielectric materials having different refractive indices among these dielectric materials. For example, a multilayer film such as $SiO_X/SiN_Y$, $SiO_X/TaO_X$, $SiO_X/NbO_Y$, $SiO_X/ZrO_Y$, or $SiO_X/AlN_Y$ is preferable. In order to obtain the desired light reflectance, a material constituting each dielectric film, a film thickness, the number of laminated layers, and the like may be selected as appropriate. The thickness of each dielectric film can be adjusted, as appropriate, depending on a material used and the like and is determined by $\lambda_0$ and the refractive index n' of the material used at Xo. Specifically, the thickness of each dielectric film is preferably an odd multiple of $\lambda_0/(4n')$ or has a value close to the odd multiple. For example, in a case where the light reflecting layer is constituted by $SiO_X/NbO_Y$ in a light emitting element having $\lambda_0$ of 410 nm, the thickness of each dielectric film can be exemplified by about 40 nm to 70 nm. The number of layered layers can be exemplified by 2 or more, and preferably by about 5 to 20. The total thickness of the light reflecting layer can be exemplified by, for example, about 0.6 m to 1.7 μm. Further, the light reflectance of the light reflecting layer is preferably 95% or higher.

Alternatively, the first light reflecting layer may be provided with a dielectric film including at least N (nitrogen) atoms, and the dielectric film including N atoms is preferably the uppermost layer of the dielectric multilayer film. Alternatively, the first light reflecting layer may be coated with a dielectric material layer including at least N (nitrogen) atoms. Alternatively, by subjecting the surface of the first light reflecting layer to a nitriding treatment, the surface of the first light reflecting layer may be formed into a layer including at least N (nitrogen) atoms (hereinafter referred to as "surface layer" for convenience). The thickness of the dielectric film, the dielectric material layer, or the surface layer (the refractive index of the material constituting these layers is represented by n") including at least N atoms is preferably an odd multiple of $\lambda_0/(4n")$ or has a value close to the odd multiple. Specific examples of a material constituting the dielectric film or the dielectric material layer including at least N atoms include $SiN_X$ and $SiO_XN_Z$. In this way, when a compound semiconductor layer that covers the first light reflecting layer is formed by forming a dielectric film, a dielectric material layer, or a surface layer including at least N atoms, it is possible to improve a deviation between a crystal axis of the compound semiconductor layer coating the first light reflecting layer and a crystal axis of a light emitting element manufacturing substrate, and to enhance the quality of a light emitting structure that will serve as a resonator.

The light reflecting layer and the intermediate layer can be formed on the basis of a known method. Specific examples of the method include a PVD method such as a vacuum vapor deposition method, a sputtering method, a reactive sputtering method, an ECR plasma sputtering method, a magnetron sputtering method, an ion beam assisted vapor deposition method, an ion plating method, and a laser ablation method; various CVD methods; a coating method such as a spraying method, a spin coating method, or a dipping method; a method combining two or more of these methods; a method combining these methods with one or more types of treatment selected from the group consisting of a whole or partial pre-treatment, irradiation with an inert gas (Ar, He, Xe, or the like) or plasma, irradiation with an oxygen gas, an ozone gas, or plasma, an oxidation treatment (heat treatment), an exposure treatment, and the like.

The size and shape of the light reflecting layer and the intermediate layer are not particularly limited as long as a current injection region (described hereinbelow) or an element region is covered thereby. Specific examples of the shape of the element region, the first light reflecting layer, the second light reflecting layer, and the boundary between the current injection region and the current non-injection inner region, the shape of the boundary between the current non-injection inner region and the current non-injection outer region, and the planar shape of an opening provided in the element region or the current constriction region include circular, elliptical, rectangular, and polygonal (triangular, quadrangular, hexagonal, and the like) shapes. Furthermore, the planar shape of the first electrode can be exemplified by an annular shape. It is desirable that the planar shape of an opening provided in the element region, the first light reflecting layer, the second light reflecting layer, or the current constriction layer, the planar shape of the inner ring of the annular first electrode, the shape of the boundary between the current injection region and current non-injection inner region, and the shape of the boundary between the current non-injection inner region and the current non-injection outer region be similar. When the shape of the boundary between the current injection region and the current non-injection inner region is circular, the diameter is preferably about 5 μm to 100 μm.

The side surface and the exposed surface of the layered structure or light emitting structure may be coated with a coating layer. The coating layer can be formed on the basis of a known method. The refractive index of a material constituting the coating layer is preferably smaller than the refractive index of a material constituting the layered structure or light emitting structure. An insulating material constituting the coating layer can be exemplified by a $SiO_X$-based material including $SiO_2$, a $SiN_X$-based material, a $SiO_XN_Z$-based material, $TaO_X$, $ZrO_X$, $AlN_X$, $AlO_X$, and $GaO_X$, and further examples include organic materials such as polyimide resins. Examples of a method for forming the coating layer include a PVD method such as a vacuum vapor deposition method or a sputtering method, and a CVD method. The coating layer can also be formed on the basis of a coating method.

Embodiment 1

Embodiment 1 relates to the light emitting element of the present disclosure.

Figure 1B:
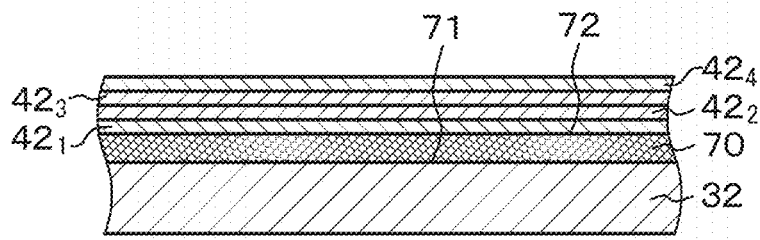

As shown in FIG. 1A for a schematic partial cross-sectional view and FIG. 1B for a schematic partial cross-sectional view in which the vicinity of the intermediate layer is enlarged, the light emitting element of Embodiment 1 or the light emitting element of each of Embodiment 2 to Embodiment 16 is specifically a surface-emitting laser element (vertical cavity laser, VCSEL) including
  a layered structure formed by layering
    a first light reflecting layer 41 formed by layering a plurality of thin films,
    a light emitting structure 20, and
    a second light reflecting layer 42 formed by layering a plurality of thin films,
  wherein
  the light emitting structure 20 is formed by layering, from the first light reflecting layer side,
    a first compound semiconductor layer 21,
    an active layer (light emitting layer) 23, and
    a second compound semiconductor layer 22.

An electrode (second electrode 32) and an intermediate layer 70 are formed between the second compound semiconductor layer 22 and the second light reflecting layer 42 from the side of the second compound semiconductor layer 22.

When the surface of the intermediate layer 70 facing the electrode (second electrode 32) is taken as a first surface 71, and the surface of the intermediate layer 70 in contact with the second light reflecting layer 42 is taken as a second surface 72, the value of the surface roughness of the second surface 72 is smaller than the value of the surface roughness of the first surface 71.

Here, the intermediate layer 70 is a kind of planarizing layer, and the value of the root mean square roughness Rq of the second surface 72 of the intermediate layer 70 in the region within a radius of 20 μm from the emission center is 1.0 nm or less. Alternatively, the value of the root mean square roughness Rq of the second surface 72 of the intermediate layer 70 in the region where the emission intensity is (1/e) or more of the maximum emission intensity is 1.0 nm or less. Further, the value of the root mean square roughness Rq of the second surface 72 of the intermediate layer 70 in the region within a radius of 1 μm from the emission center is 2.0 nm or less.

The material (material-A) constituting the intermediate layer 70 and the material (material-B) constituting a first layer 42$_1$ of the second light reflecting layer 42 in contact with the intermediate layer 70 are different from each other, and the material (material-A) constituting the intermediate layer 70 and the material (material-C) constituting a second layer 42$_2$ in contact with the first layer 42$_1$ of the second light reflecting layer 42 are the same. That is, the light emitting element of Embodiment 1 can be configured as a light emitting element having the first structure. The intermediate layer 70 is configured of the material-A, and the second light reflecting layer 42 has a layered structure of material-B, material-C, material-B, material-C, material-B, . . . from the light emitting structure side. Further, the first light reflecting layer 41 has a layered structure of material-B, material-C, material-B, material-C, material-B, . . . from the light emitting structure side. The material-A and the material-C were configured of $SiO_2$, and the material-B was configured of $Ta_2O_5$. The total number of layers of the thin films constituting the first light reflecting layer 41 and the second light reflecting layer 42 was 23 layers. In FIG. 1B, the second electrode 32, the intermediate layer 70, the first layer 42$_1$ the second layer 42$_2$, the third layer 42$_3$, and the fourth layer 42$_4$ of the second light reflecting layer 42 are shown as a schematic partial cross-sectional view.

Alternatively, the material (material-A) constituting the intermediate layer 70 and the material (material-B) constituting the first layer 42$_1$ of the second light reflecting layer 42 in contact with the intermediate layer 70 are different from each other,
  the material (material-A) constituting the intermediate layer 70 and the material (material-C) constituting the second layer 42$_2$ in contact with the first layer 42$_1$ of the second light reflecting layer 42 are different from each other, and the material (material-B) constituting the first layer 42$_1$ of the second light reflecting layer 42 and the material (material-C) constituting the second layer 42$_2$ of the second light reflecting layer 42 are different from each other. That is, the light emitting element of Embodiment 1 can be configured as a light emitting element having the second structure. The intermediate layer 70 is configured of the material-A, and the second light reflecting layer 42 has a layered structure of material-B, material-C, material-B, material-C, material-B, . . . from the light emitting structure side. Further, the first light reflecting layer 41 has a layered structure of material-B, material-C, material-B, material-C, material-B, . . . from the light emitting structure side. The material-A was configured of ITO, the material-B was configured of $Ta_2O_5$, and the material-C was configured of $SiO_2$. The total number of layers of the thin films constituting the first light reflecting layer 41 and the second light reflecting layer 42 was 23 layers.

In Embodiment 1 or Embodiment 2 to Embodiment 16 described hereinbelow, the first compound semiconductor layer 21, the active layer 23, and the second compound semiconductor layer 22 (light emitting structure 20) are composed of a GaN-based compound semiconductor material. Specifically, the first compound semiconductor layer 21 is composed of an n-GaN layer, the active layer 23 is composed of a quintuple multiple quantum well structure in which an $In_{0.04}Ga_{0.96}N$ layer (barrier layer) and an $In_{0.16}Ga_{0.84}N$ layer (well layer) are layered, and the second compound semiconductor layer 22 is composed of a p-GaN layer. Further, the first electrode 31 is composed of Ti/Pt/Au, and a pad electrode (not shown) composed of, for example, Ti/Pt/Au or V/Pt/Au and serving for electrical connection to an external electrode or circuit is formed on or connected to the edge of the first electrode 31. The second electrode 32 is composed of a transparent conductive material, specifically ITO, and a pad electrode 33 composed of, for example, Pd/Ti/Pt/Au, Ti/Pd/Au, of Ti/Ni/Au and serving for electrical connection to an external electrode or circuit is formed on or connected to the edge of the second electrode 32. In the light emitting element of Embodiment 1, the second electrode 32 is provided between the second compound semiconductor layer 22 and the second light reflecting layer 42. A resonator is configured of a region of the first light reflecting layer 41 from a first surface 21a of the first compound semiconductor layer 21 to a certain depth, the light emitting structure 20 (first compound semiconductor layer 21, active layer 23, and second compound semiconductor layer 22), and a region of the second light reflecting layer 42 from a second surface 22b of the second compound semiconductor layer 22 to a certain depth. The cavity length is $5\times10^{-6}$ m (5 μm) or more. Of the light emitted from the active layer, the wavelength $\lambda_0$ of the light having the maximum intensity (hereinafter, may be referred to as "oscillation wavelength" for convenience) is 445 nm.

The first light reflecting layer 41 and the first compound semiconductor layer 21 are provided on a conductive substrate 11 (light emitting element manufacturing substrate, specifically, an n-GaN substrate), specifically on a first surface 11a of the substrate 11. The first surface 11a of the substrate 11 has, for example, a {0001} plane as a main surface. Further, the light generated in the active layer 23 is emitted to the outside via the second light reflecting layer 42. That is, the light emitting element of Embodiment 1 is a light emitting element of the second light reflecting layer emission type and is composed, specifically, of a surface-emitting laser element (vertical cavity laser, VCSEL) in which light is emitted from the top surface of the second compound semiconductor layer 22 via the second light reflecting layer 42. The first electrode 31 is provided on the outer surface (second surface 11b) of the substrate 11. The first compound semiconductor layer 21 and the first light reflecting layer 41 composed of a multilayer film are formed on the first surface 11a that is opposite to the second surface 11b of the substrate 11.

In the light emitting element of Embodiment 1, a current constriction layer 24 composed of an insulating material such as $SiO_2$ is formed between the second electrode 32 and the second compound semiconductor layer 22. A circular opening 25 is formed in the current constriction layer 24, and the second compound semiconductor layer 22 is exposed at the bottom of the opening 25. The value of the root mean square roughness Rq of the second surface 72 of the intermediate layer 70 in the region surrounded by the current constriction layer 24 is 1.0 nm or less.

The second electrode 32 is formed on the second surface 22b of the second compound semiconductor layer 22, and the second light reflecting layer 42 composed of a multilayer film is formed on the second electrode 32 with the intermediate layer 70 interposed therebetween. Specifically, the second electrode 32 is formed to extend from above the second surface 22b of the second compound semiconductor layer 22 onto the current constriction layer 24, the intermediate layer 70 is formed on the second electrode 32, and the second light reflecting layer 42 is formed on the second surface 72 of the intermediate layer 70. Further, a pad electrode 33 for electrically connecting to an external electrode or circuit is connected on the edge of the second electrode 32. The planar shape of the element region is circular, and the planar shape of the first electrode 31, the first light reflecting layer 41, the second light reflecting layer 42, and the opening 25 provided in the current constriction layer 24 is also circular. The first light reflecting layer 41 and the second light reflecting layer 42 have a multilayer structure, but are represented by one layer for simplification of the drawings. The formation of the current constriction layer 24 is not essential.

Further, the active layer 23 is located in the vicinity of the maximum amplitude portion of the light field intensity distribution of the light emitted from the light emitting element (the maximum amplitude portion generated in the standing wave of light formed inside the layered structure), and the intermediate layer 70 is located in the vicinity of the minimum amplitude portion of the light field intensity distribution (the minimum amplitude portion generated in the standing wave of light formed inside the layered structure).

Figure 2:
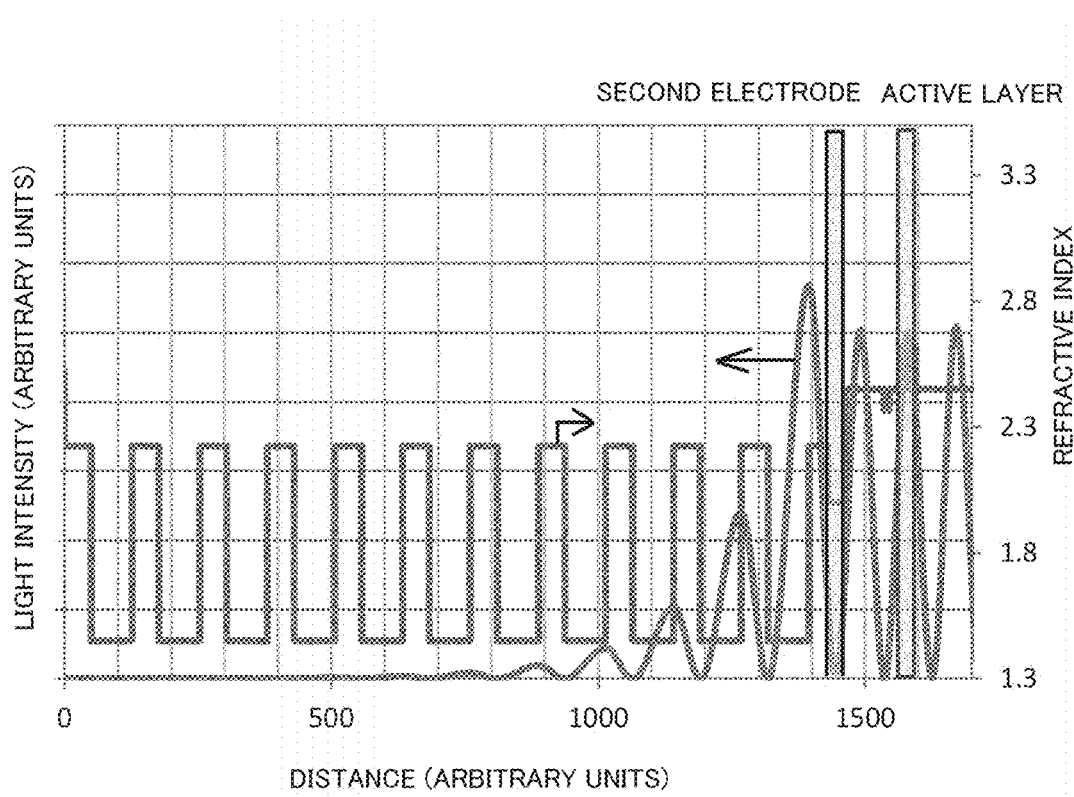
FIG. 2 is a diagram schematically showing the relationship between the position of the active layer and the like and a light field intensity (light field), and the relationship between the position of the active layer and the like and the position of the refractive index in the conventional light emitting element.

FIG. 2 schematically shows the relationship between the position of the active layer and the like and the light field intensity (light field) and the relationship between the position of the active layer and the like and the position of the refractive index in the conventional light emitting element. In FIG. 2, "ACTIVE LAYER" and "SECOND ELECTRODE" indicate the positions of the active layer 23 and the second electrode 32, respectively, "DISTANCE" on the horizontal axis indicates the thickness of the layered structure from an arbitrary position toward the active layer (arbitrary units, the numbers are not particularly meaningful), "REFRACTIVE INDEX" on the vertical axis on the right side indicates the value of the refractive index of the materials constituting the various layers constituting the layered structure, and the vertical axis on the left side indicates the light field intensity (arbitrary units). The light field intensity in the vicinity of the interface between the first layer of the second light reflecting layer and the second electrode is the highest, and it is clear that suppression of light scattering in this region is important.

In the light emitting element of the present disclosure, since the value of the surface roughness of the second surface of the intermediate layer is smaller than the value of the surface roughness of the first surface, no unevenness is generated on the first layer of the second light reflecting layer that is in contact with the second surface of the intermediate layer. Therefore, no light scattering loss occurs at the interface between the intermediate layer and the second light reflecting layer, and as a result, the oscillation threshold value of the light emitting element can be reduced.

Hereinafter, a method for manufacturing the light emitting element of Embodiment 1 will be described with reference to FIGS. 3A, 3B, and 3C which are schematic partial end views of the layered structure and the like.

[Step-100]

First, the first light reflecting layer 41 composed of a multilayer film and having a convex shape is formed on the first surface 11a of the light emitting element manufacturing substrate 11. Specifically, a patterned first light reflecting layer 41 composed of a multilayer film is formed based on a well-known method on the first surface 11a of the light emitting element manufacturing substrate 11 that is composed of a GaN substrate. In this way, the structure shown in FIG. 3A can be obtained. The shape of the first light reflecting layer 41 is a disk shape. However, this shape of the first light reflecting layer 41 is not limiting.

[Step-110]

Next, the light emitting structure 20 composed by layering the first compound semiconductor layer 21 that is composed of a GaN-based compound semiconductor and has the first surface 21a and the second surface 21b that is opposite to the first surface 21a, the active layer (light emitting layer) 23 that is composed of a GaN-based compound semiconductor and is in contact with the second surface 21b of the first compound semiconductor layer 21, and the second compound semiconductor layer 22 that is composed of a GaN-based compound semiconductor and has the first surface 22a and the second surface 22b that is opposite to the first surface 22a, the first surface 22a being in contact with the active layer 23 is formed on the light emitting element manufacturing substrate 11 that includes the first light reflecting layer 41. Specifically, the light emitting structure 20 can be obtained by forming the first compound semiconductor layer 21 composed of n-GaN by lateral growth by using a method for epitaxial growth in the lateral direction, such as an ELO method, and then forming the active layer 23 and the second compound semiconductor layer 22 on the basis of the epitaxial growth method on the first compound semiconductor layer 21.

[Step-120]

After that, the current constriction layer 24 having the opening 25 and composed of $SiO_2$ is formed on the second surface 22b of the second compound semiconductor layer 22 on the basis of a well-known method (see FIG. 3B).

[Step-130]

Next, the second electrode 32 is formed on the basis of, for example, a lift-off method to extend from the second surface 22b of the second compound semiconductor layer 22 exposed on the bottom surface of the opening 25 onto the current constriction layer 24, and then the pad electrode 33 is formed based on a well-known method. In this way, the structure shown in FIG. 3C can be obtained. Next, the intermediate layer 70 is formed based on a well-known method to extend from above the second electrode 32 onto the pad electrode 33, and the second light reflecting layer 42 is formed on the second surface 72 of the intermediate layer 70

[Step-140]

After that, the first electrode 31 and the like are formed based on a well-known method on the outer surface (second surface 11b) of the light emitting element manufacturing substrate 11. In this way, the structure shown in FIG. 1A can be obtained. Further, the light emitting element is separated by performing so-called element separation, and the side surface or the exposed surface of the layered structure or the light emitting structure is covered with a coating layer composed of an insulating material such as $SiO_2$. Then, the light emitting element of Embodiment 1 can be completed by packaging or sealing.

Figure 4A:
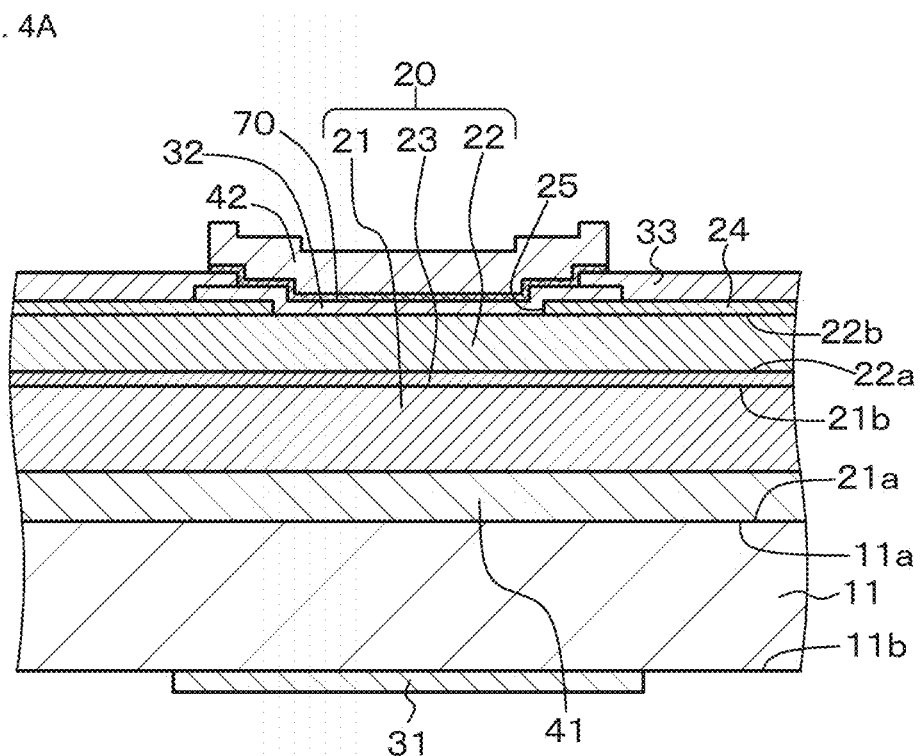
FIGS. 4A and 4B are schematic partial cross-sectional views of a modification example of the light emitting element of Embodiment 1 and a light emitting element of Embodiment 4, respectively.

In [Step-100], the first light reflecting layer 41 composed of a multilayer film may be formed based on an epitaxial growth method on the first surface 11a of the light emitting element manufacturing substrate 11 that is composed of a GaN substrate. In principle, patterning of the first light reflecting layer 41 is unnecessary. In this way, a light emitting element having a structure with a schematic partial cross-sectional view shown in FIG. 4A can be finally obtained.

Embodiment 2

Embodiment 2 is a modification of Embodiment 1. In the light emitting element of Embodiment 2, the optical thickness of the intermediate layer 70 is larger than the optical thickness of the first layer $42_1$ of the second light reflecting layer 42 in contact with the intermediate layer 70. Specifically, assuming that the refractive index of the material (material-A) constituting the intermediate layer 70 is $n_M$ (specifically, where the material-A is ITO, $n_M$=1.9, and where the material-A is $Ta_2O_5$, $n_M$=2.2), the refractive index of the material (material-B) constituting the first layer $42_1$ of the second light reflecting layer 42 in contact with the intermediate layer 70 is $n_1$ (specifically, where the material-B is $SiO_2$, $n_1$=1.47), and the main wavelength of light emitted from the light emitting element is $\lambda_0$ (=445 nm), the intermediate layer 70 has a thickness exceeding ($\lambda_0/4\ n_M$), the first layer $42_1$ of the second light reflecting layer 42 in contact with the intermediate layer 70 has a thickness of ($\lambda_0/4n_1$), and further the intermediate layer 70 has a thickness exceeding ($\lambda_0/2\ n_M$). In this way, the optical thickness of the intermediate layer 70 is made larger than the optical thickness of the first layer $42_1$ of the second light reflecting layer 42 in contact with the intermediate layer 70, so that the second surface 72 of the intermediate layer 70 is less susceptible to the influence of the unevenness of the surface of the second electrode 32 facing the intermediate layer 70, and as a result, a state in which the value of the surface roughness of the second surface 72 of the intermediate layer 70 is smaller than the value of the surface roughness of the first surface 71 can be reliably achieved.

Except for the above-mentioned points, the configuration and structure of the light emitting element of Embodiment 2 can be the same as the configuration and structure of the light emitting element of Embodiment 1, and thus detailed description thereof will be omitted.

Embodiment 3

Embodiment 3 is a modification of Embodiment 1 and Embodiment 2. In the light emitting element of Embodiment 3, assuming that the refractive index of the material (specifically, ITO) constituting the electrode (second electrode 32) is $n_0$ (=1.9), and the material (material-A) constituting the intermediate layer 70 is, specifically, $Ta_2O_5$ (refractive index $n_M$=2.2), $$0.8 < n_0/n_M < 1.2,$$

preferably $$0.9 < n_0/n_M < 1.1$$

is satisfied. Alternatively, where the material (material-A) constituting the intermediate layer 70 is, specifically, $HfO_2$ (refractive index $n_M$=1.94), $$0.95 < n_0/n_M < 1.05$$

is satisfied, and also $$|n_0 - n_M| \leq 0.1$$

is satisfied. In this way, by reducing the difference (or relative difference) between the refractive index no of the material constituting the second electrode 32 and the refractive index $n_M$ of the material (material-A) constituting the intermediate layer 70, it is possible to suppress the reflection of light at the interface between the second electrode 32 and the intermediate layer 70. As a result, generation of light scattering loss at the interface between the second electrode 32 and the intermediate layer 70 can be reliably suppressed.

Except for the above-mentioned points, the configuration and structure of the light emitting element of Embodiment 3 can be the same as the configuration and structure of the light emitting element of Embodiment 1 or Embodiment 2, and thus detailed description thereof will be omitted.

Embodiment 4

Figure 4B:
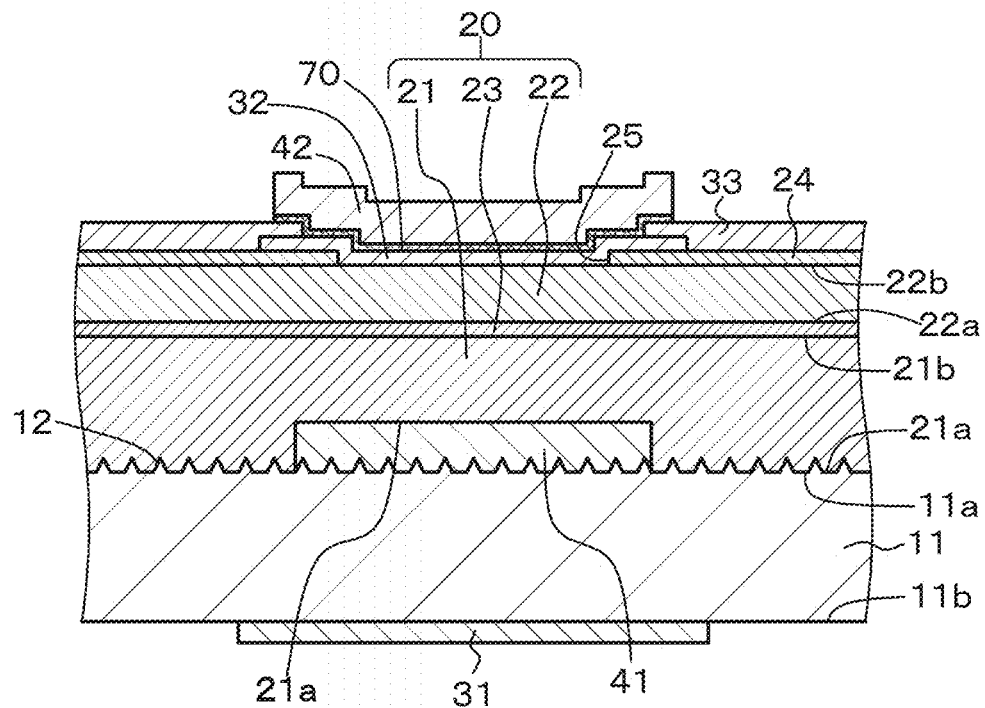

Embodiment 4 is a modification of the light emitting elements of Embodiment 1 to Embodiment 3. In the light emitting element of Embodiment 4 for which a schematic partial cross-sectional view is shown in FIG. 4B, the first compound semiconductor layer 21 and the first light reflecting layer 41 are formed on the substrate 11 having a plurality of parallel grooves (vertical streaks) 12 on the surface. The substrate 11 is composed of a GaN substrate having a {20-21} plane as a main surface. By forming the light emitting structure 20 on such a substrate 11, it is possible to control the polarization of light emitted from the light emitting element.

Except for the above-mentioned points, the configuration and structure of the light emitting element of Embodiment 4 can be the same as the configuration and structure of the light emitting element of Embodiment 1, Embodiment 2 or Embodiment 3, and thus detailed description thereof will be omitted.

Embodiment 5

Embodiment 5 is a modification of Embodiment 1 to Embodiment 4. More specifically, the light emitting element of Embodiment 5 is composed of a surface-emitting laser element (vertical cavity laser, VCSEL) that emits laser light from the top surface of the first compound semiconductor layer 21 via the first light reflecting layer 41.

Figure 5A:
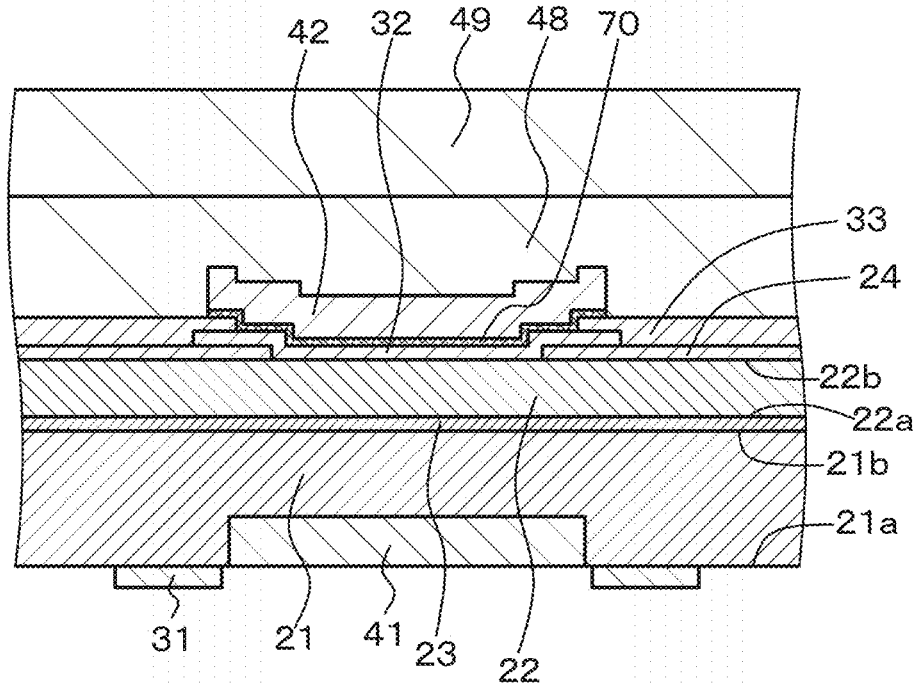
FIGS. 5A and 5B are schematic partial cross-sectional views of a light emitting element of Embodiment 5 and a modification example thereof.

In the light emitting element of Embodiment 5, as shown in a schematic particle cross-sectional view in FIG. 5A, the second light reflecting layer 42 is fixed based on a solder bonding method to a support substrate 49 composed of a silicon semiconductor substrate by a bonding layer 48 composed of a gold (Au) layer or a solder layer including tin (Sn).

A method for manufacturing the light emitting element of Embodiment 5 will be described hereinbelow.

[Step-500]

First, for example, by carrying out steps similar to [Step-100] to [Step-130] of Embodiment 1, the state shown in FIG. 1A can be obtained (however, the first electrode 31 is not formed).

[Step-510]

After that, the second light reflecting layer 42 is fixed to the support substrate 49 by the bonding layer 48.

[Step-520]

Next, the light emitting element manufacturing substrate 11 is removed to expose the first surface 21a of the first compound semiconductor layer 21 and the first light reflecting layer 41. Specifically, first, the thickness of the light emitting element manufacturing substrate 11 is reduced based on a mechanical polishing method, and then the remaining portion of the light emitting element manufacturing substrate 11 is removed based on a CMP method. In this way, the first surface 21a of the first compound semiconductor layer 21 and the first light reflecting layer 41 are exposed.

[Step-530]

After that, the first electrode 31 is formed on the first surface 21a of the first compound semiconductor layer 21. In this way, the light emitting element of Embodiment 5 having the structure shown in FIG. 5A can be obtained.

In the manufacture of the light emitting element of Embodiment 5, the light emitting element manufacturing substrate is removed in a state where the first light reflecting layer is formed. Therefore, as a result of the first light reflecting layer functioning as a kind of stopper when the light emitting element manufacturing substrate is removed, the removal variation of the light emitting element manufacturing substrate in the surface of the light emitting element manufacturing substrate, and further, generation of thickness variation in the first compound semiconductor layer can be suppressed and the length of the resonator can be made uniform. As a result, it is possible to achieve stabilization of characteristics of the obtained light emitting element. Moreover, since the surface (flat surface) of the first compound semiconductor layer at the interface between the first light reflecting layer and the first compound semiconductor layer is flat, it is possible to minimize the scattering of laser light on the flat surface.

In the example of the light emitting element described above and shown in FIG. 5A, the end portion of the first electrode 31 is separated from the first light reflecting layer 41. That is, the first light reflecting layer 41 and the first electrode 31 are separated from each other, in other words, there is an offset, and the separation distance is within 1 mm, specifically, for example, an average of 0.05 mm. However, this structure is not limiting, and the end portion of the first electrode 31 may be in contact with the first light reflecting layer 41, and the end portion of the first electrode 31 may be formed to extend onto the edge of the first light reflecting layer 41.

Figure 5B:
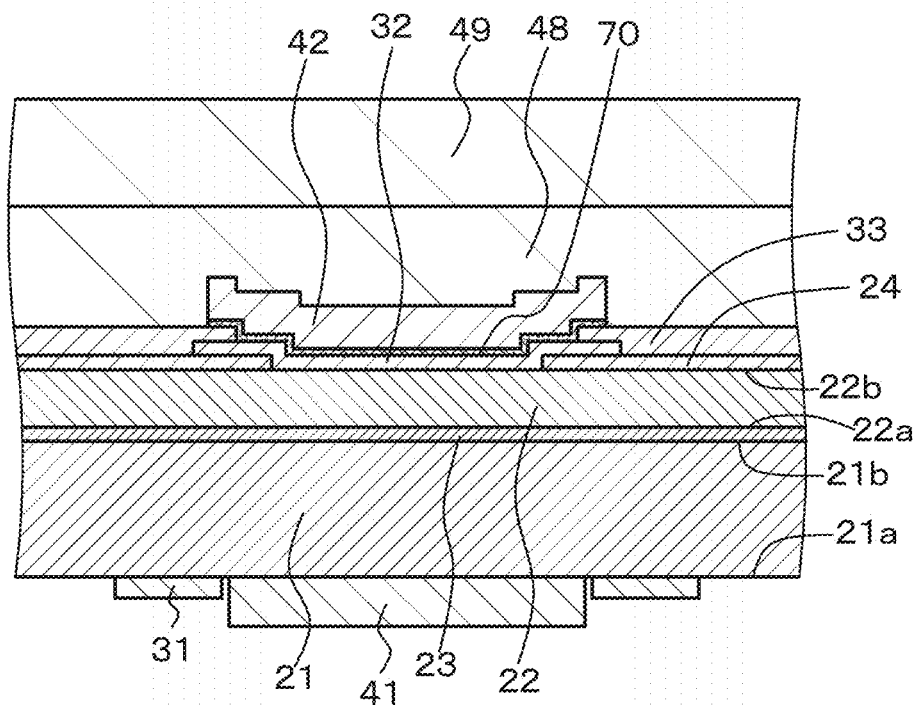

Further, it is also possible to omit [Step-100] of Embodiment 1, first, for example, steps similar to [Step-110] to [Step-130] of Embodiment 1 are carried out, then [Step-510] and [Step-520] are performed to expose the first surface 21a of the first compound semiconductor layer 21, and then the first light reflecting layer 41 and the first electrode 31 are formed on the first surface 21a of the first compound semiconductor layer 21. A schematic partial cross-sectional view of the light emitting element thus obtained is shown in FIG. 5B.

Figure 6:
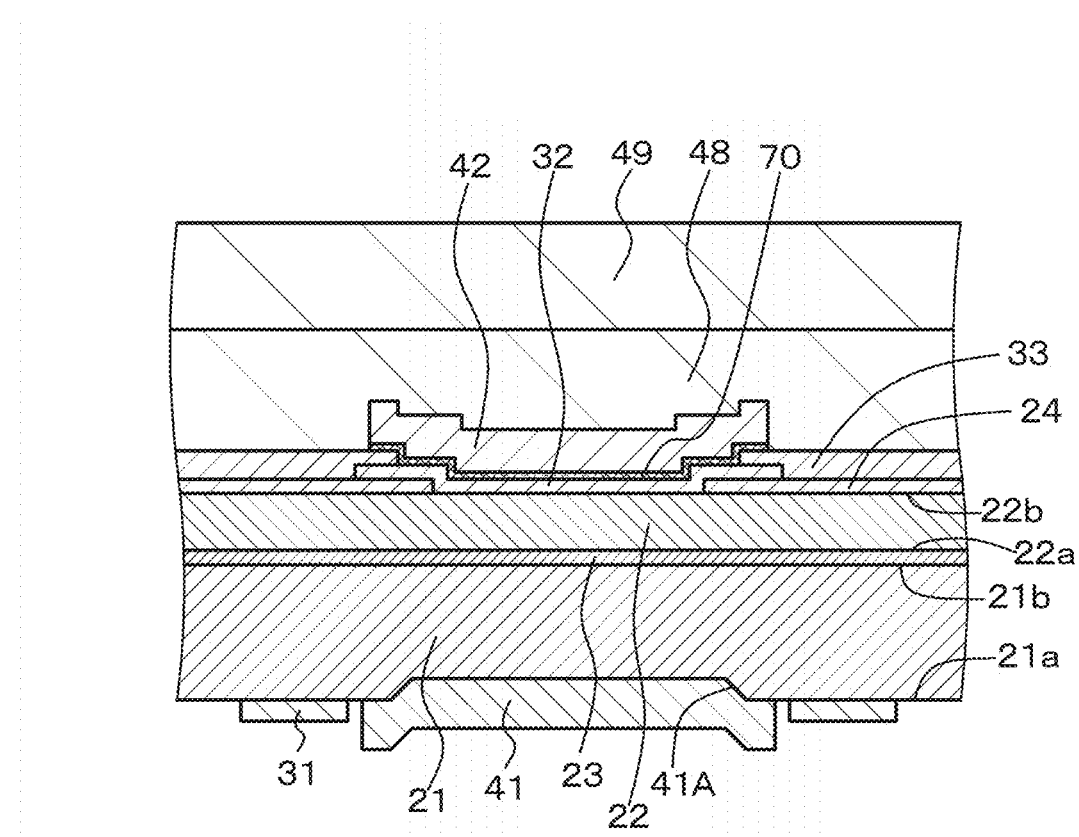
FIG. 6 is a schematic partial cross-sectional view of another modification example of the light emitting element of Embodiment 5.

Further, when the first light reflecting layer 41 is formed on the first surface 21a of the first compound semiconductor layer 21, it is possible to etch the first compound semiconductor layer 21 to form a recessed portion in the first surface 21a of the first compound semiconductor layer 21, and to form the first light reflecting layer 41 in the recessed portion (see FIG. 6). The inclined portion formed in the first compound semiconductor layer 21 is indicated by reference numeral 41A.

Embodiment 6

Embodiment 6 is a modification of the light emitting elements of Embodiment 1 to Embodiment 5.

Where a light emitting structure is configured of a GaAs-based compound semiconductor, the cavity length $L_{OR}$ is about 1 μm. Meanwhile, where the light emitting structure is composed of a GaN-based compound semiconductor, the cavity length $L_{OR}$ is usually several times the wavelength of the laser light emitted from the surface-emitting laser element. That is, the cavity length $L_{OR}$ is considerably longer than 1 μm. Where the cavity length $L_{OR}$ becomes large in this way, the diffraction loss increases, which makes laser oscillation difficult, unlike in the conventional GaAs-based surface-emitting laser element that uses a cavity length $L_{OR}$ of about 1 μm. That is, there is a risk that the element will function as an LED, rather than as a surface-emitting laser element. Here, the "diffraction loss" generally refers to a phenomenon in which the laser light reciprocating in the resonator gradually dissipates to the outside of the resonator because the light tends to spread due to the diffraction effect. Further, when the light emitting structure is composed of a GaN-based compound semiconductor, there is a problem of thermal saturation. Here, "thermal saturation" is a phenomenon in which the light output is saturated due to self-heating when the surface-emitting laser element is driven. The material used for the light reflecting layer (for example, a material such as $SiO_2$ or $Ta_2O_5$) has a lower thermal conductivity value than that of a GaN-based compound semiconductor. Therefore, increasing the thickness of the GaN-based compound semiconductor layer leads to suppressing thermal saturation. However, where the thickness of the GaN-based compound semiconductor layer is increased, the length of the cavity length $L_{OR}$ is enlarged, which causes the above problem. Techniques for imparting a function of a concave mirror to the light reflecting layer are well known from, for example, JP 2006-114753A and JP 2000-022277A. However, these patent publications do not mention a problem of diffraction loss increase due to an increase in the cavity length $L_{OR}$ and a problem of thermal saturation.

In order to solve such problems, in the light emitting element of Embodiment 6, the first light reflecting layer 41 has a concave mirror portion, and the second light reflecting layer 42 has a flat shape.

Thus, since the first light reflecting layer has the concave mirror portion, the light that has diffracted and spread from the active layer and then fell on the first light reflecting layer can be reliably reflected toward the active layer and collected in the active layer. Therefore, it is possible to avoid an increase in diffraction loss, to reliably perform laser oscillation, and to avoid the problem of thermal saturation due to having a long resonator.

In the light emitting element of Embodiment 6, the figure drawn by the interface of a part of the concave mirror portion of the first light reflecting layer facing the light emitting structure when the first light reflecting layer is cut in a virtual plane including the layering direction of the layered structure can be in the form of a part of a circle or a part of a parabola. The figure may not be strictly a part of a circle, or the figure may not be strictly a part of a parabola. That is, the expression of "a figure is a part of a circle or a part of a parabola" is inclusive of the case where the figure is generally a part of a circle or generally a part of a parabola. A portion (region) of the first light reflecting layer that is such a part of a circle or a part of a parabola may be referred to as an "effective region in the concave mirror portion of the first light reflecting layer". The figure drawn by the interface of a part of the concave mirror portion facing the light emitting structure can be obtained by measuring the shape of the interface with a measuring instrument and analyzing the obtained data on the basis of a least squares method.

Further, the light emitting element of Embodiment 6 can have a configuration in which a current injection region and a current non-injection region surrounding the current injection region are provided in the second compound semiconductor layer, and the shortest distance $D_{CI}$ from the area center of gravity of the current injection region to the boundary between the current injection region and the current non-injection region satisfies the following formula. Here, a light emitting element having such a configuration is referred to as a "light emitting element having a first configuration" for convenience. For the derivation of the following formula, refer to, for example, H. Kogelnik and T. Li, "Laser Beams and Resonators", Applied Optics/Vol. 5, No. 10/October 1966. Further, $\omega_0$ is also called a beam waist radius.

$$D_{CI} \geq \omega_0/2 \tag{1-1}$$

where $$\omega_0^2 = (\lambda_0/\pi)\{L_{OR}(R_{DBR} - L_{OR})\}^{1/2} \tag{1-2}$$

Here, $\lambda_0$: oscillation wavelength (wavelength of light with maximum intensity in the light emitted from the active layer)

$L_{OR}$: cavity length $R_{DBR}$: radius of curvature of the concave mirror portion of the first light reflecting layer.

Figure 29:
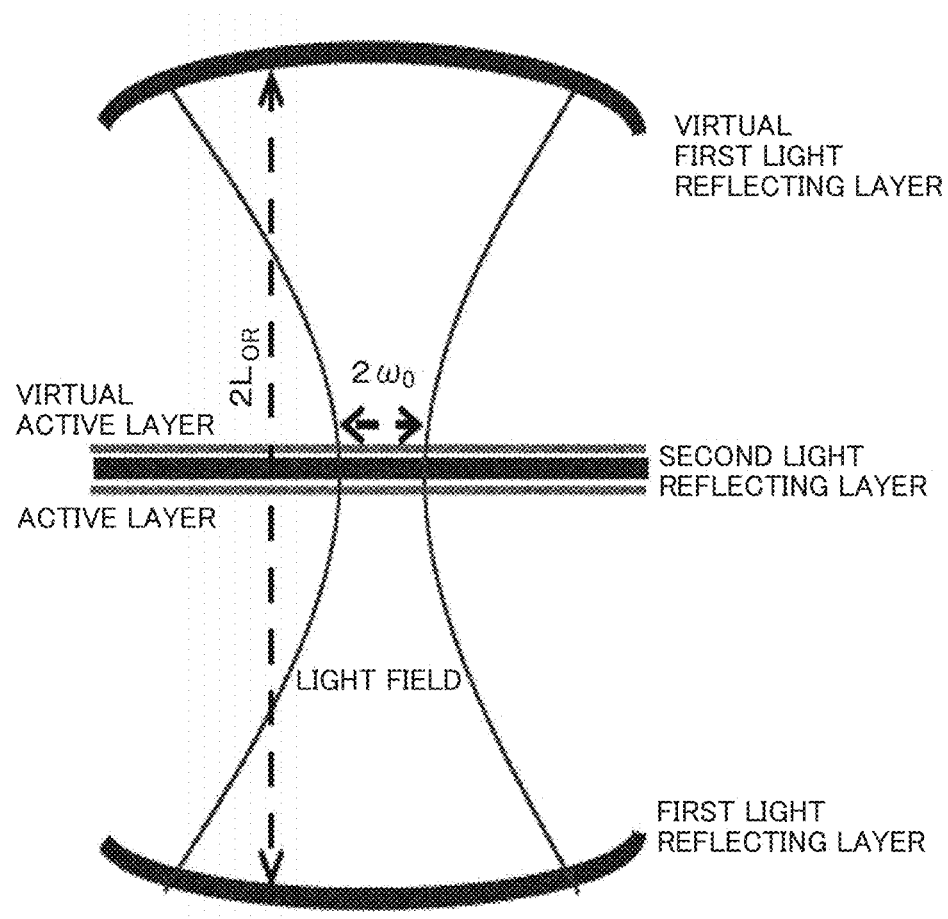
FIG. 29 is a conceptual diagram obtained assuming a Fabry-Perot type resonator sandwiched between two concave mirror portions having the same radius of curvature in the light emitting element of Embodiment 6.
Figure 30:
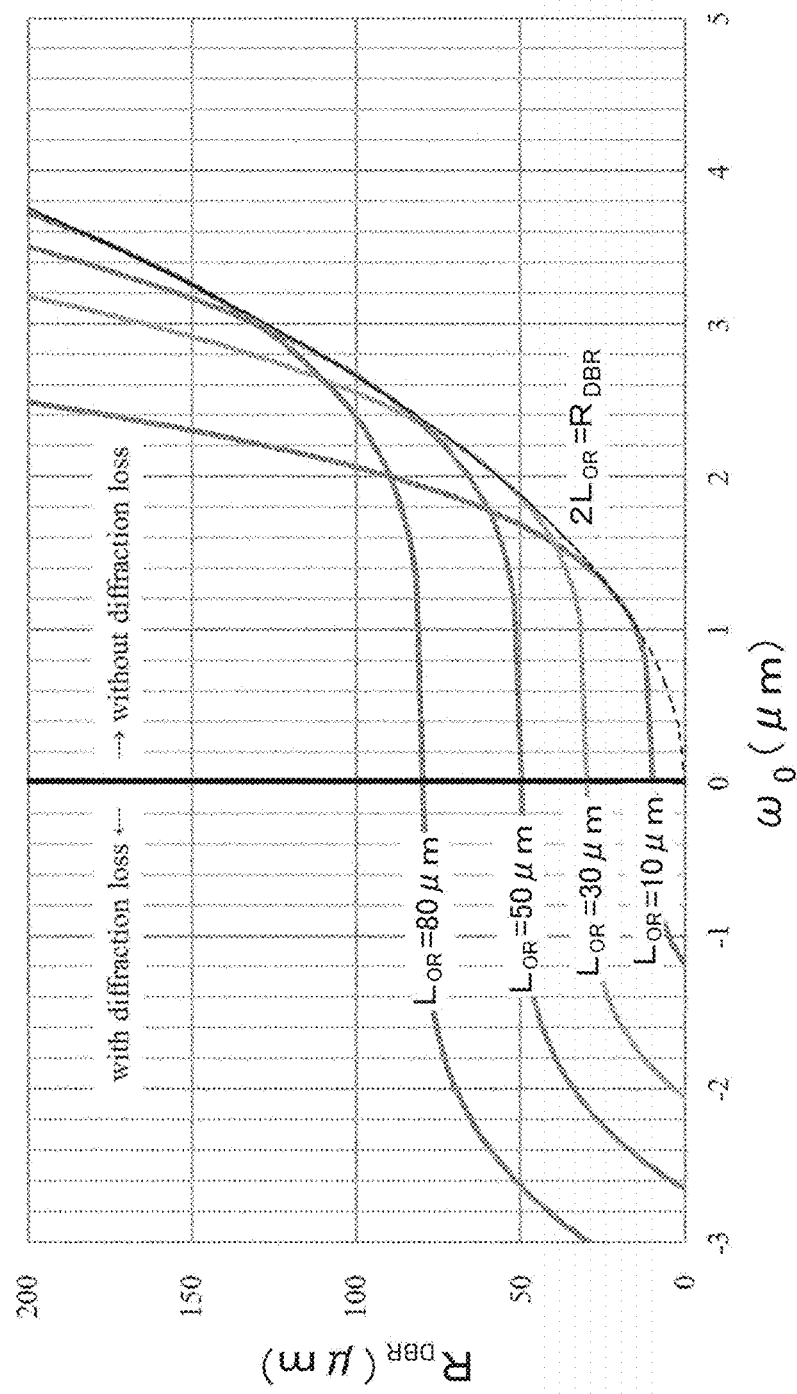
FIG. 30 is a graph showing the relationship between the value of $\omega_0$, the value of a cavity length LOR, and the value of the radius of curvature RDBR of the concave mirror portion of the first light reflecting layer.
Figure 31:
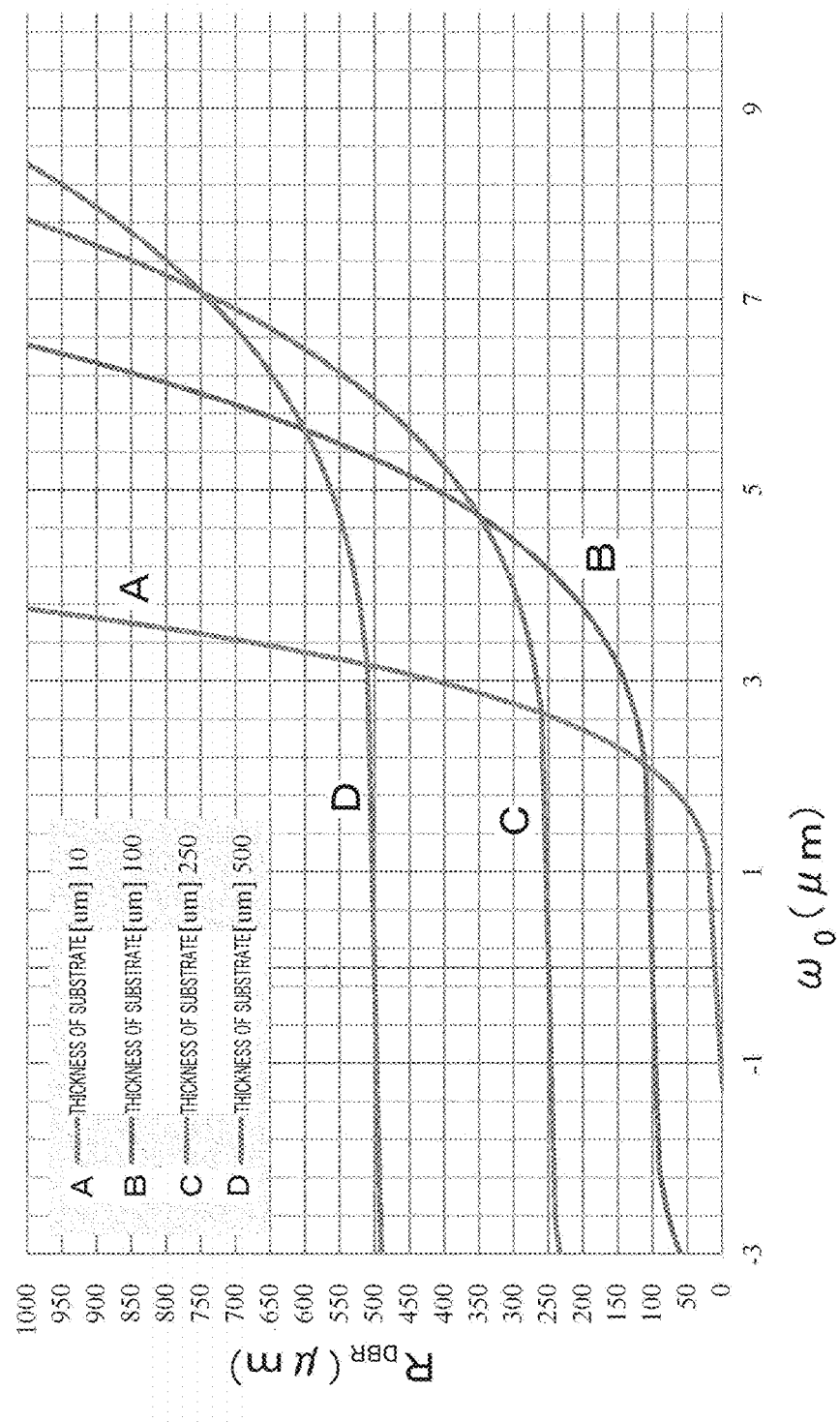
FIG. 31 is a graph showing the relationship between the value of $\omega_0$, the value of a cavity length LOR, and the value of the radius of curvature RDBR of the concave mirror portion of the first light reflecting layer.
Figure 32A:
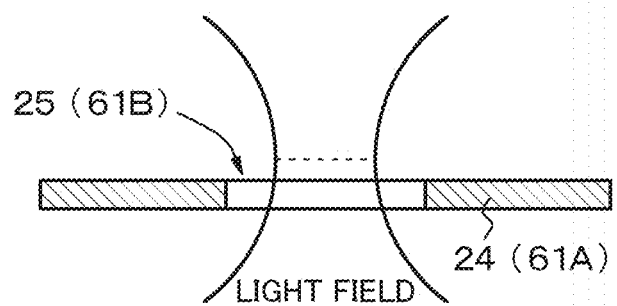
FIGS. 32A and 32B are diagrams schematically showing the focused state of the laser light when the value of $\omega_0$ is "positive" and the focused state of the laser light when the value of $\omega_0$ is "negative", respectively.
Figure 32B:
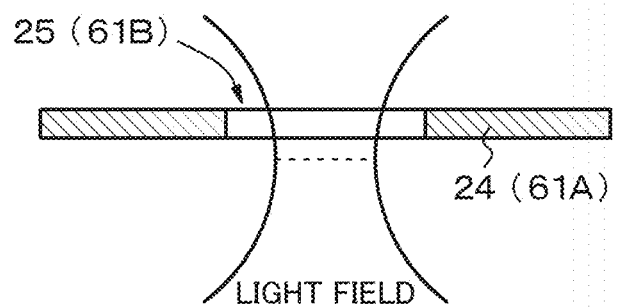

Here, the light emitting element of Embodiment 6 has a concave mirror portion only in the first light reflecting layer, but where the symmetry of the second light reflecting layer with respect to a flat mirror is considered, the resonator can be expanded to a Fabry-Perot type resonator sandwiched between two concave mirror portions having the same radius of curvature (see schematic view of FIG. 29). At this time, the cavity length of the virtual Fabry-Perot type resonator is twice the cavity length $L_{OR}$. Graphs showing the relationship between the value of Wo, the value of the cavity length $L_{OR}$, and the value of the radius of curvature $R_{DBR}$ of the concave mirror portion of the first light reflecting layer are shown in FIGS. 30 and 31. The value of $\omega_0$ being "positive" means that the laser beam is schematically in the state shown in FIG. 32A, and the value of $\omega_0$ being "negative" means that the laser beam is schematically in the state shown in FIG. 32B. The state of the laser beam may be such as shown in FIG. 32A or such as shown in FIG. 32B. However, in the virtual Fabry-Perot type resonator having two concave mirror portions, where the radius of curvature $R_{DBR}$ becomes smaller than the cavity length $L_{OR}$, the state shown in FIG. 32B is realized, the confinement becomes excessive, and diffraction loss occurs. Therefore, the state shown in FIG. 32A in which the radius of curvature $R_{DBR}$ is larger than the cavity length $L_{OR}$ is preferable. Where the active layer is arranged close to a flat light reflecting layer, specifically, to the second light reflecting layer, among the two light reflecting layers, the light field is more collected in the active layer. That is, the light field confinement in the active layer is enhanced and laser oscillation is facilitated.

Where the region where the light reflected by the first light reflecting layer is collected is not included in the current injection region corresponding to the region where the active layer has a gain by current injection, the stimulated emission of light from the carriers is hindered. As a result, laser oscillation may be hindered. By satisfying the above formulas (1-1) and (1-2), it is possible to guarantee that the region in which the light reflected by the first light reflecting layer is collected is included in the current injection region, and laser oscillation can be reliably achieved.

The light emitting element having the first configuration can have a configuration further including a mode loss action site that is provided on the second surface of the second compound semiconductor layer and constitutes a mode loss action region acting on a variation in an oscillation mode loss, a second electrode formed to extend from above the second surface of the second compound semiconductor layer onto the mode loss action site, and a first electrode electrically connected to the first compound semiconductor layer, wherein the second light reflecting layer is formed on the second electrode with an intermediate layer interposed therebetween, wherein the light emitting structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other.

In the light emitting element having the first configuration that includes such a preferable configuration, a radius $r'_{DBR}$ of the effective region in the concave mirror portion of the first light reflecting layer is $\omega_0 \leq r'_{DBR} \leq 20 \cdot \omega_0$, and preferably $\omega_0 \leq r'_{DBR} \leq 10 \cdot \omega_0$. Alternatively, the value of $r'_{DBR}$ can be exemplified by $r'_{DBR} \leq 1 \times 10^{-4}$ m, and preferably $r'_{DBR} \leq 5 \times 10^{-5}$ m. Further, the height $h_{DBR}$ of the base (described hereinbelow) can be exemplified by $h_{DBR} \leq 5 \times 10^{-5}$ m. Further, the light emitting element having the first configuration that includes such a preferable configuration can be configured to satisfy $D_{CI} \geq \omega_0$. Furthermore, the light emitting element having the first configuration that includes such a preferable configuration can be configured to satisfy $R_{DBR} \leq 1 \times 10^{-3}$ m, preferably $1 \times 10^{-5}$ m $\leq R_{DBR} \leq 1 \times 10^{-3}$ m, and more preferably $1 \times 10^{-5}$ m $\leq R_{DBR} \leq 1 \times 10^{-4}$ m.

Further, the light emitting element of Embodiment 6 can have a configuration further including a mode loss action site that is provided on the second surface of the second compound semiconductor layer and constitutes a mode loss action region acting on a variation in an oscillation mode loss, a second electrode formed to extend from above the second surface of the second compound semiconductor layer onto the mode loss action site, and a first electrode electrically connected to the first compound semiconductor layer, wherein the second light reflecting layer is formed on the second electrode with an intermediate layer interposed therebetween, wherein the light emitting structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other. Here, a light emitting element having such a configuration is referred to as a "light emitting element having a second configuration" for convenience.

Alternatively, the light emitting element of Embodiment 6 including the above preferred mode can have a configuration further including a second electrode formed on the second surface of the second compound semiconductor layer, a second light reflecting layer formed on the second electrode with an intermediate layer interposed therebetween, a mode loss action site that is provided on the first surface of the first compound semiconductor layer and constitutes a mode loss action region acting on a variation in an oscillation mode loss, and a first electrode electrically connected to the first compound semiconductor layer, wherein the first light reflecting layer is formed to extend from above the first surface of the first compound semiconductor layer onto the mode loss action site, the light emitting structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other. Here, a light emitting element having such a configuration is referred to as a "light emitting element having a third configuration" for convenience. The provisions of the light emitting element having the third configuration can be applied to the light emitting element having the first configuration.

In the light emitting element having the second configuration or the light emitting element having the third configuration, the current non-injection region (general term for current non-injection inner region and current non-injection outer region) is formed in the light emitting structure, but specifically the current non-injection region may be formed in the region of the second compound semiconductor layer on the second electrode side in the thickness direction, may be formed in the entire second compound semiconductor layer, may be formed in the second compound semiconductor layer and the active layer, or may be formed to extend from the second compound semiconductor layer onto a part of the first compound semiconductor layer. The orthogonal projection image of the mode loss action region and the orthogonal projection image of the current non-injection outer region overlap with each other, but in a region sufficiently distant from the current injection region, the orthogonal projection image of the mode loss action region and the orthogonal projection image of the current non-injection outer region may not overlap with each other.

The light emitting element having the second configuration can have a configuration in which the current non-injection outer region is located below the mode loss action region.

The light emitting element having the second configuration including the above preferable configuration can have a configuration such that, assuming that the area of the orthogonal projection image of the current injection region is $S_1$ and the area of the orthogonal projection image of the current non-injection inner region is $S_2$, $$0.01 \leq S_1/(S_1+S_2) \leq 0.7$$

is satisfied. Further, the light emitting element having the third configuration can have a configuration such that, assuming that the area of the orthogonal projection image of the current injection region is $S_1'$ and the area of the orthogonal projection image of the current non-injection inner region is $S_2'$, $$0.01 \leq S_1'/(S_1'+S_2') \leq 0.7$$

is satisfied. However, the range of $S_1/(S_1'+S)$ and the range of $S_1'/(S_1'+S_2')$ are not limited or restricted to the above range.

The light emitting element having the second configuration or the light emitting element having the third configuration that includes the above preferable configuration can have a configuration in which the current non-injection inner region and the current non-injection outer region are formed by ion implantation into the light emitting structure. For convenience, light emitting elements having such a configuration are referred to as a "light emitting element having the second-A configuration" and a "light emitting element having a third-A configuration". In this case, a configuration is possible in which the ion species is at least one type of ion (that is, one type of ion or two or more types of ions) selected from the group consisting of boron, proton, phosphorus, arsenic, carbon, nitrogen, fluorine, oxygen, germanium, and silicon.

Alternatively, the light emitting element having the second configuration or the light emitting element having the third configuration that includes the above preferable configuration can have a configuration in which the current non-injection inner region and the current non-injection outer region are formed by plasma irradiation of the second surface of the second compound semiconductor layer, by ashing treatment of the second surface of the second compound semiconductor layer, or by reactive ion etching treatment of the second surface of the second compound semiconductor layer. For convenience, the light emitting elements having such a configuration are referred to as "light emitting element having a second-B configuration" and "light emitting element having a third-B configuration". In these treatments, since the current non-injection inner region and the current non-injection outer region are exposed to plasma particles, the conductivity of the second compound semiconductor layer deteriorates, and the current non-injection inner region and the current non-injection outer region assume a high-resistance state. That is, a configuration can be obtained in which the current non-injection inner region and the current non-injection outer region are formed by exposure of the second surface of the second compound semiconductor layer to the plasma particles. Specific examples of the plasma particles include argon, oxygen, nitrogen and the like.

Alternatively, the light emitting element having the second configuration or the light emitting element having the third configuration that includes the above preferable configuration can have a configuration in which the second light reflecting layer has a region that reflects or scatters the light from the first light reflecting layer toward the outside of the resonator structure configured of the first light reflecting layer and the second light reflecting layer. For convenience, the light emitting elements having such a configuration are referred to as "light emitting elements having a second-C configuration" and "light emitting elements having a third-C configuration". Specifically, the region of the second light reflecting layer located above the side wall of the mode loss action site (the side wall of the opening provided in the mode loss action site) has a forward taper-shaped inclination, or has a region curved convexly toward the first light reflecting layer.

Alternatively, the light emitting element having the second configuration or the light emitting element having the third configuration that includes the above preferred modes can have a configuration in which the first light reflecting layer has a region that reflects or scatters the light from the second light reflecting layer toward the outside of the resonator structure configured of the first light reflecting layer and the second light reflecting layer. Specifically, a configuration may be obtained in which a forward taper-shaped inclination may be formed, or a curved portion convex toward the second light reflecting layer may be formed in the region which is part of the first light reflecting layer, or the region of the first light reflecting layer located above the side wall of the mode loss action site (the side wall of the opening provided in the mode loss action site) has a forward taper-shaped inclination, or has a region curved convexly toward the second light reflecting layer. Further, a configuration can be obtained in which light is scattered at the boundary (side wall edge portion) between the top surface of the mode loss action site and the side wall of the opening provided in the mode loss action site, thereby scattering the light toward the outside of the resonator structure configured of the first light reflecting layer and the second light reflecting layer.

The light emitting element having the second-A configuration, the light emitting element having the second-B configuration, or the light emitting element having the second-C configuration described above can have a configuration such that, assuming that the optical distance from the active layer in the current injection region to the second surface of the second compound semiconductor layer is $L_2$ and the optical distance from the active layer in the mode loss action region to the top surface of the mode loss action site is $L_0$, $$L_0 > L_2$$

is satisfied. Further, the light emitting element having the third-A configuration, the light emitting element having the third-B configuration, or the light emitting element having the third-C configuration described above can have a configuration such that, assuming that the optical distance from the active layer in the current injection region to the first surface of the first compound semiconductor layer is $L_1'$ and the optical distance from the active layer in the mode loss action region to the top surface of the mode loss action site is $L_0'$, $$L_0' > L_1'$$

is satisfied. Furthermore, the light emitting element having the second-A configuration, the light emitting element having the third-A configuration, the light emitting element having the second-B configuration, the light emitting element having the third-B configuration, the light emitting element having the second-C configuration, or the light emitting element having the third-C configuration including these configurations can have a configuration in which the generated light having a higher order mode is dissipated toward the outside of the resonator structure configured of the first light reflecting layer and the second light reflecting layer by the mode loss action region, and thus the oscillation mode loss increases. That is, the resulting light field intensities in the fundamental mode and the higher order mode decrease as the distance from the Z axis increases in the orthogonal projection image of the mode loss action region due to the presence of the mode loss action region acting on a variation in the oscillation mode loss, and since the mode loss in the higher order mode is larger than a decrease in the light field intensity in the fundamental mode and makes it possible to further stabilize the fundamental mode and also suppress the mode loss as compared with the case where the current injection inner region is not present, the threshold current can be reduced.

Further, the light emitting element having the second-A configuration, the light emitting element having the third-A configuration, the light emitting element having the second-B configuration, the light emitting element having the third-B configuration, the light emitting element having the second-C configuration, or the light emitting element having the third-C configuration, described above can have a configuration in which the mode loss action site is composed of a dielectric material, a metal material, or an alloy material. The dielectric material can be exemplified by $SiO_X$, $SiN_X$, $AlN_X$, $AlO_X$, $TaO_X$, and $ZrO_X$, and the metal material or alloy material can be exemplified by titanium, gold, platinum and alloys thereof, but these materials are not limiting. Light can be absorbed and the mode loss can be increased by the mode loss action site configured of these materials. Alternatively, the mode loss can be controlled by disturbing the phase without directly absorbing light. In this case, a configuration can be used in which the mode loss action site is composed of a dielectric material, and the optical thickness $t_0$ of the mode loss action site is a value deviating from an integral multiple of ¼ of the oscillation wavelength $\lambda_0$. That is, it is possible to break the standing wave by disturbing the phase of the light, which circulates in the resonator and forms the standing wave, at the mode loss action site, and to give a corresponding mode loss. Alternatively, a configuration can be used in which the mode loss action site is composed of a dielectric material, and the optical thickness $t_0$ of the mode loss action site (refractive index is taken as $n_{m\text{-}loss}$) is an integral multiple of ¼ of the oscillation wavelength $\lambda_0$. That is, a configuration can be used in which the optical thickness $t_0$ of the mode loss action site is such that does not disturb the phase of the light generated in the light emitting element and does not break the standing wave. However, this thickness does not have to be exactly an integral multiple of ¼ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss}).$$

is satisfied. Alternatively, by using a configuration in which the mode loss action site is composed of a dielectric material, a metal material, or an alloy material, the phase of the light passing through the mode loss action site can be disturbed or the light can be absorbed by the mode loss action site. By adopting these configurations, the oscillation mode loss can be controlled with a higher degree of freedom, and the design freedom of the light emitting element can be further increased.

Alternatively, the light emitting element having the second configuration including the above preferable configurations can have a configuration in which
a projecting portion is formed on the second surface side of the second compound semiconductor layer, and
the mode loss action site is formed on a region of the second surface of the second compound semiconductor layer surrounding the projecting portion. For convenience, a light emitting element having such a configuration is referred to as a "light emitting element having a second-D configuration". The projecting portion occupies the current injection region and the current non-injection inner region. In this case, a configuration can be used such that, assuming that the optical distance from the active layer in the current injection region to the second surface of the second compound semiconductor layer is $L_2$ and the optical distance from the active layer in the mode loss action region to the top surface of the mode loss action site is $L_0$, $$L_0 < L_2$$

is satisfied. Furthermore, in these cases, a configuration can be used in which the generated light having the higher order mode is confined in the current injection region and the current non-injection inner region by the mode loss action region, and thus the oscillation mode loss is reduced. That is, the resulting light field intensities in the fundamental mode and the higher order mode increase in the orthogonal projection images of the current injection region and the current non-injection inner region due to the presence of the mode loss action region acting on a variation in the oscillation mode loss. Further, in these cases, a configuration can be used in which the mode loss action site is composed of a dielectric material, a metal material or an alloy material. Here, the dielectric material, the metal material, or the alloy material can be exemplified by the above-mentioned various materials.

Alternatively, the light emitting element having the third configuration that includes the above preferable configurations can have a configuration in which a projecting portion is formed on the first surface side of the first compound semiconductor layer, and
the mode loss action site is formed on a region of the first surface of the first compound semiconductor surrounding the projecting portion, or the mode loss action site is configured of a region of the first compound semiconductor layer surrounding the projecting portion. For convenience, a light emitting element having such a configuration is referred to as a "light emitting element having a third-D configuration". The projecting portion coincides with the orthogonal projection image of the current injection region and the current non-injection inner region. In this case, a configuration can be used such that, assuming that the optical distance from the active layer in the current injection region to the first surface of the first compound semiconductor layer is $L_1'$ and the optical distance from the active layer in the mode loss action region to the top surface of the mode loss action site is $L_0'$, $$L_0' < L_1'$$

is satisfied. Further, in these cases, a configuration can be used in which the generated light having the higher order mode is confined in the current injection region and the current non-injection inner region by the mode loss action region, and thus the oscillation mode loss is reduced. Further, in these cases, a configuration can be used in which the mode loss action site is composed of a dielectric material, a metal material or an alloy material. Here, the dielectric material, the metal material, or the alloy material can be exemplified by the above-mentioned various materials.

Further, the light emitting element of Embodiment 6 including the preferred modes and configurations (including the light emitting element having the first configuration to the light emitting element having the third configuration) described above, can have a configuration in which a compound semiconductor substrate is arranged between the first surface of the first compound semiconductor layer and the first light reflecting layer. Here, for convenience, a light emitting element having such a configuration is referred to as a "light emitting element having a fourth configuration". In this case, a configuration can be used in which the compound semiconductor substrate is composed of a GaN substrate. The thickness of the compound semiconductor substrate can be exemplified by $5 \times 10^{-5}$ m to $1 \times 10^{-4}$ m, but this value is not limiting. The light emitting element having the fourth configuration including such a configuration can have a configuration in which the concave mirror portion of the first light reflecting layer is configured of a base portion composed of a protruding portion of the compound semiconductor substrate and a multilayer light reflecting film formed on the surface of at least a part of the base. Here, for convenience, a light emitting element having such a configuration is referred to as a "light emitting element having a fourth-A configuration". Alternatively, a configuration can be used in which the concave mirror portion of the first light reflecting layer is configured of a base portion formed on the compound semiconductor substrate and a multilayer light reflecting film formed on the surface of at least a part of the base portion. Here, for convenience, a light emitting element having such a configuration is referred to as a "light emitting element having a fourth-B configuration". The material constituting the base portion of the light emitting element having the fourth-A configuration is, for example, a GaN substrate. Any of a polar substrate, a semipolar substrate, and a non-polar substrate may be used as the GaN substrate. Meanwhile, a material constituting the base portion of the light emitting element having the fourth-B configuration can be exemplified by a transparent dielectric material such as $TiO_2$, $Ta_2O_5$, $SiO_2$, silicone-based resins, and epoxy-based resins.

Alternatively, the light emitting element of Embodiment 6 including the preferred modes and configurations (including the light emitting element having the first configuration to the light emitting element having the third configuration) described above can have a configuration in which the first light reflecting layer is formed on the first surface of the first compound semiconductor layer. Here, for convenience, a light emitting element having such a configuration is referred to as a "light emitting element having the fifth configuration".

Further, the light emitting element of Embodiment 6 that includes the preferred modes and configurations (including the light emitting element having the first configuration to the light emitting element having the fifth configuration) described above can have a configuration in which the value of the thermal conductivity of the light emitting structure is higher than the value of the thermal conductivity of the first light reflecting layer. The value of the thermal conductivity of the dielectric material constituting the first light reflecting layer is generally about 10 Watts/(m·K) or less. Meanwhile, the value of the thermal conductivity of the GaN-based compound semiconductor constituting the light emitting structure is about 50 Watts/(m·K) to about 100 Watts/(m·K).

Further, the light emitting element of Embodiment 6 that includes the preferred modes and configurations (including the light emitting element having the first configuration to the light emitting element having the fifth configuration) can have a configuration in which assuming that the radius of curvature of the concave mirror portion (specifically, of the effective region with a radius $r'_{DBR}$ in the concave mirror portion of the first light reflecting layer) is $R_{DBR}$, $R_{DBR} \leq 1 \times 10^{-3}$ m, preferably $1 \times 10^{-5}$ m $\leq R_{DBR} \leq 1 \times 10^{-3}$ m, and more preferably $1 \times 10^{-5}$ m $\leq R_{DBR} \leq 1 \times 10^{-4}$ m is satisfied. Further, it is desirable that $1 \times 10^{-5}$ m $\leq L_{OR}$, preferably $1 \times 10^{-5}$ m $\leq L_{OR} \leq 5 \times 10^{-4}$ m, and more preferably $1 \times 10^{-5}$ m $\leq L_{OR} < 1 \times 10^{-4}$ m be satisfied.

Further, the light emitting element of Embodiment 6 that includes the preferred modes and configurations (including the light emitting element having the first configuration to the light emitting element having the fifth configuration) can have a configuration in which a convex shape portion is formed around the first light reflecting layer and the first light reflecting layer does not to protrude from the convex shape portion. As a result, the first light reflecting layer can be protected. That is, since the first light reflecting layer is provided in a state of being drawn back from the convex shape portion, for example, even if some object comes into contact with the convex shape portion, this object does not come into contact with the first light reflecting layer and the first light reflecting layer can be reliably protected.

Further, in the light emitting element of Embodiment 6 that includes the preferred modes and configurations (including the light emitting element having the first configuration to the light emitting element having the fifth configuration) described above, it is preferable that there is no modulation of the refractive index of 10% or more (there is no refractive index difference of 10% or more based on the average refractive index of the light emitting structure) in the materials constituting the various compound semiconductor layers (including the compound semiconductor substrate) located between the active layer and the first light reflecting layer, whereby generation of disturbance of the light field in the resonator can be suppressed.

Further, it goes without saying that various configurations and structures in the light emitting element of Embodiment 6 that include the preferred modes and configurations (including the light emitting element having the first configuration to the light emitting element having the fifth configuration) described above, except for the structure and configuration in which the first light reflecting layer 41 has a concave mirror portion and the second light reflecting layer 42 has a flat shape, can be adopted in the light emitting elements of Embodiment 1 to Embodiment 5.

Hereinafter, the light emitting element of Embodiment 6 will be specifically described. The second light reflecting layer 41 having the concave mirror portion 43 is provided on the first surface 21a side of the first compound semiconductor layer 21. The second light reflecting layer 42 having a flat shape is provided on the second surface 22b side of the second compound semiconductor layer 22. The same applies to Embodiment 7 to Embodiment 16 described hereinbelow.

Figure 7:
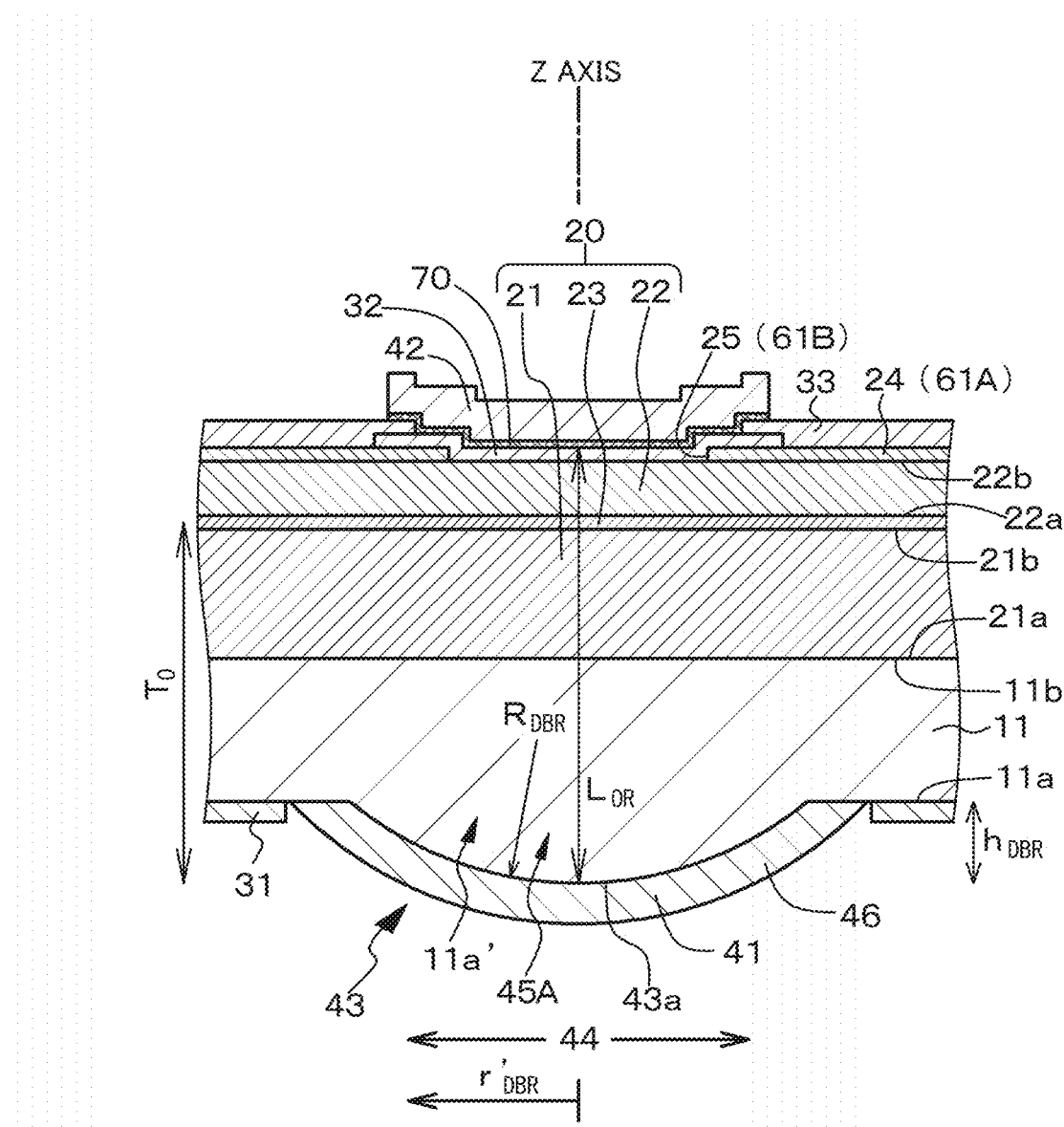
FIG. 7 is a schematic partial end view of a light emitting element of Embodiment 6.

Specifically, the light emitting element of Embodiment 6 is a light emitting element having the fourth-A configuration. More specifically, the light emitting element of Embodiment 6 or Embodiment 7 to Embodiment 14 described hereinbelow is composed of a surface-emitting laser element (vertical cavity laser, VCSEL) that emits laser light from the top surface of the second compound semiconductor layer via the second light reflecting layer. Further, more specifically, the light emitting elements of Embodiment 15 and Embodiment 16 described hereinbelow are composed of a surface-emitting laser element (vertical cavity laser, VCSEL) that emits laser light from the top surface of the first compound semiconductor layer via the first light reflecting layer. A schematic partial end view of the light emitting element of Embodiment 6 is shown in FIG. 7.

In the light emitting element of Embodiment 6, the figure drawn by the interface 43a of a part (the effective region 44 in the concave mirror portion 43 of the first light reflecting layer 41) of the concave mirror portion 43 of the first light reflecting layer 41 facing the light emitting structure when the first light reflecting layer 41 is cut in a virtual plane including the layering direction of the layered structure is a part of a circle or a part of a parabola. The shape of the portion of the concave mirror portion 43 located outside the effective region 44 (figure of the cross-sectional shape) is not required to be a part of a circle or a part of a parabola.

The concave mirror portion 43 of the first light reflecting layer 41 is configured of a base portion 45A composed of a protruding portion 11a' of the first surface 11a of the compound semiconductor substrate 11 and a multilayer light reflecting film 46 formed on at least a part of the surface of the base portion 45A (specifically, the surface of the base portion 45A). Further, assuming that the radius of curvature of the concave mirror portion 43 (specifically, the effective region 44 having the radius $r'_{DBR}$ in the concave mirror portion 43 of the first light reflecting layer 41) is $R_{DBR}$, $$R_{DBR} \leq 1 \times 10^{-3} m$$

is satisfied. Specific, but not limiting, examples are
$L_{OR}$=50 μm
$R_{DBR}$=70 μm
$r'_{DBR}$=20 μm. Further, the oscillation wavelength $\lambda_0$ can be exemplified by
$\lambda_0$=450 nm.

Here, assuming that the distance from the active layer 23 to the interface between the base portion 45A and the multilayer light reflecting film 46 is $T_0$, the ideal parabolic function x=f(z) can be represented by $$x=z^2/t_0$$

$$h_{DBR}=r'^2_{DBR}/2T_0,$$

but it goes without saying that when the figure drawn by the interface 43a is a part of a parabola, the parabola may deviate from such an ideal parabola.

Further, the value of the thermal conductivity of the light emitting structure 20 is higher than the value of the thermal conductivity of the first light reflecting layer 41. The value of the thermal conductivity of the dielectric material constituting the first light reflecting layer 41 is about 10 watts/(m·K) or less. Meanwhile, the value of the thermal conductivity of the GaN-based compound semiconductor constituting the light emitting structure 20 is about 50 watts/(m·K) to about 100 watts/(m·K).

Hereinafter, a method for manufacturing a light emitting element according to Embodiment 6 will be described with reference to FIGS. 8A, 8B, 9, 10, 11, 12, and 13, which are schematic partial end views of a layered structure and the like.

[Step-600]

First, a light emitting structure 20 which is composed of a GaN-based compound semiconductor and in which
the first compound semiconductor layer 21 having the first surface 21a and the second surface 21b that is opposite to the first surface 21a,
the active layer (light emitting layer) 23 facing the second surface 21b of the first compound semiconductor layer 21, and
the second compound semiconductor layer 22 having the first surface 22a facing the active layer 23, and the second surface 22b that is opposite to the first surface 22a are layered
is formed on the second surface 11b of the compound semiconductor substrate 11 having a thickness of about 0.4 mm. Specifically, the light emitting structure 20 can be obtained by sequentially forming the first compound semiconductor layer 21, the active layer 23, and the second compound semiconductor layer 22 on the second surface 11b of the compound semiconductor substrate 11 on the basis of an epitaxial growth method based on the well-known MOCVD method (see FIG. 8A).

[Step-610]

Figure 8A:
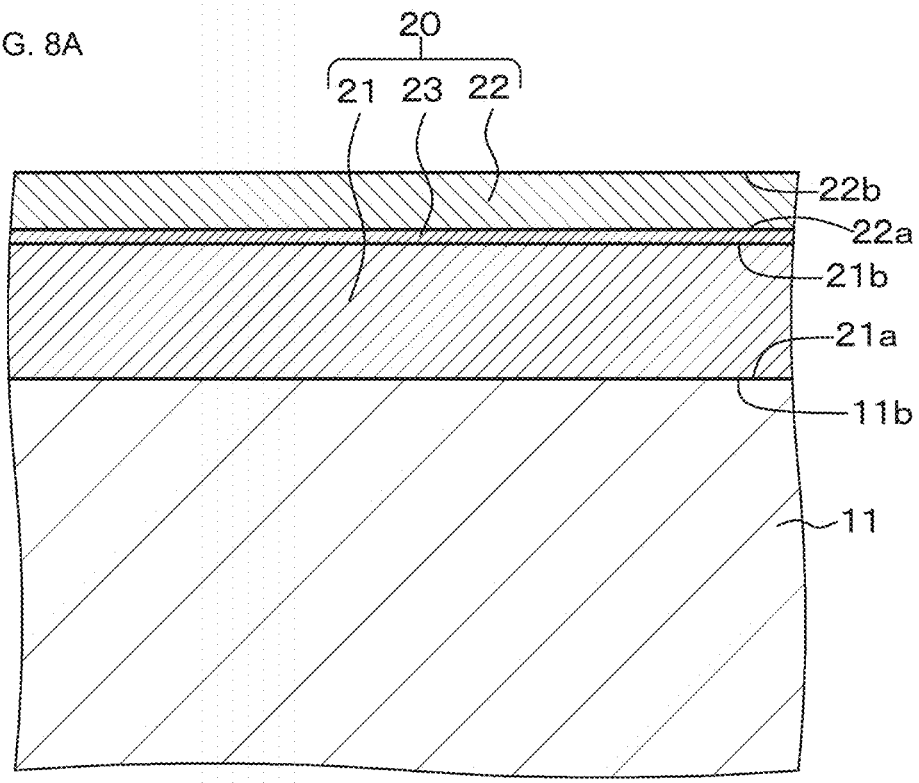
FIGS. 8A and 8B are schematic partial end views of a layered structure and the like for explaining a method for manufacturing the light emitting element of Embodiment 6.
Figure 8B:
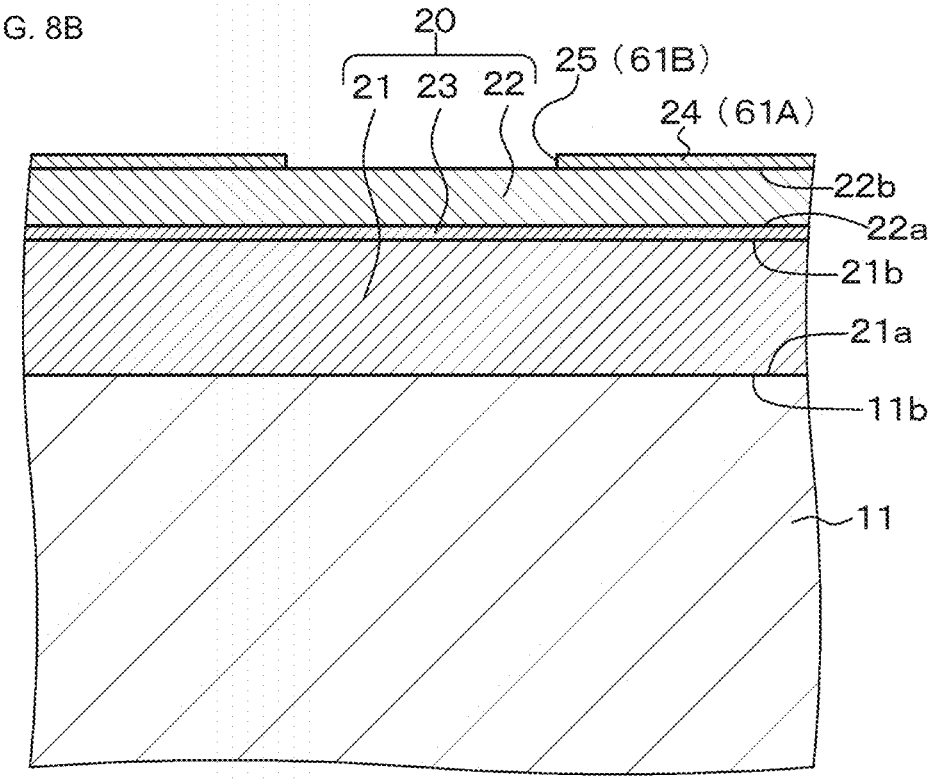
Figure 9:
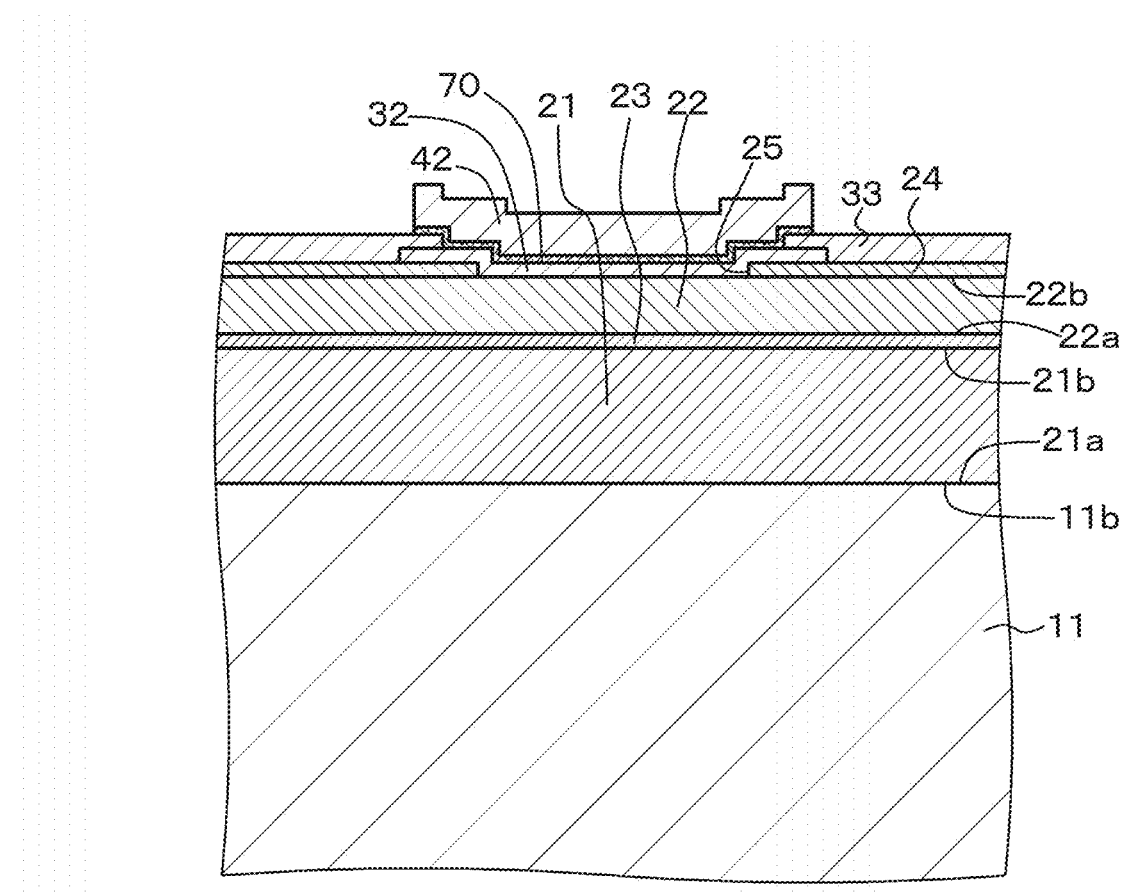
FIG. 9 is a schematic partial end view of a layered structure and the like for explaining the method for manufacturing the light emitting element of Embodiment 6, following FIG. 8B.

Next, the insulating layer (current constriction layer) 24 composed of $SiO_2$ and having the opening 25 is formed on the second surface 22b of the second compound semiconductor layer 22 on the basis of a combination of a film forming method such as a CVD method, a sputtering method, and a vacuum deposition method and a wet etching method or a dry etching method (see FIG. 8B). The insulating layer 24 having the opening 25 defines the current constriction region (current injection region 61A and current non-injection region 61B). That is, the opening 25 defines the current injection region 61A.

In order to obtain the current constriction region, an insulating layer (current constriction layer) composed of an insulating material (for example, $SiO_X$, $SiN_X$, $AlO_X$) may be formed between the second electrode 32 and the second compound semiconductor layer 22, or a mesa structure may be formed by etching the second compound semiconductor layer 22 by an RIE method and the like, or some layers of the layered second compound semiconductor layer 22 may be partially oxidized from the lateral direction to form the current constriction region, or an impurity may be ion-implanted into the second compound semiconductor layer 22 to form a region having reduced conductivity, or these methods may be combined as appropriate. However, the second electrode 32 needs to be electrically connected to the portion of the second compound semiconductor layer 22 through which the current flows due to the current constriction.

[Step-620]

After that, the second electrode 32, the intermediate layer 70, and the second light reflecting layer 42 are formed on the second compound semiconductor layer 22. Specifically, the second electrode 32 is formed on the basis of, for example, a lift-off method to extend from the second surface 22b of the second compound semiconductor layer 22 exposed on the bottom surface of the opening 25 (current injection region 61A) onto the insulating layer 24, and then the pad electrode 33 is formed on the basis of a combination of a film forming method such as a sputtering method or a vacuum vapor deposition method and a patterning method such as a wet etching method or a dry etching method. Next, the intermediate layer 70 and the second light reflecting layer 42 are formed on the basis of a combination of a film forming method such as a sputtering method or a vacuum vapor deposition method and a patterning method such as a wet etching method or a dry etching method to extend from above the second electrode 32 onto the pad electrode 33. In this way, the structure shown in FIG. 9 can be obtained.

[Step-630]

Figure 10:
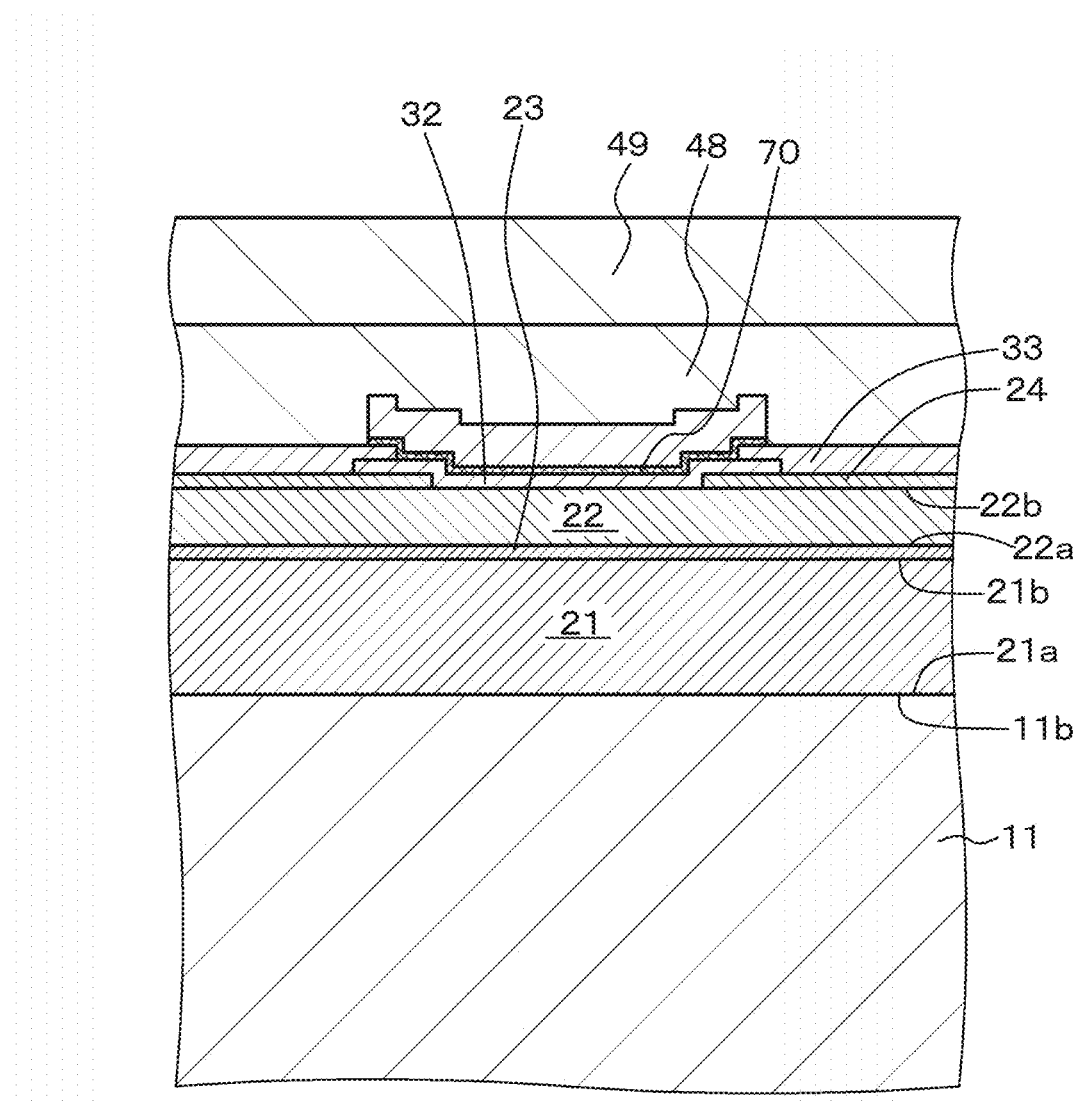
FIG. 10 is a schematic partial end view of a layered structure and the like for explaining the method for manufacturing the light emitting element of Embodiment 6, following FIG. 9.

Next, the second light reflecting layer 42 is fixed to the support substrate 49 via the bonding layer 48 (see FIG. 10). Specifically, the second light reflecting layer 42 is fixed to the support substrate 49 composed of a sapphire substrate by using the bonding layer 48 composed of an adhesive.

[Step-640]

Figure 11:
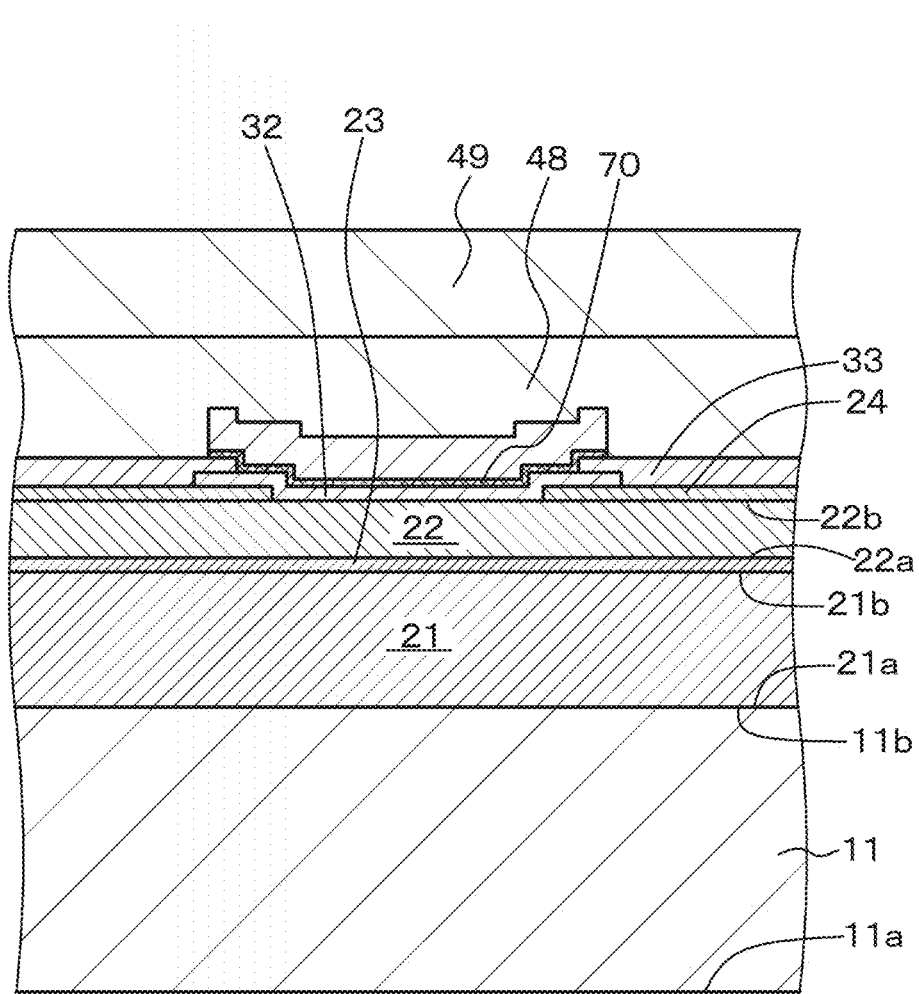
FIG. 11 is a schematic partial end view of a layered structure and the like for explaining the method for manufacturing the light emitting element of Embodiment 6, following FIG. 10.
Figure 12:
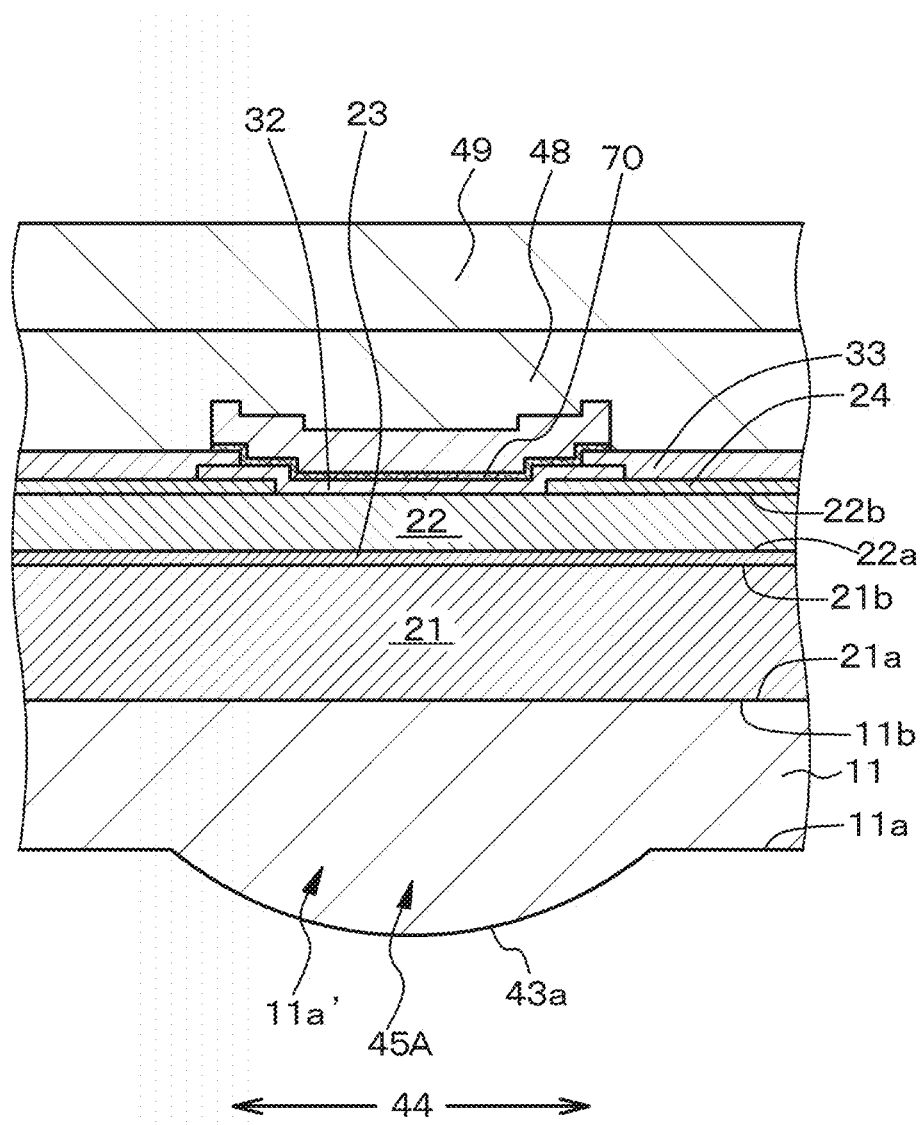
FIG. 12 is a schematic partial end view of a layered structure and the like for explaining the method for manufacturing the light emitting element of Embodiment 6, following FIG. 11.
Figure 13:
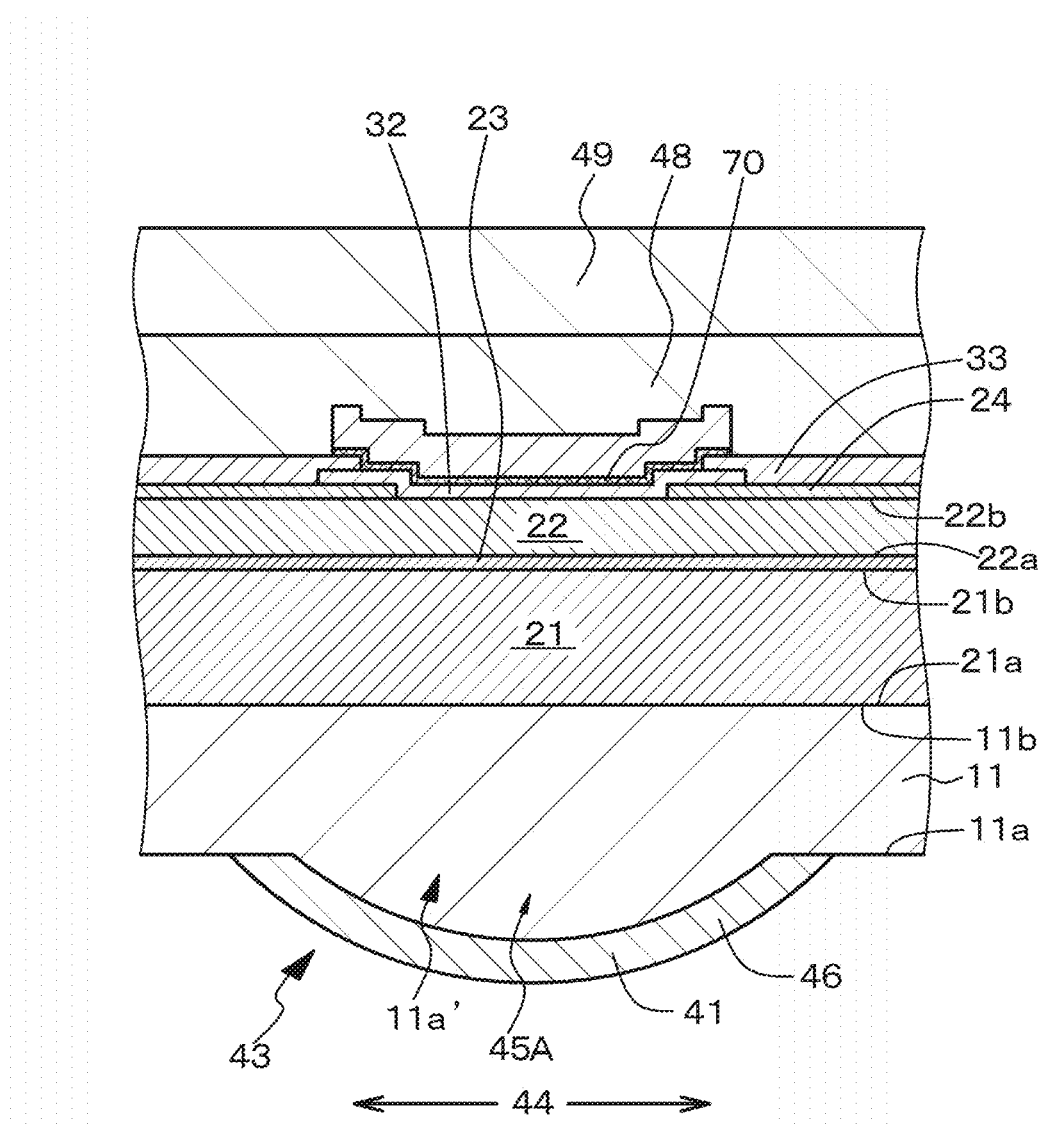
FIG. 13 is a schematic partial end view of a layered structure and the like for explaining the method for manufacturing the light emitting element of Embodiment 6, following FIG. 12.

Next, the compound semiconductor substrate 11 is thinned based on a mechanical polishing method or a CMP method, and the first surface 11a of the compound semiconductor substrate 11 is then mirror-finished (see FIG. 11). The value of the surface roughness Ra of the first surface 11a of the compound semiconductor substrate 11 is preferably 10 nm or less. The base portion 45A composed of the protruding portion 11a' is formed on the exposed surface (first surface 11a) of the compound semiconductor substrate 11. Specifically, a patterned resist layer is formed on the first surface 11a of the compound semiconductor substrate 11 on which the base portion 45A is to be formed, and the resist layer is heated to reflow the resist layer and obtain a resist pattern. The resist pattern is given the same shape (or a similar shape) as the shape of the protruding portion 11a'. Then, the base portion 45A composed of the protruding portion 11a' can be formed on the exposed surface (first surface 11a) of the compound semiconductor substrate 11 by etching back the resist pattern and the first surface 11a of the compound semiconductor substrate 11 by using the RIE method or the like (see FIG. 12).

[Step-650]

After that, the multilayer light reflecting film 46 is formed on at least a part of the base portion 45A. Specifically, the multilayer light reflecting film 46 is formed on the basis of a well-known method such as a sputtering method or a vacuum vapor deposition method to extend from the exposed surface (first surface 11a) of the compound semiconductor substrate 11 onto the base portion 45A. The unnecessary portions of the multilayer light reflecting film 46 are removed on the basis of a patterning method such as a wet etching method or a dry etching method to obtain the first light reflecting layer 41 (see FIG. 13), and then the first electrode 31 electrically connected to the first compound semiconductor layer 21 can be obtained by forming the first electrode 31 on the first surface 11a of the compound semiconductor substrate 11 on the basis of a combination of a film forming method such as a sputtering method or a vacuum vapor deposition method and a patterning method such as a wet etching method or a dry etching method.

[Step-660]

Then, the support substrate 49 is peeled off. In this way, the structure shown in FIG. 7 can be obtained. After that, the light emitting element is separated by performing so-called element separation, and the side surface or the exposed surface of the layered structure or the light emitting structure is covered with, for example, an insulating film composed of $SiO_2$. Next, the light emitting element of Embodiment 6 is completed by packaging and sealing.

In [Step-640], the compound semiconductor substrate 11 may be thinned, further mirror-finished, and then the support substrate 49 may be peeled off.

Figure 14:
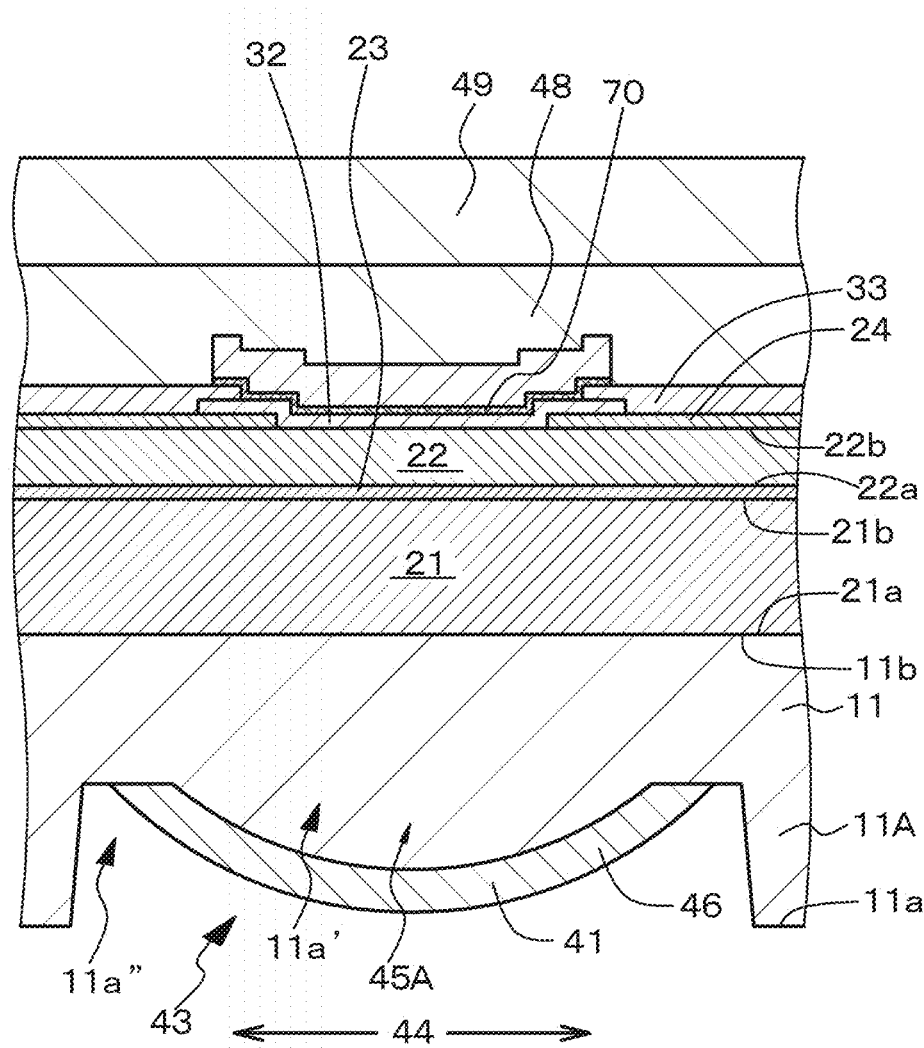
FIG. 14 is a schematic partial end view of a layered structure and the like of a modification example of the light emitting element of Embodiment 6.

Further, as a modification of the light emitting element of Embodiment 6, in [Step-640], the compound semiconductor substrate 11 is thinned and further mirror-finished, and then before forming the base portion 45A composed of the protruding portion 11a' on the exposed surface (first surface 11a) of the compound semiconductor substrate 11, a recess 11a'' is formed in the region of the exposed surface (first surface 11a) of the compound semiconductor substrate 11 where the base portion 45A is to be formed, a resist layer patterned in the recess 11a'' is formed, and the resist layer is heated to reflow the resist layer to obtain a resist pattern. The resist pattern is given the same shape (or a similar shape) as the shape of the protruding portion 11a'. The base portion 45A composed of the protruding portion 11a' may be formed inside the recess 11a'' on the exposed surface (first surface 11a) of the compound semiconductor substrate 11 by etching back a portion of the resist pattern and the recess 11a'' by using the RIE method and the like (see FIG. 14). Next, the multilayer light reflecting film 46 is formed on the entire surface including the top of the base portion 45A on the basis of a well-known method such as a sputtering method or a vacuum vapor deposition method. Then, the first light reflecting layer 41 can be obtained by removing an unnecessary portion of the multilayer light reflecting film 46 on the basis of a patterning method such as a wet etching method or a dry etching method. That is, the convex shape portion 11A is formed around the first light reflecting layer 41, and the first light reflecting layer 41 does not protrude from the convex shape portion 11A (composed of the exposed surface (first surface 11a) of the compound semiconductor substrate 11). As a result, the first light reflecting layer 41 can be protected.

Alternatively, in [Step-640], a protrusion may be formed on the exposed surface (first surface 11a) of the compound semiconductor substrate 11 so as to surround the base portion 45A at a distance from the base portion 45A at the same time as the base portion 45A composed of the protruding portion 11a' is formed on the exposed surface (first surface 11a) of the compound semiconductor substrate 11. Specifically, a patterned resist layer is formed on the first surface 11a of the compound semiconductor substrate 11 on which the base portion 45A is to be formed, and the resist layer is heated to reflow the resist layer and obtain a resist pattern. The resist pattern is given the same shape (or a similar shape) as the shape of the protruding portion 11a'. At the same time, a resist layer is formed on the portion of the first surface 11a of the compound semiconductor substrate 11 on which the protrusion is to be formed so as to surround the resist pattern at a distance from the resist pattern. Then, the base portion 45A composed of the protruding portion 11a' can be formed on the exposed surface (first surface 11a) of the compound semiconductor substrate 11, and at the same time, the protrusion can be also formed by etching back the resist pattern, the resist layer, and the first surface 11a of the compound semiconductor substrate 11 by using the RIE method or the like. The protrusion is formed around the first light reflecting layer 41, and the first light reflecting layer 41 does not protrude from the protrusion (configured of the exposed surface (first surface 11a) of the compound semiconductor substrate 11), thereby making it possible to protect the first light reflecting layer 41.

Figure 15:
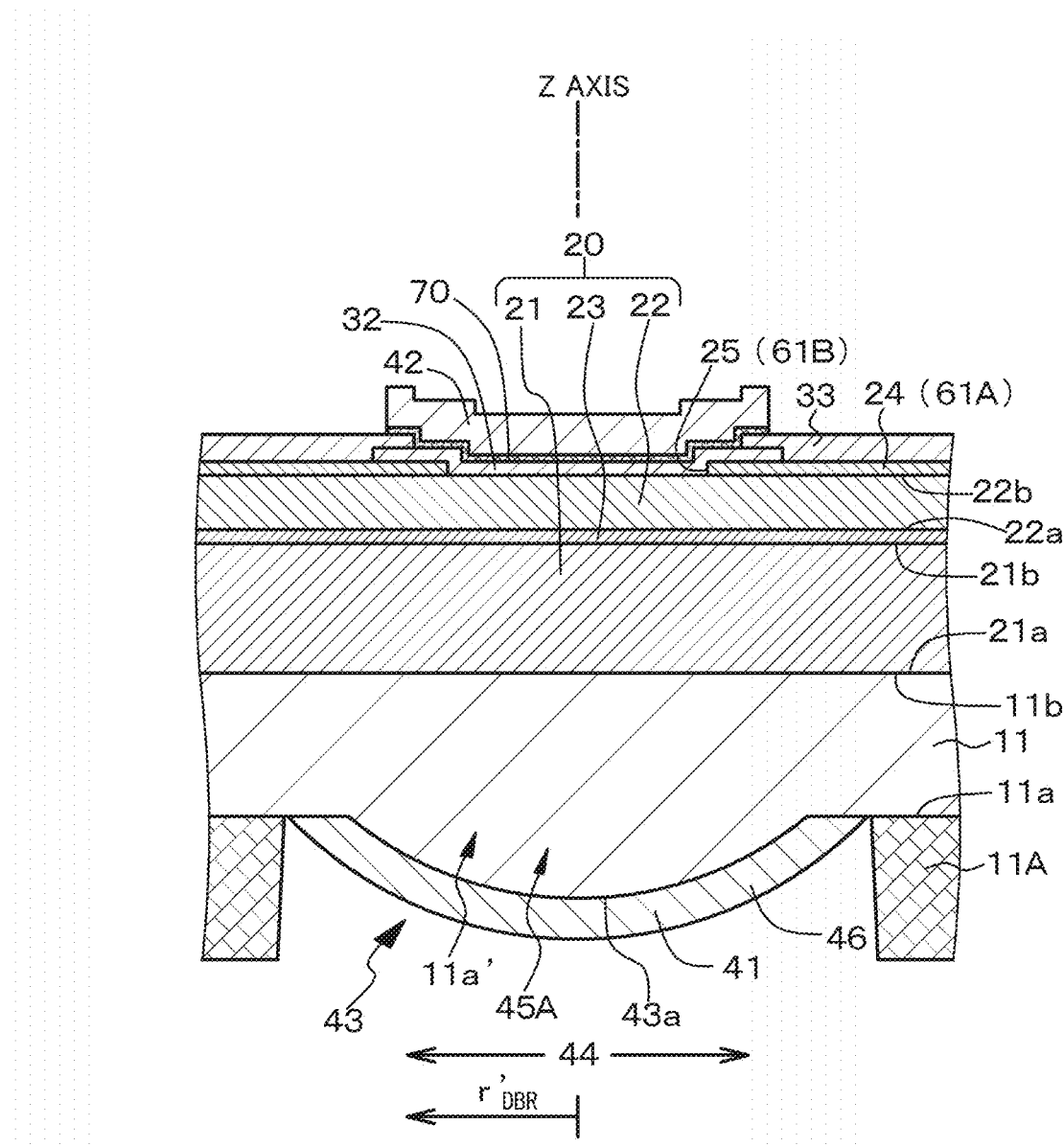
FIG. 15 is a schematic partial end view of a layered structure and the like of a modification example of the light emitting element of Embodiment 6.

Alternatively, in the above [Step-650], the convex shape portion 11A surrounding the first light reflecting layer 41 may be formed on the first surface 11a of the compound semiconductor substrate 11 after the first light reflecting layer 41 is obtained by forming the multilayer light reflecting film 46 on at least a part of the base portion 45A (see FIG. 15). The convex shape portion 11A may be configured of, for example, an insulating material or a metal material. Thus, the convex shape portion 11A is formed around the first light reflecting layer 41, and the first light reflecting layer 41 does not protrude from the convex shape portion 11A, thereby making it possible to protect the first light reflecting layer 41.

In the light emitting element of Embodiment 6, the first light reflecting layer has the concave mirror portion. Accordingly, the light that has diffracted and spread from the active layer and then fell on the first light reflecting layer can be reliably reflected toward the active layer and collected in the active layer. Therefore, it is possible to avoid an increase in diffraction loss even if the cavity length $L_{OR}$ is $1 \times 10^{-5}$ m or more. As a result, laser oscillation can be reliably performed, and since the cavity length $L_{OR}$ can be made $1 \times 10^{-5}$ m or more, the problem of thermal saturation can be alleviated. Further, since the cavity length $L_{OR}$ can be made $1 \times 10^{-5}$ m or more, the tolerance of the manufacturing process of the light emitting element is increased, and as a result, the yield can be improved.

Further, except for Embodiment 9 described hereinbelow, a GaN substrate is used in the manufacturing process of the light emitting element, but the GaN-based compound semiconductor is not formed based on a method such as the ELO method for epitaxial growth in the lateral direction. Therefore, as the GaN substrate, not only a polar GaN substrate but also a semipolar GaN substrate and a nonpolar GaN substrate can be used. Where a polar GaN substrate is used, the luminous efficiency tends to decrease due to the effect of the piezoelectric field in the active layer, but when a no-polar GaN substrate or a semipolar GaN substrate is used, such a problem can be solved or alleviated.

Embodiment 7

Figure 16:
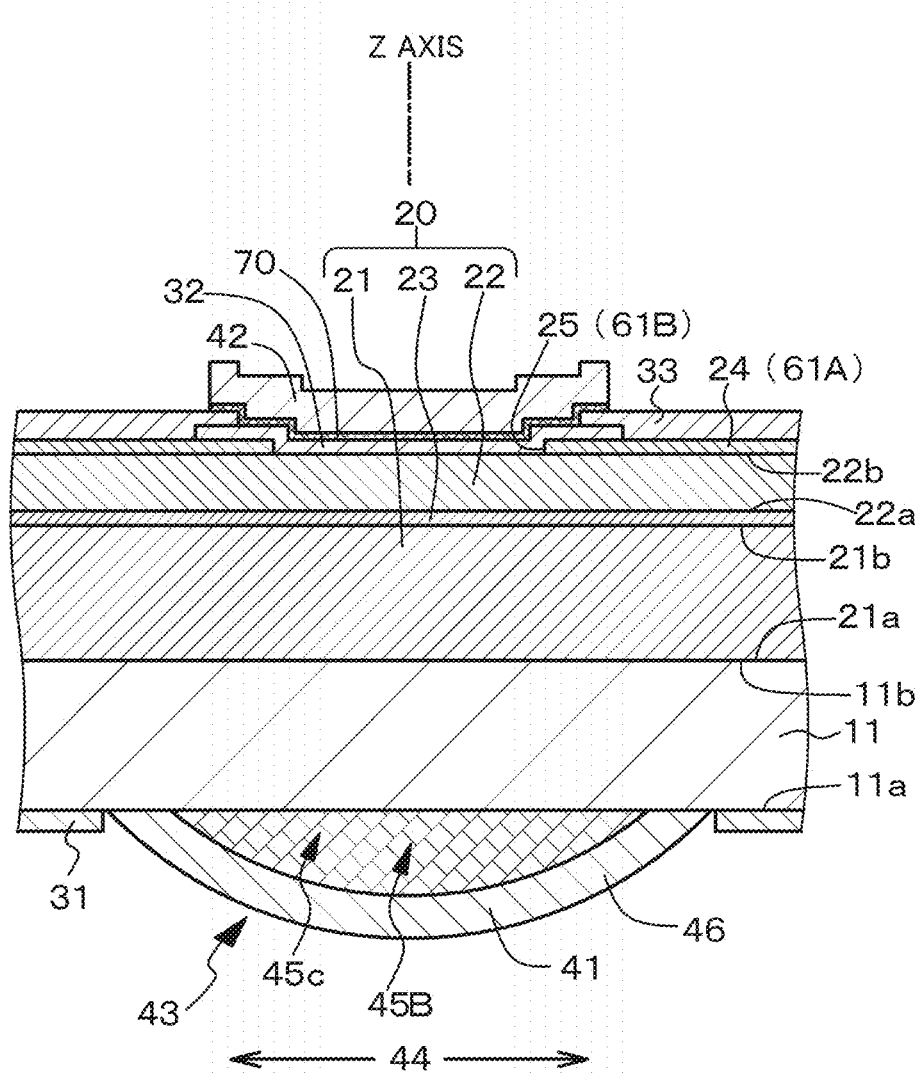
FIG. 16 is a schematic partial end view of a light emitting element of Embodiment 7.

Embodiment 7 is a modification of Embodiment 6 and relates to a light emitting element having a fourth-B configuration. In the light emitting element of Embodiment 7 with a schematic partial end view shown in FIG. 16, the concave mirror portion 43 of the first light reflecting layer 41 is configured of the base portion 45B composed of a protruding portion 45c formed on the compound semiconductor substrate 11 (specifically, on the first surface 11a of the compound semiconductor substrate 11), and the multilayer light reflecting film 46 formed on at least a part of the base portion 45B (specifically, the surface of the base portion 45B). Examples of the material constituting the base portion 45B (protruding portion 45c) include transparent dielectric materials such as $TiO_2$, $Ta_2O_5$, and $SiO_2$, silicone-based resins, and epoxy-based resins.

In the light emitting element of Embodiment 7, in a step similar to [Step-640] of Embodiment 6, the compound semiconductor substrate 11 is thinned and mirror-finished and then the base portion 45B composed of the protruding portion 45c is formed on the exposed surface (first surface 11a) of the compound semiconductor substrate 11. Specifically, for example, a $TiO_2$ layer or a $Ta_2O_5$ layer is formed on the exposed surface (first surface 11a) of the compound semiconductor substrate 11, and then a patterned resist layer is formed on the $TiO_2$ layer or the $Ta_2O_5$ layer where the base portion 45B is to be formed, and the resist layer is heated to reflow the resist layer and obtain a resist pattern. The resist pattern is given the same shape (or similar shape) as the shape of the protruding portion 45c. Then, the base portion 45B composed of the protruding portion 45c can be formed on the exposed surface (first surface 11a) of the compound semiconductor substrate 11 by etching back the resist pattern and the $TiO_2$ layer or the $Ta_2O_5$ layer. Next, the multilayer light reflecting film 46 is formed on the basis of a well-known method to extend from the exposed surface (first surface 11a) of the compound semiconductor substrate 11 onto the base portion 45B. Then, an unnecessary portion of the multilayer light reflecting film 46 is removed to obtain the first light reflecting layer 41, and then the first electrode 31 electrically connected to the first compound semiconductor layer 21 is formed by forming the first electrode 31 on the first surface 11a of the compound semiconductor substrate 11.

Except for the above-mentioned points, the configuration and structure of the light emitting element of Embodiment 7 can be the same as the configuration and structure of the light emitting element of Embodiment 6, so detailed description thereof will be omitted. The modification of the light emitting element of Embodiment 6 can also be adopted in Embodiment 7.

Embodiment 8

Figure 17:
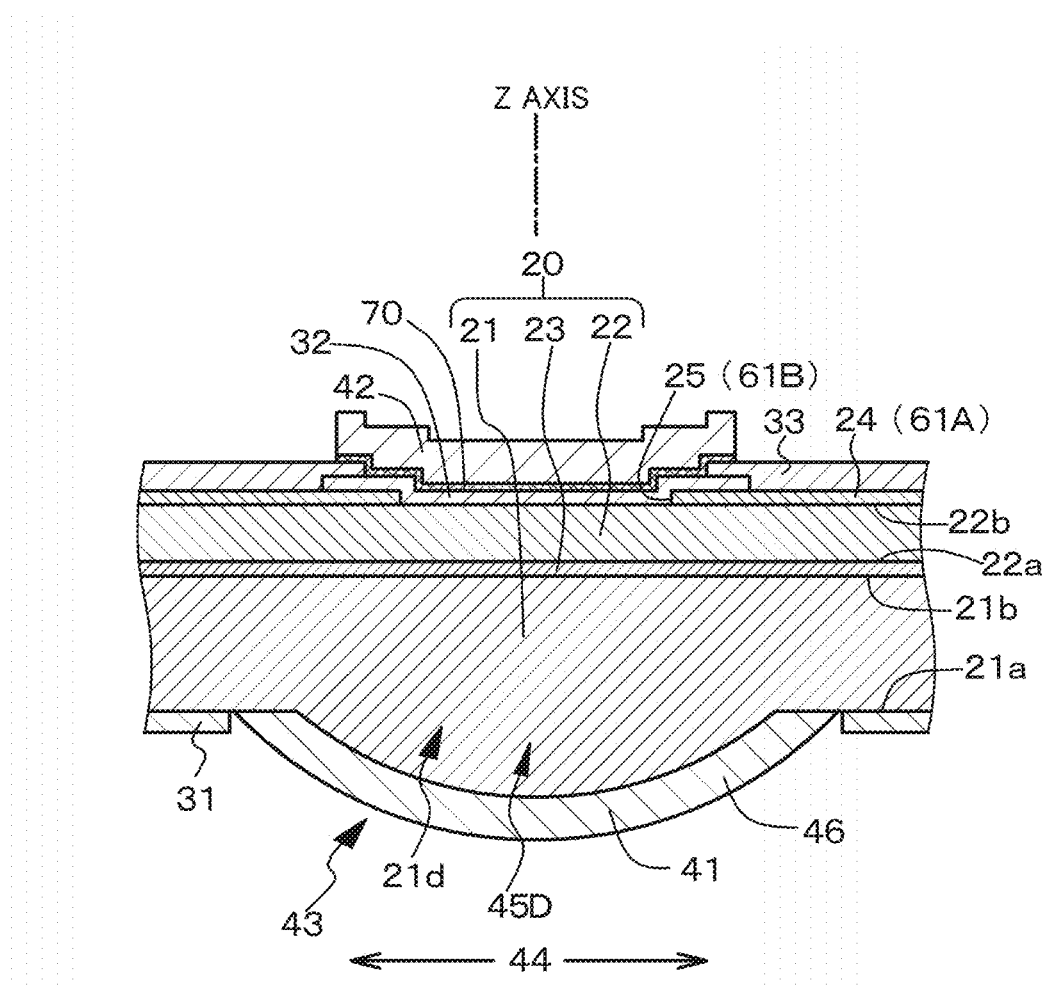
FIG. 17 is a schematic partial end view of a light emitting element of Embodiment 8.
Figure 18:
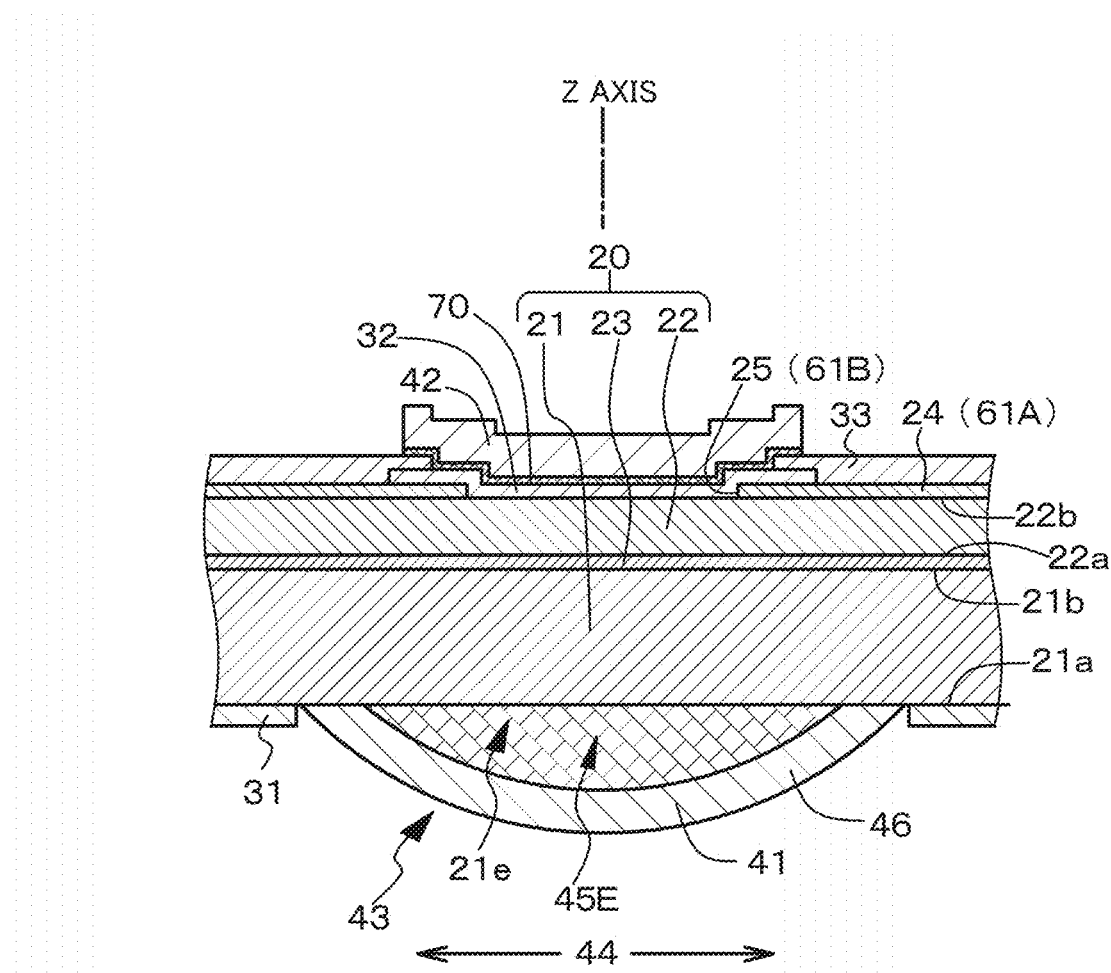
FIG. 18 is a schematic partial end view of a modification example of the light emitting element of Embodiment 8.

Embodiment 8 is also a modification of Embodiment 6 or Embodiment 7, and relates to a light emitting element having the fifth configuration. In the light emitting element of Embodiment 8 with the schematic partial end view shown in FIG. 17, the first light reflecting layer 41 is formed on the first surface 21a of the first compound semiconductor layer 21. In the manufacture of the light emitting element of Embodiment 8, in a step similar to [Step-640] of Embodiment 6, the light emitting element manufacturing substrate 11 is removed to expose the first surface 21a of the first compound semiconductor layer 21. Then, as in Embodiment 6, a patterned resist layer is formed on the first surface 21a of the first compound semiconductor layer 21 on which the base portion 45D is to be formed, and the resist layer is heated to reflow the resist layer and obtain a resist pattern. The resist pattern is given the same shape (or a similar shape) as the shape of a protruding portion 21d. Then, the base portion 45D composed of the protruding portion 21d can be formed on the first surface 21a of the first compound semiconductor layer 21 by etching back the resist pattern and the first surface 21a of the first compound semiconductor layer 21. Alternatively, in a modification of the light emitting element of Embodiment 8 with a schematic partial end view shown in FIG. 18, for example, a $TiO_2$ layer or a $Ta_2O_5$ layer is formed on the first surface 21a of the first compound semiconductor layer 21, next, a patterned resist layer is formed on the $TiO_2$ layer or the $Ta_2O5$ layer on which a base portion 45E is to be formed, and the resist layer is heated to reflow the resist layer and obtain a resist pattern. The resist pattern is given the same shape (or a similar shape) as the shape of a protruding portion 21e. Then, the base portion 45E composed of the protruding portion 21e can be formed on the first surface 21a of the first compound semiconductor layer 21 by etching back the resist pattern and the $TiO_2$ layer or the $Ta_2O_5$ layer.

Except for the above-mentioned points, the configuration and structure of the light emitting element of Embodiment 8 and a modification example thereof can be the same as the configuration and structure of the light emitting element of Embodiment 6 or Embodiment 7, so detailed description thereof will be omitted. The support substrate 49 and the bonding layer 48 may be left unremoved.

Embodiment 9

Embodiment 9 is a modification of Embodiment 8. The schematic partial end view of the light emitting element of Embodiment 9 is substantially the same as that of FIG. 18, and since the configuration and structure of the light emitting element of Embodiment 9 can be substantially the same as the configuration and structure of the light emitting element of Embodiment 8, detailed description thereof will be omitted.

In Embodiment 9, first, a recessed portion 43A for forming the concave mirror portion 43 is formed on the second surface 11b of the light emitting element manufacturing substrate 11. Then, after forming the first light reflecting layer 41 composed of a multilayer film on the second surface 11b of the light emitting element manufacturing substrate 11, a planarizing film 47 is formed on the first light reflecting layer 41, and the planarizing films 47 and the first light reflecting layer 41 are subjected to a planarizing treatment to expose a part of the second surface 11b of the light emitting element manufacturing substrate 11 while leaving the planarizing film 47 and the first light reflecting layer 41 (see FIG. 19A). The planar shape of the first light reflecting layer 41 is circular. However, the shape of the first light reflecting layer 41 is not limited to this.

Next, the light emitting structure 20 is formed on the light emitting element manufacturing substrate 11 including the first light reflecting layer 41 on the basis of lateral growth by using a method such as the ELO method for epitaxial growth in the lateral direction (see FIG. 19B). After that, [Step-610] and [Step-620] of Embodiment 6 are executed. Then, the light emitting element manufacturing substrate 11 is removed, and the first electrode 31 is formed on the first surface 21a of the exposed first compound semiconductor layer 21. Alternatively, the light emitting element manufacturing substrate 11 is not removed, and the first electrode 31 is formed on the first surface 11a of the light emitting element manufacturing substrate 11. After that, the light emitting element is separated by performing so-called element separation, and the side surface or the exposed surface of the layered structure or the light emitting structure is covered with, for example, an insulating film composed of $SiO_2$. Then, the light emitting element of Embodiment 9 can be completed by packaging or sealing.

Embodiment 10

Embodiment 10 is a modification of Embodiment 6 to Embodiment 9, and relates to a light emitting element having the first configuration. As described above, the insulating layer 24 having the opening 25 defines the current constriction region (current injection region 61A and current non-injection region 61B). That is, the opening 25 defines the current injection region 61A. That is, in the light emitting element of Embodiment 10, the second compound semiconductor layer 22 is provided with the current injection region 61A and the current non-injection region 61B surrounding the current injection region 61A, and the shortest distance $D_{CI}$ from the center of gravity point of the current injection region 61A to a boundary 61C between the current injection region 61A and the current non-injection region 61B satisfies the above-mentioned formulas (1-1) and (1-2).

In the light emitting element of Embodiment 10, the radius $r'_{DBR}$ of the effective region in the concave mirror portion 43 of the first light reflecting layer 41 satisfies $$\omega_0 \leq r'_{DBR} \leq 20 \cdot \omega_0.$$

Moreover, $D_{CI} \geq \omega_0$ is satisfied. Further, $R_{DBR} \leq 1 \times 10^{-3}$ m is satisfied.
Specifically,
$D_{CI}=4$ μm
$\omega_0=1.5$ μm
$L_{OR}=50$ μm
$R_{DBR}=60$ μm
$\lambda_0=525$ nm
can be exemplified. Further, the diameter of the opening 25 can be exemplified by 8 μm. A substrate in which a main surface is a surface with a c-plane inclined by about 75 degrees in the m-axis direction is used as the GaN substrate. That is, the GaN substrate has a {20-21} plane which is a semipolar plane as a main surface. Such a GaN substrate can also be used in other embodiments.

A deviation between the central axis (Z axis) of the concave mirror portion 43 and the current injection region 61A in the XY plane direction causes deterioration of the characteristics of the light emitting element. Lithography is often used for both patterning for forming the concave mirror portion 43 and patterning for forming the opening 25, but in this case, the positional relationship between the two often shifts within the XY plane depending on the performance of the exposure machine. In particular, the opening 25 (current injection region 61A) is positioned by performing alignment from the side of the second compound semiconductor layer 22. Meanwhile, the concave mirror portion 43 is positioned by performing alignment from the side of the compound semiconductor substrate 11. Accordingly, in the light emitting element of Embodiment 10, by forming the opening 25 (current injection region 61) to be larger than the region where the light is focused by the concave mirror portion 43, a structure is realized in which the oscillation characteristics are not affected even if a deviation occurs between the central axis (Z axis) of the concave mirror portion 43 and the current injection region 61A in the XY plane direction.

That is, where the region in which the light reflected by the first light reflecting layer is collected is not included in the current injection region corresponding to the region where the active layer has a gain due to current injection, the stimulated emission of light from the carrier is inhibited. As a result, laser oscillation may be hindered. However, by satisfying the above formulas (1-1) and (1-2), it is possible to guarantee that the region in which the light reflected by the first light reflecting layer is collected is included in the current injection region and laser oscillation can be reliably achieved.

Embodiment 11

Figure 20:
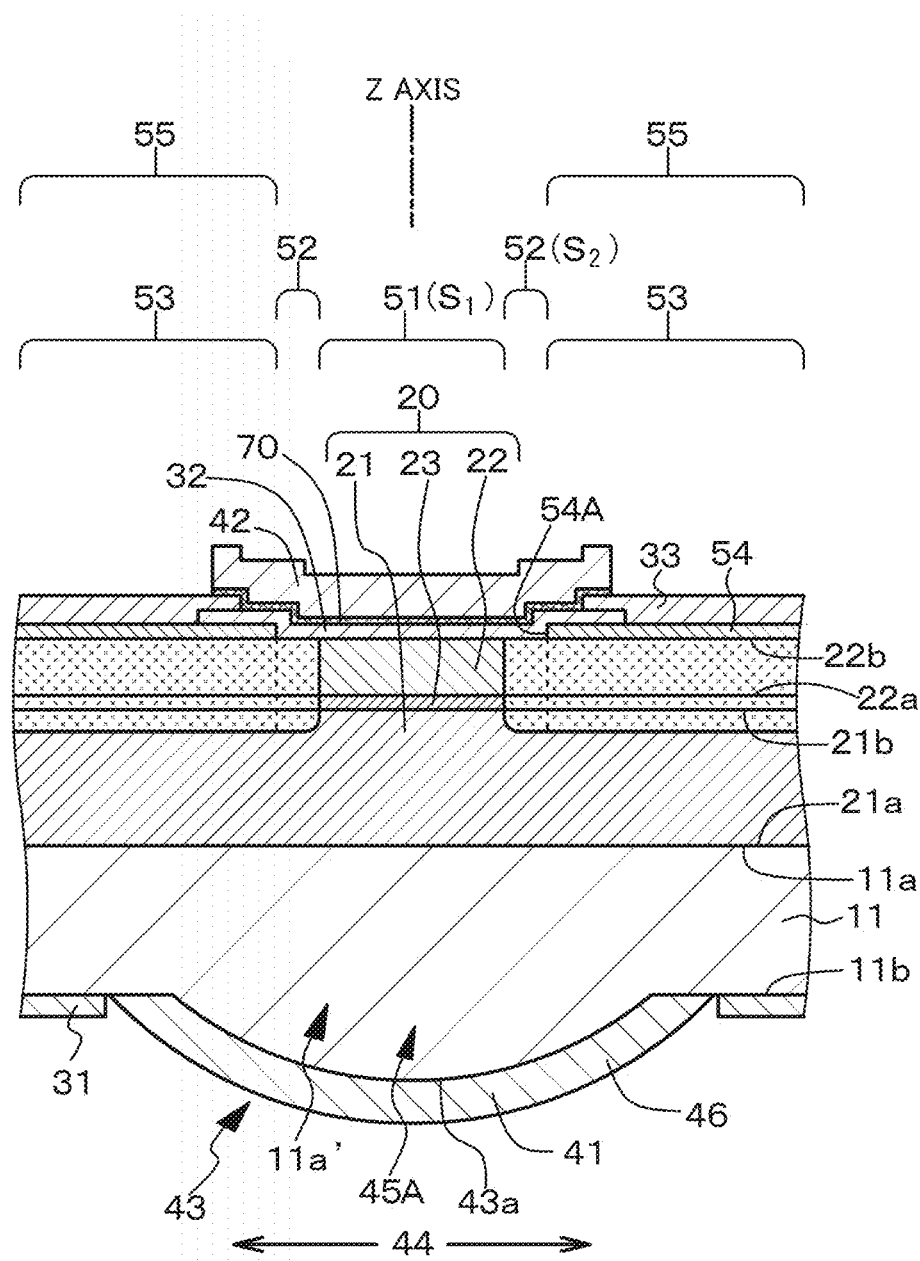
FIG. 20 is a schematic partial end view of a light emitting element of Embodiment 11.

Embodiment 11 is a modification of Embodiment 6 to Embodiment 10, and relates to a light emitting element having the second configuration, specifically, a light emitting element having the second-A configuration. A schematic partial end view of the light emitting element of Embodiment 11 is shown in FIG. 20.

In order to control the flow path (current injection region) of the current flowing between the first electrode and the second electrode, a current non-injection region is formed so as to surround the current injection region. In a GaAs-based surface-emitting laser element (a surface-emitting laser element configured of a GaAs-based compound semiconductor), a current non-injection region surrounding the current injection region can be formed by oxidizing the active layer from the outside along the XY plane. The refractive index of the oxidized region of the active layer (current non-injection region) decreases with respect to that of the non-oxidized region (current injection region). As a result, the optical path length of the resonator (represented by the product of the refractive index and the physical distance) is shorter in the current non-injection region than in the current injection region. As a consequence, a kind of "lens effect" is generated, and the action of confining the laser light in the central portion of the surface-emitting laser element is brought about. In general, since light tends to spread due to the diffraction effect, the laser beam reciprocating in the resonator gradually dissipates to the outside of the resonator (diffraction loss) and an adverse effect such as an increase in threshold current is generated. However, since the lens effect compensates for this diffraction loss, it is possible to suppress an increase in the threshold current and the like.

Figures 22A, 22B, 22C:
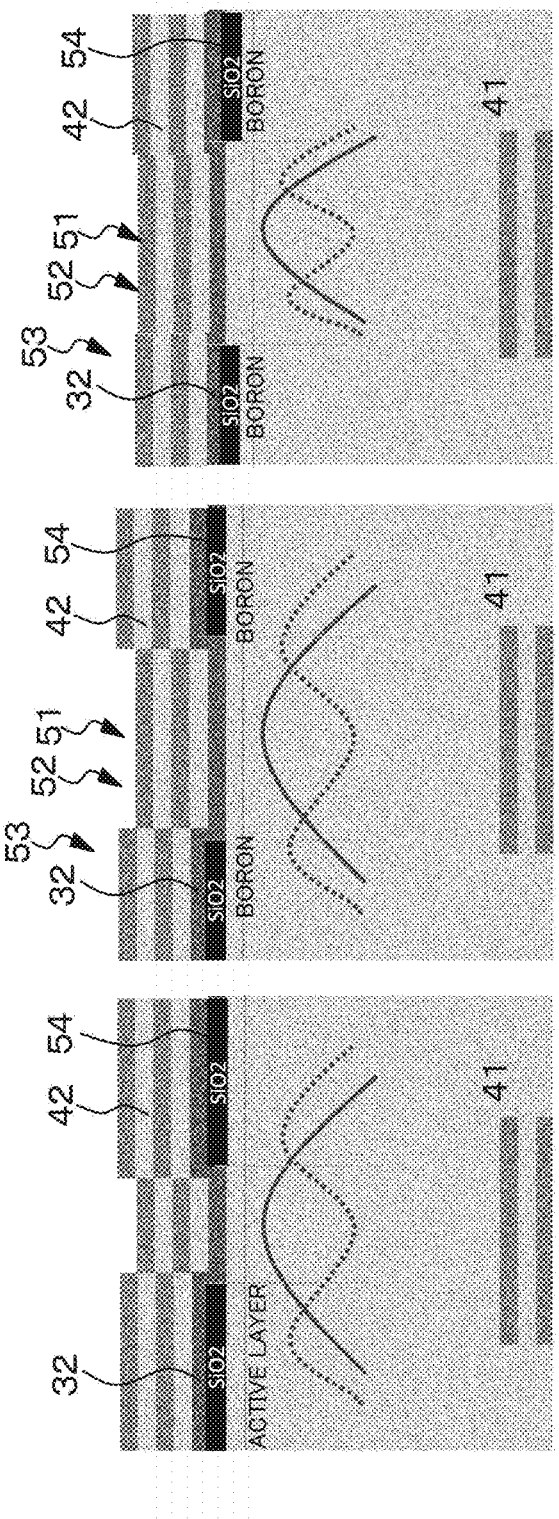
FIGS. 22A, 22B, and 22C are conceptual diagrams showing the light field intensities of the conventional light emitting element, the light emitting element of Embodiment 11, and the light emitting element of Embodiment 14, respectively.
Figure 23:
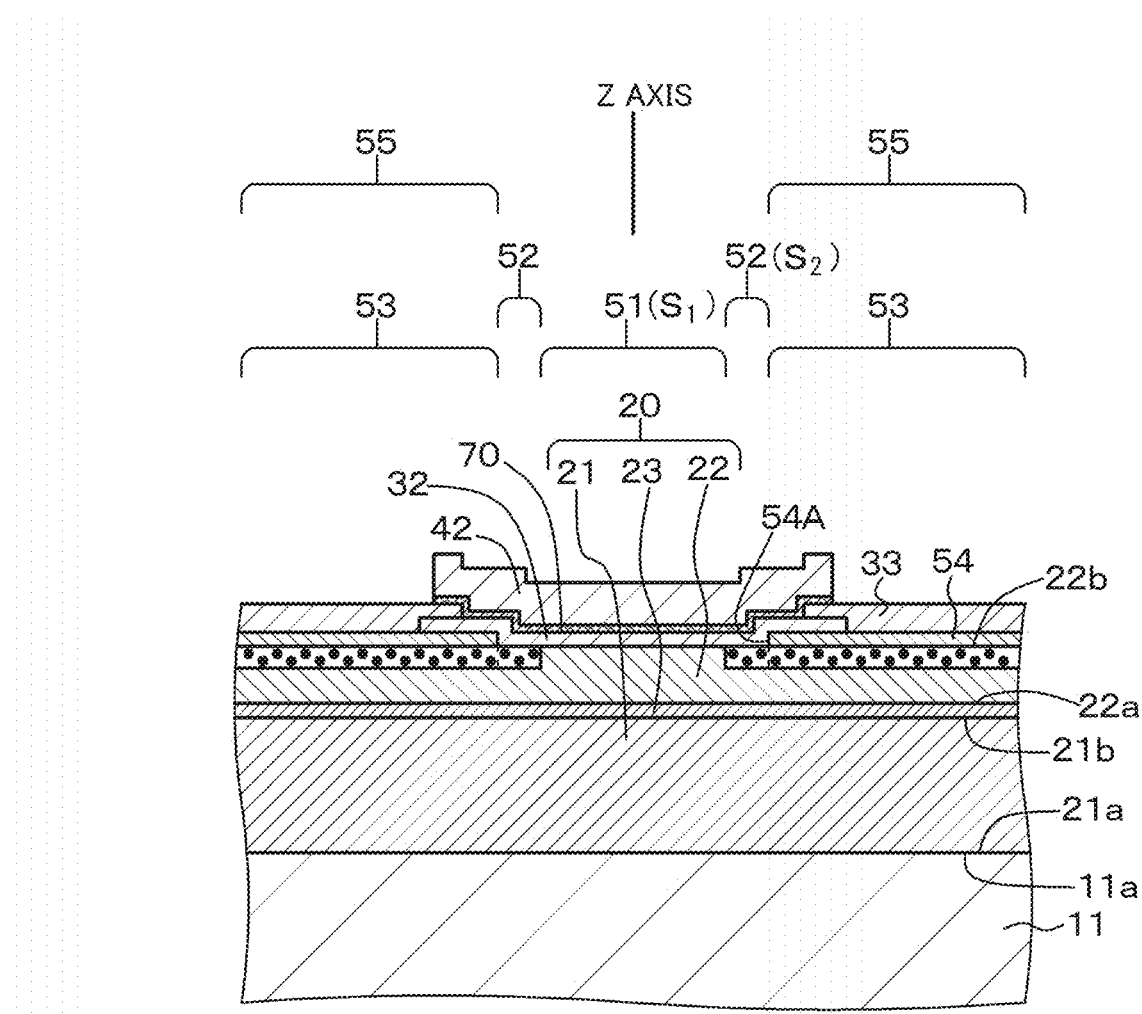
FIG. 23 is a schematic partial end view of a light emitting element of Embodiment 12.
Figure 24:
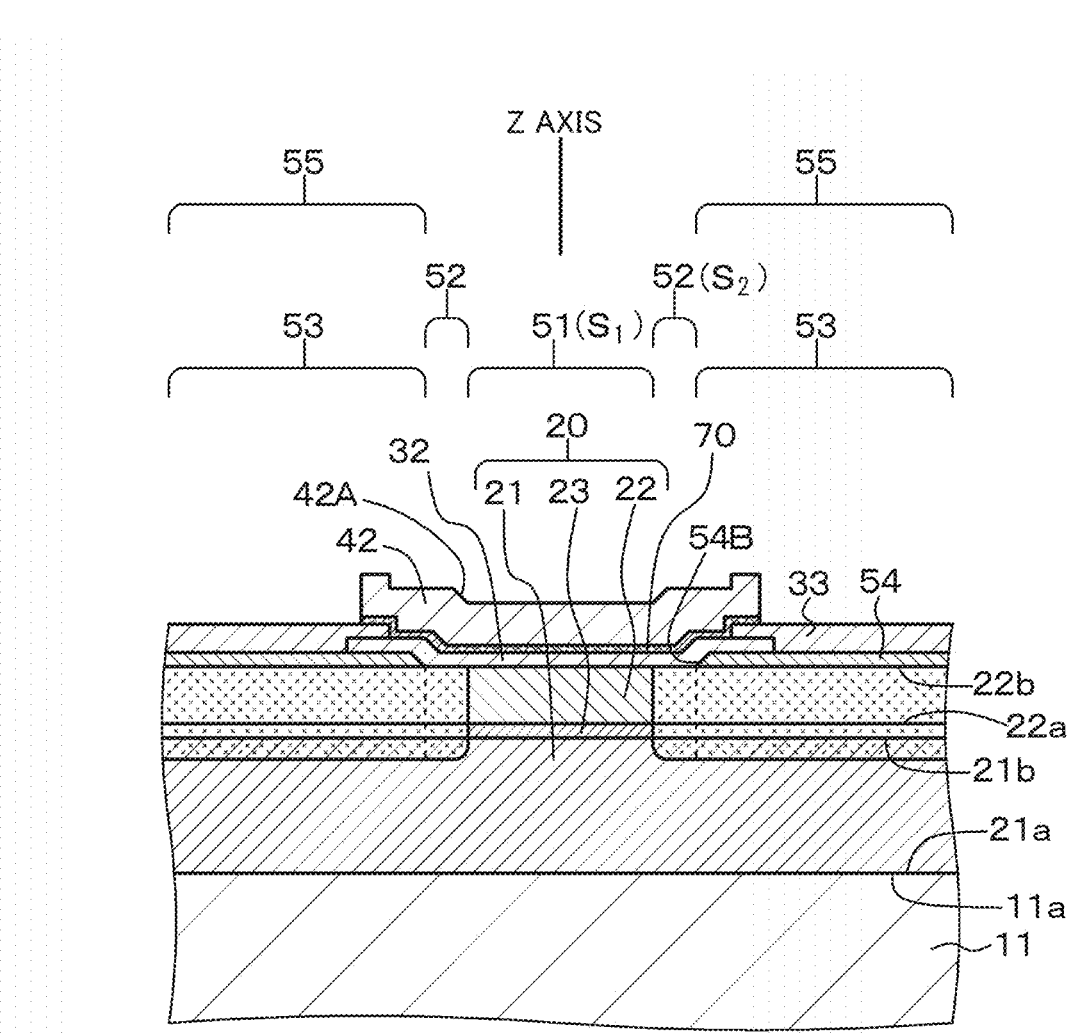
FIG. 24 is a schematic partial end view of a light emitting element of Embodiment 13.

However, in a light emitting element configured of a GaN-based compound semiconductor, it is difficult to oxidize the active layer from the outside (from the lateral direction) along the XY plane due to the characteristics of the material. Therefore, as described in Embodiment 6 to Embodiment 10, the insulating layer 24 composed of $SiO_2$ and having the opening 25 is formed on the second compound semiconductor layer 22, the second electrode 32 composed of a transparent conductive material is formed to extend from the second compound semiconductor layer 22 exposed at the bottom of the opening 25 onto the insulating layer 24, and the intermediate layer 70 and the second light reflecting layer 42 are formed on the second electrode 32. By forming the insulating layer 24 in this way, the current non-injection region 61B is formed. The portion of the second compound semiconductor layer 22 located in the opening 25 provided in the insulating layer 24 becomes the current injection region 61A.

Where the insulating layer 24 is formed on the second compound semiconductor layer 22, the cavity length in the region where the insulating layer 24 is formed (current non-injection region 61B) is larger by the optical thickness of the insulating layer 24 than the cavity length in the region where the insulating layer 24 is not formed (current injection region 61A). Therefore, an action causing the laser beam reciprocating in the resonator formed by the two light reflecting layers 41 and 42 of the surface-emitting laser element (light emitting element) to diverge and dissipate to the outside of the resonator is generated. For convenience, such an action is referred to as a "reverse lens effect". As a result, an oscillation mode loss is generated in the laser beam, the threshold current may be increased, or the slope efficiency may be worsened. Here, the "oscillation mode loss" is a physical quantity that causes a variation in the light field intensity in the fundamental mode and higher order mode in the oscillating laser light, and different oscillation mode losses are defined for the individual modes. The "light field intensity" is a light field intensity that is a function of the distance L from the Z axis in the XY plane. In general, in the fundamental mode, the light field intensity decreases monotonically as the distance L increases, but in the higher order mode, the light field intensity repeats an increase and a decrease once or a plurality of times and is eventually reduced as the distance L increases (see the conceptual diagram of FIG. 22A). In FIGS. 22A, 22B, and 22C, a solid line represents the light field intensity distribution in the fundamental mode, and a broken line represents the light field intensity distribution in the higher order mode. Further, in FIGS. 22A, 22B, and 22C, the first light reflecting layer 41 is displayed in a flat state for convenience, but actually has a concave mirror portion.

The light emitting element of Embodiment 11 or the light emitting element of Embodiment 12 to Embodiment 15 described hereinbelow includes:

(A) the light emitting structure 20 composed of a GaN-based compound semiconductor in which
the first compound semiconductor layer 21 having the first surface 21a and the second surface 21b that is opposite to the first surface 21a,
the active layer (light emitting layer) 23 facing the second surface 21b of the first compound semiconductor layer 21, and
the second compound semiconductor layers 22 having the first surface 22a facing the active layer 23, and the second surface 22b that is opposite to the first surface 22a
are layered,
(B) a mode loss action site (mode loss action layer) 54 that is provided on the second surface 22b of the second compound semiconductor layer 22 and that constitutes a mode loss action region 55 acting on a variation in the oscillation mode loss,
(C) the second electrode 32 formed to extend from above the second surface 22b of the second compound semiconductor layer 22 onto the mode loss action site 54,
(D) the intermediate layer 70 and the second light reflecting layer 42 formed on the second electrode 32,
(E) the first light reflecting layer 41 provided on the first surface 21a side of the first compound semiconductor layer 21, and
(F) the first electrode 31 electrically connected to the first compound semiconductor layer 21.

The light emitting structure 20 is formed with a current injection region 51, a current non-injection inner region 52 surrounding the current injection region 51, and a current non-injection outer region 53 surrounding the current non-injection inner region 52, and the orthogonal projection image of the mode loss action region 55 and the orthogonal projection image of the current non-injection outer region 53 overlap with each other. That is, the current non-injection outer region 53 is located below the mode loss action region 55. In a region sufficiently distant from the current injection region 51 into which a current is injected, the orthogonal projection image of the mode loss action region 55 and the orthogonal projection image of the current non-injection outer region 53 do not have to overlap with each other. Here, the current non-injection regions 52 and 53 in which no current is injected are formed in the light emitting structure 20, but in the illustrated example, these regions are formed to extend in the thickness direction from the second compound semiconductor layer 22 onto the first compound semiconductor layer 21. However, the current non-injection regions 52 and 53 may be formed in a region on the second electrode side of the second compound semiconductor layer 22 in the thickness direction, may be formed in the entire second compound semiconductor layer 22, or may be formed in the second compound semiconductor layer 22 and the active layer 23.

The mode loss action site (mode loss action layer) 54 is composed of a dielectric material such as $SiO_2$, and in the light emitting elements of Embodiment 11 or Embodiment 12 to Embodiment 15 described hereinbelow, the mode loss action site is formed between the second electrode 32 and the second compound semiconductor layer 22. The optical thickness of the mode loss action site 54 can be set to a value deviating from an integral multiple of ¼ of the oscillation wavelength $\lambda_0$. Alternatively, the optical thickness $t_0$ of the mode loss action site 54 can be an integral multiple of ¼ of the oscillation wavelength $\lambda_0$. That is, the optical thickness $t_0$ of the mode loss action site 54 can be set to a thickness that does not disturb the phase of light generated in the light emitting element and does not break the standing wave. However, this thickness does not have to be exactly an integral multiple of ¼ in a strict sense, and it is sufficient if $$(\lambda_0/4n_{m\text{-}loss}) \times m - (\lambda_0/8n_{m\text{-}loss}) \le t_0 \le (\lambda_0/4n_{m\text{-}loss}) \times 2m + (\lambda_0/8n_{m\text{-}loss})$$

is satisfied. Specifically, the optical thickness $t_0$ of the mode loss action site 54 is preferably about 25 to 250 when the value of ¼ of the wavelength of the light generated by the light emitting element is "100". By adopting these configurations, it is possible to change the phase difference (control the phase difference) between the laser light passing through the mode loss action site 54 and the laser light passing through the current injection region 51, to control the oscillation mode loss with a higher degree of freedom, and to further increase the design freedom of the light emitting element.

In Embodiment 11 the shape of the boundary between the current injection region 51 and the current non-injection inner region 52 was circular (diameter: 8 μm), and the shape of the boundary between the current non-injection inner region 52 and the current non-injection outer region 53 was circular (diameter: 12 μm). That is, assuming that the area of the orthogonal projection image of the current injection region 51 is $S_1$ and the area of the orthogonal projection image of the current non-injection inner region 52 is $S_2$, $0.01 \le S_1/(S_1+S_2) \le 0.7$ is satisfied. Specifically, $S_1/(S_1+S_2) = 8^2/12^2 = 0.44$.

In the light emitting elements of Embodiment 11 or Embodiment 12, Embodiment 13 and Embodiment 15 described hereinbelow, assuming that the optical distance from the active layer 23 in the current injection region 51 to the second surface of the second compound semiconductor layer 22 is L2, and the optical distance from the active layer 23 in the mode loss action region 55 to the top surface (the surface that is opposite to the second electrode 32) of the mode loss action site 54 is L0, $$L0 > L2$$

is satisfied. Specifically, $$L0/L2 = 1.5.$$

The generated laser light having a higher order mode is dissipated toward the outside of the resonator structure composed of the first light reflecting layer 41 and the second light reflecting layer 42 by the mode loss action region 55, whereby the oscillation mode loss is increased. That is, the resulting light field intensities in the fundamental mode and the higher order mode decrease as the distance from the Z axis increases in the orthogonal projection image of the mode loss action region 55 due to the presence of the mode loss action region 55 acting on a variation in the oscillation mode loss (see the conceptual diagram of FIG. 22B), but a decrease in the light field intensity in the higher order mode is larger than a decrease in the light field intensity in the fundamental mode, the fundamental mode can be further stabilized, the threshold current can be reduced and the relative light field intensity in the fundamental mode can be increased. Moreover, since a portion of a skirt of the light field intensity in the higher order mode is located farther from the current injection region than in the conventional light emitting element (see FIG. 22A), the influence of the reverse lens effect can be reduced. In the first place, in the case where the mode loss action site 54 composed of SiO2 is not provided, mixing of oscillation modes is generated.

The first compound semiconductor layer 21 is composed of an n-GaN layer, the active layer 23 is composed a five-layer multiple quantum well structure in which an $In_{0.04}Ga_{0.96}N$ layer (barrier layer) and an $In_{0.16}Ga_{0.84}N$ layer (well layer) are layered, and the second compound semiconductor layer 22 is composed of a p-GaN layer. Further, the first electrode 31 is composed of Ti/Pt/Au, and the second electrode 32 is composed of a transparent conductive material, specifically ITO. A circular opening 54A is formed in the mode loss action site 54, and the second compound semiconductor layer 22 is exposed at the bottom of the opening 54A. On the edge of the first electrode 31, a pad electrode (not shown) composed of, for example, Ti/Pt/Au or V/Pt/Au and serving for electrically connecting to an external electrode or circuit is formed or connected. On the edge of the second electrode 32, a pad electrode 33 composed of, for example, Ti/Pd/Au or Ti/Ni/Au and serving for electrically connecting to an external electrode or circuit is formed or connected. The first light reflecting layer 41 and the second light reflecting layer 42 have a layered structure of a SiN layer and a $SiO_2$ layer (total number of dielectric films layered: 20 layers).

In the light emitting element of Embodiment 11, the current non-injection inner region 52 and the current non-injection outer region 53 are formed by ion implantation into the light emitting structure 20. For example, boron was selected as the ion species, but the boron ion is not limiting.

An outline of a method for manufacturing the light emitting element of Embodiment 11 will be described below.

[Step-1100]

In manufacturing the light emitting element of Embodiment 11, first, a step similar to [Step-600] of Embodiment 6 is carried out.

[Step-1110]

Next, the current non-injection inner region 52 and the current non-injection outer region 53 are formed in the light emitting structure 20 on the basis of ion implantation method using boron ions.

[Step-1120]

Figure 21A:
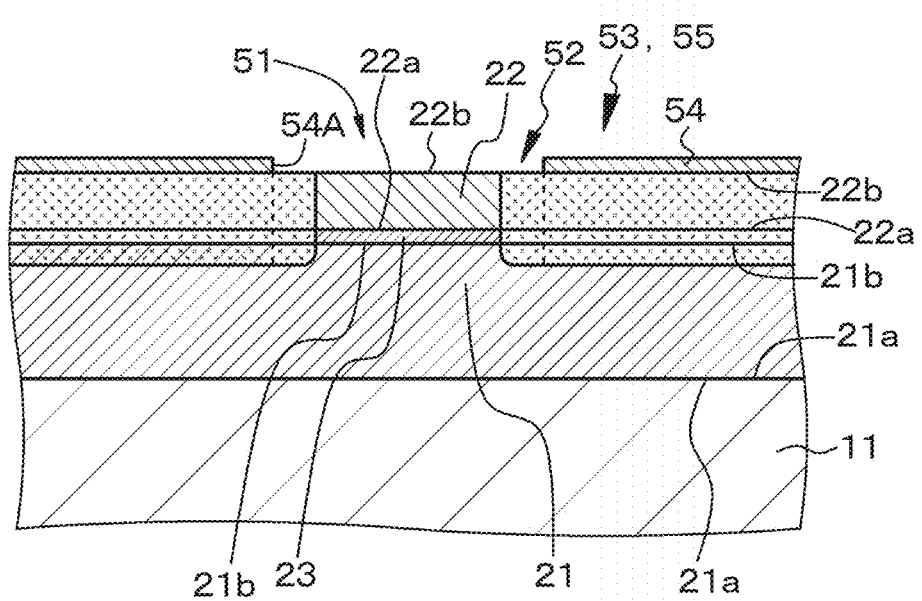
FIGS. 21A and 21B are schematic partial end views of a layered structure and the like for explaining a method for manufacturing the light emitting element of Embodiment 11.

Then, in a step similar to [Step-610] of Embodiment 6, the mode loss action site (mode loss action layer) 54 having the opening 54A and composed of $SiO_2$ is formed on the second surface 22b of the second compound semiconductor layer 22 on the basis of a well-known method (see FIG. 21A).

[Step-1130]

Figure 21B:
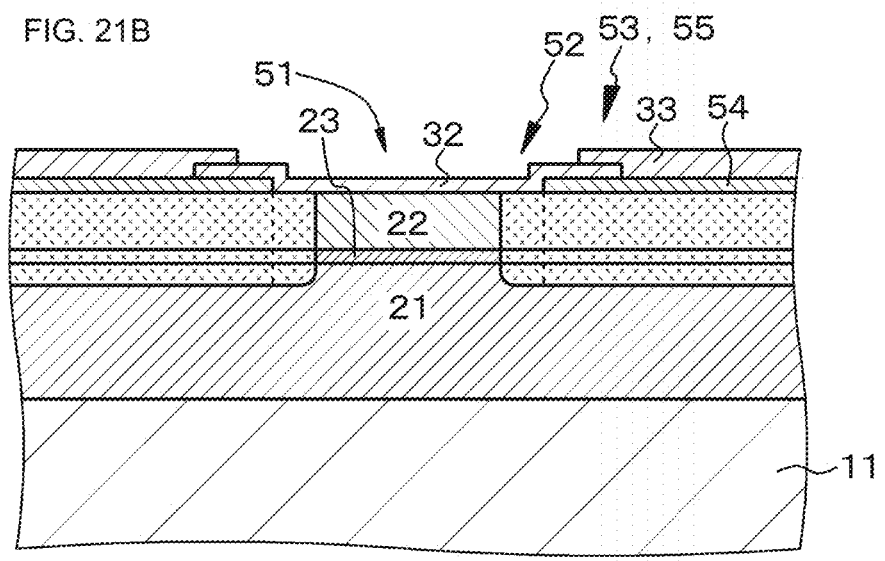

After that, the light emitting element of Embodiment 11 can be obtained by carrying out steps similar to [Step-620] to [Step-660] of Embodiment 6. The structure obtained in the course of a step similar to [Step-620] is shown in FIG. 21B.

In the light emitting element of Embodiment 11, the light emitting structure is formed with the current injection region, the current non-injection inner region surrounding the current injection region, and the current non-injection outer region surrounding the current non-injection inner region, and the orthogonal projection image of the mode loss action region and the orthogonal projection image of the current non-injection outer region overlap with each other. That is, the current injection region and the mode loss action region are partitioned (separated) from each other by the current non-injection inner region. Therefore, as shown in a conceptual diagram of FIG. 22B, a variation (specifically, an increase in Embodiment 11) in an oscillation mode loss can be set to a desired state. Alternatively, the variation in the oscillation mode loss can be set to a desired state by determining, as appropriate, the positional relationship between the current injection region and the mode loss action region, the thickness of the mode loss action site constituting the mode loss action region, and the like. As a result, it is possible to solve problems in the conventional light emitting element, such as an increase in the threshold current and a deterioration in the slope efficiency. For example, the threshold current can be reduced by reducing the oscillation mode loss in the fundamental mode. Moreover, since the region where the oscillation mode loss is caused and the region into which the current is injected and which contributes to light emission can be controlled independently, that is, since control of the oscillation mode loss and control of the light emitting state of the light emitting element can be performed independently, the degree of freedom of control and the degree of freedom in designing the light emitting element can be increased. Specifically, by setting the current injection region, the current non-injection region, and the mode loss action region in the above-mentioned predetermined arrangement relationship, the magnitude relationship of the oscillation mode loss caused by the mode loss action region with respect to the fundamental mode and the higher order mode can be controlled, and the fundamental mode can be further stabilized by relatively increasing the oscillation mode loss caused to the higher order mode with respect to the oscillation mode loss caused to the fundamental mode. Moreover, since the light emitting element of Embodiment 11 has the concave mirror portion 43, generation of diffraction loss can be suppressed more reliably.

Embodiment 12

Embodiment 12 is a modification of Embodiment 11 and relates to a light emitting element having the second-B configuration. As shown in a schematic partial cross-sectional view in FIG. 23, in the light emitting element of Embodiment 12, the current non-injection inner region 52 and the current non-injection outer region 53 are formed by plasma irradiation of the second surface of the second compound semiconductor layer 22, by ashing treatment of the second surface of the second compound semiconductor layer 22, or by reactive ion etching (RIE) treatment of the second surface of the second compound semiconductor layer 22. Since the current non-injection inner region 52 and the current non-injection outer region 53 are thus exposed to plasma particles (specifically, argon, oxygen, nitrogen, and the like), conductivity of the second compound semiconductor layer 22 is deteriorated, and the current non-injection inner region 52 and the current non-injection outer region 53 are brought into a high-resistance state. That is, the current non-injection inner region 52 and the current non-injection outer region 53 are formed by exposure of the second surface 22b of the second compound semiconductor layer 22 to plasma particles. In FIG. 23, FIG. 24, FIG. 25, and FIG. 26, illustration of the first light reflecting layer 41 is omitted.

In Embodiment 12, the shape of the boundary between the current injection region 51 and the current non-injection inner region 52 is circular (diameter: 10 μm), and the shape of the boundary between the current non-injection inner region 52 and the current non-injection outer region 53 is circular (diameter: 15 μm). That is, assuming that the area of the orthogonal projection image of the current injection region 51 is S1 and the area of the orthogonal projection image of the current non-injection inner region 52 is $S_2$, $$0.01 \leq S_1/(S_1+S_2) \leq 0.7$$

is satisfied. Specifically, $$S_1/(S_1+S_2)=10^2/15^2=0.44.$$

In Embodiment 12, the current non-injection inner region 52 and the current non-injection outer region 53 may be formed in the light emitting structure 20 on the basis of plasma irradiation of the second surface of the second compound semiconductor layer 22, ashing treatment of the second surface of the second compound semiconductor layer 22, or reactive ion etching treatment of the second surface of the second compound semiconductor layer 22 instead of [Step-1110] of Embodiment 11.

Except for the above-mentioned points, the configuration and structure of the light emitting element of Embodiment 12 can be the same as the configuration and structure of the light emitting element of Embodiment 11, and thus detailed description thereof is omitted.

In the light emitting element of Embodiment 12 or Embodiment 13 described hereinbelow, the magnitude relationship of the oscillation mode loss that is caused by the mode loss action region to the fundamental mode and the higher order mode can also be controlled by setting the current injection region, the current non-injection region, and the mode loss action region into the abovementioned predetermined arrangement relationship, and by relatively increasing the oscillation mode loss caused to the higher order mode with respect to the oscillation mode loss caused to the fundamental mode, the fundamental mode can be further stabilized.

Embodiment 13

Embodiment 13 is a modification of Embodiment 11 and Embodiment 12 and relates to a light emitting element having the second-C configuration. As shown by a schematic partial cross-sectional view in FIG. 24, in the light emitting element of Embodiment 13, the second light reflecting layer 42 has a region that reflects or dissipates the light from the first light reflecting layer 41 toward the outside of the resonator structure configured of the first light reflecting layer 41 and the second light reflecting layer 42 (that is, toward the mode loss action region 55). Specifically, a portion of the second light reflecting layer 42 located above the side wall (side wall of the opening 54B) of the mode loss action site (mode loss action layer) 54 has a forward-tapered inclined portion 42A, or has a region that is convexly curved toward the first light reflecting layer 41.

In Embodiment 13, the shape of the boundary between the current injection region 51 and the current non-injection inner region 52 was circular (diameter: 8 μm), and the shape of the boundary between the current non-injection inner region 52 and the current non-injection outer region 53 was circular (diameter: 10 μm to 20 μm).

In Embodiment 13, in a step similar to [Step-1120] of Embodiment 11, the opening 54B having the forward-tapered side wall may be formed when forming the mode loss action site (mode loss action layer) 54 having the opening 54B and composed of $SiO_2$. Specifically, a resist layer is formed on the mode loss action layer formed on the second surface 22b of the second compound semiconductor layer 22, and an opening region is provided on the basis of photolithography technique in a portion of the resist layer on which the opening 54B is to be formed. The side wall of this opening region is tapered forward on the basis of a well-known method. Then, by performing etch back, the opening 54B having the forward-tapered side wall can be formed at the mode loss action site (mode loss action layer) 54. Further, the second light reflecting layer 42 can be provided with the forward-tapered inclined portion 42A by forming the second electrode 32, the intermediate layer 70, and the second light reflecting layer 42 on such a mode loss action site (mode loss action layer) 54.

Except for the above-mentioned points, the configuration and structure of the light emitting element of Embodiment 13 can be the same as the configuration and structure of the light emitting elements of Examples 11 to 12, so detailed description thereof will be omitted.

Embodiment 14

Figure 25:
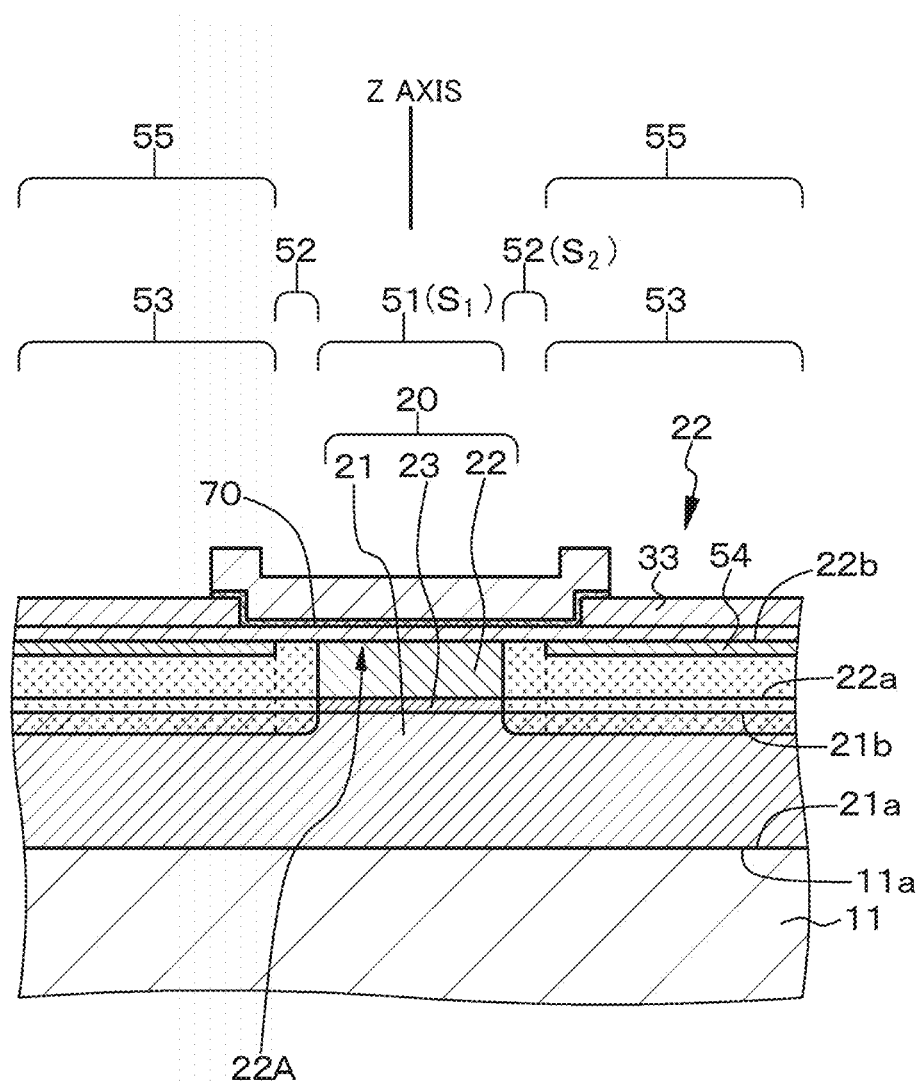
FIG. 25 is a schematic partial end view of a light emitting element of Embodiment 14.
Figure 26:
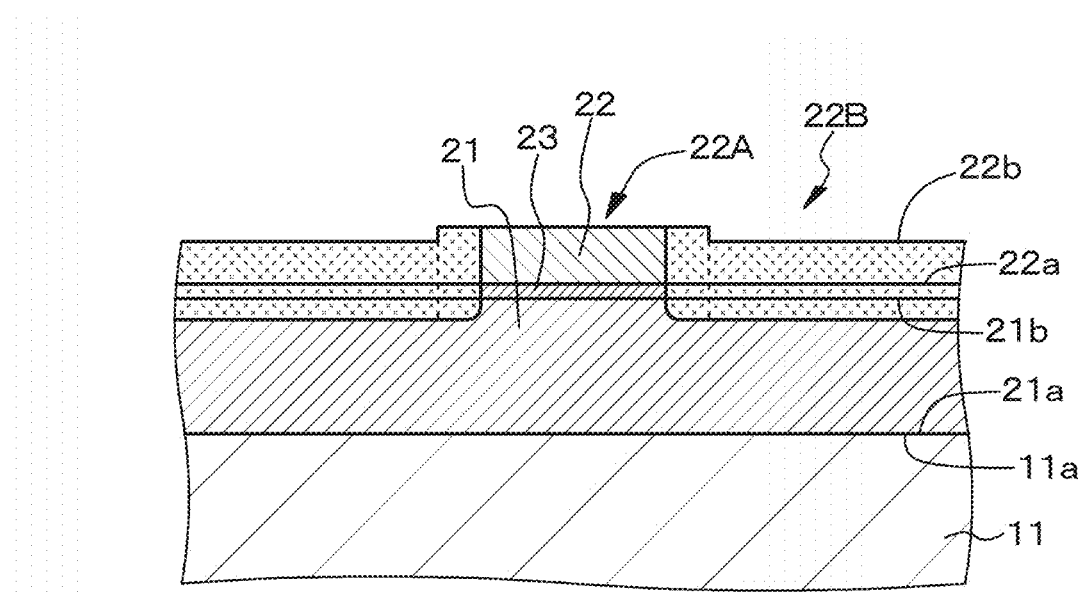
FIG. 26 is a schematic partial cross-sectional view in which the main part of the light emitting element of Embodiment 14 shown in FIG. 25 is cut out.

Embodiment 14 is a modification of Embodiment 11 to Embodiment 13, and relates to a light emitting element having the 2-D configuration. As shown in a schematic partial cross-sectional view of the light emitting element of Embodiment 14 in FIG. 25 and as shown in a schematic partial cross-sectional view obtained by cutting out an essential part in FIG. 26, a projecting portion 22A is formed on the second surface 22b side of the second compound semiconductor layer 22. Then, as shown in FIGS. 25 and 26, the mode loss action site (mode loss action layer) 54 is formed on the region 22B of the second surface 22b of the second compound semiconductor layer 22 surrounding the projecting portion 22A. The projecting portion 22A occupies the current injection region 51, the current injection region 51, and the current non-injection inner region 52. The mode loss action site (mode loss action layer) 54 is composed of, for example, a dielectric material such as $SiO_2$, as in Embodiment 11. The region 22B is provided with the current non-injection outer region 53. Assuming that the optical distance from the active layer 23 in the current injection region 51 to the second surface of the second compound semiconductor layer 22 is $L_2$, and the optical distance from the active layer 23 in the mode loss action region 55 to the top surface (surface that is opposite to the second electrode 32) of the mode loss action site 54 is $L_0$, $L_0 < L_2$ is satisfied. Specifically, $L_2/L_0 = 1.5$.

As a result, a lens effect is generated in the light emitting element.

In the light emitting element of Embodiment 14, the generated laser light having a higher order mode is confined in the current injection region 51 and the current non-injection inner region 52 by the mode loss action region 55, and thus the oscillation mode loss is reduced. That is, the resulting light field intensities in the fundamental mode and the higher order mode increase in the orthogonal projection image of the current injection region 51 and the current non-injection inner region 52 due to the presence of the mode loss action region 55 acting on a variation in the oscillation mode loss.

In Embodiment 14, the shape of the boundary between the current injection region 51 and the current non-injection inner region 52 was circular (diameter: 8 μm), and the shape of the boundary between the current non-injection inner region 52 and the current non-injection outer region 53 was circular (diameter: 30 μm).

In Embodiment 14, the projecting portion 22A may be formed by removing a part of the second compound semiconductor layer 22 from the second surface 22b side between [Step-1110] and [Step-1120] of Embodiment 11.

Except for the above-mentioned points, the configuration and structure of the light emitting element of Embodiment 14 can be the same as the configuration and structure of the light emitting element of Embodiment 11, and thus detailed description thereof will be omitted. In the light emitting element of Embodiment 14, it is possible to suppress the oscillation mode loss caused by the mode loss action region for various modes, and not only oscillate the transverse mode in multiple modes, but also reduce the threshold value of laser oscillation. Further, as shown by the conceptual diagram of FIG. 22C, the resulting light field intensities in the fundamental mode and the higher order mode can be increased in the orthogonal projection images of the current injection region and the current non-injection inner region due to the presence of the mode loss action region acting on a variation (specifically, a decrease in Embodiment 14) in an oscillation mode loss.

Embodiment 15

Embodiment 15 is a modification of Embodiment 11 to Embodiment 14. More specifically, the light emitting element of Embodiment 15 or Embodiment 16 described hereinbelow is composed of a surface-emitting laser element (light emitting element) (vertical cavity laser, VCSEL) that emits laser light from the top surface of the first compound semiconductor layer 21 via the first light reflecting layer 41.

Figure 27:
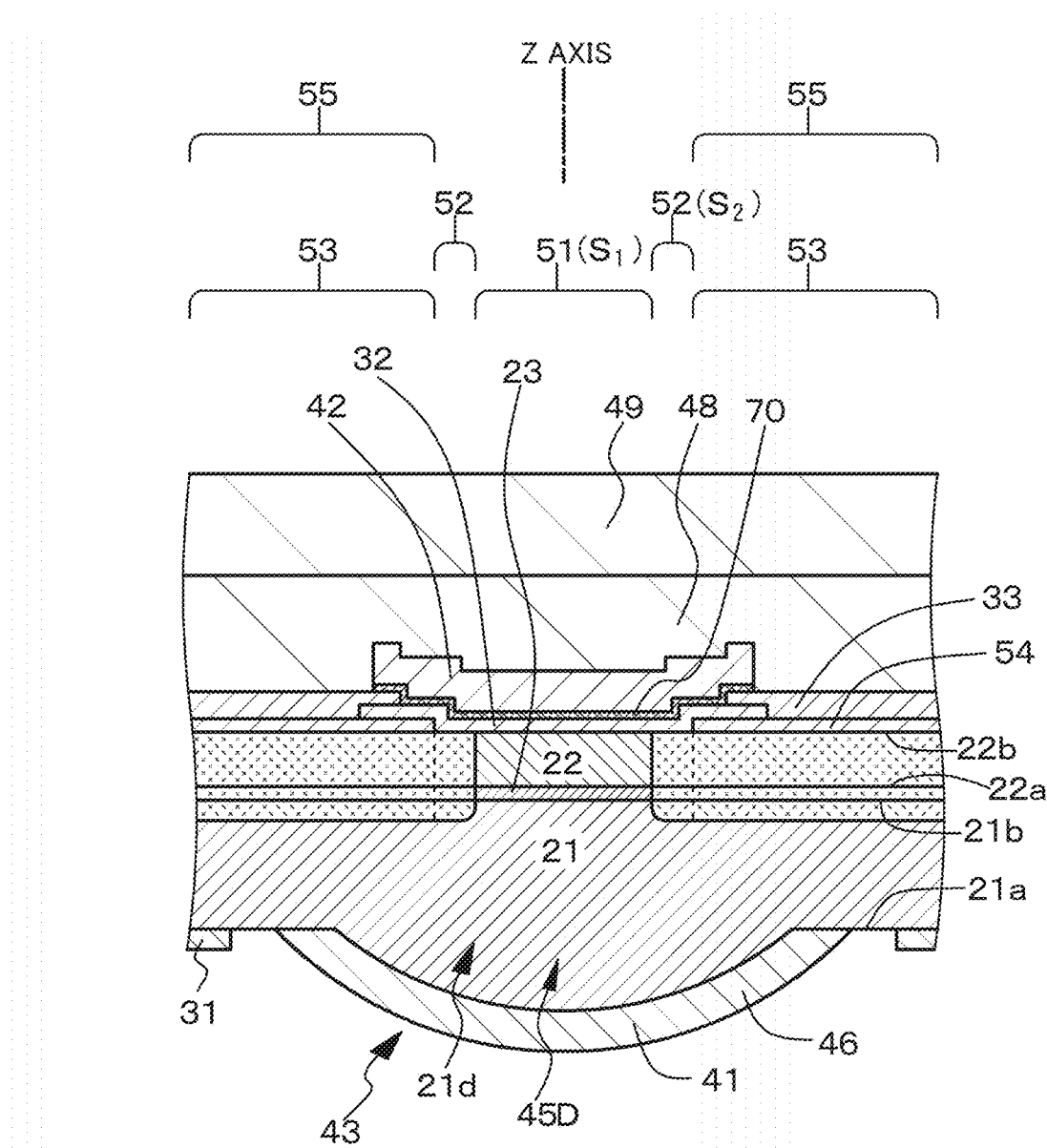
FIG. 27 is a schematic partial end view of a light emitting element of Embodiment 15.

In the light emitting element of Embodiment 15, as shown by a schematic partial cross-sectional view in FIG. 27, the second light reflecting layer 42 is fixed to a support substrate 49 configured of a silicon semiconductor substrate on the basis of a solder bonding method through a bonding layer 48 composed of a gold (Au) layer or a solder layer including tin (Sn). In the manufacture of the light emitting element of Embodiment 15, steps similar to [Step-1100] to [Step-1130] of Embodiment 11 may be carried out, except for the removal of the support substrate 49, that is, without the removal of the support substrate 49.

Also in the light emitting element of Embodiment 15, the magnitude relationship of the oscillation mode loss caused by the mode loss action region with respect to the fundamental mode and the higher order mode can be controlled by setting the current injection region, the current non-injection region, and the mode loss action region in the above-mentioned predetermined arrangement relationship, and the fundamental mode can be further stabilized by relatively increasing the oscillation mode loss caused to the higher order mode with respect to the oscillation mode loss caused to the fundamental mode.

In the example of the light emitting element described above and shown in FIG. 27, an end portion of the first electrode 31 is separated from the first light reflecting layer 41. That is, the first light reflecting layer 41 and the first electrode 31 are separated, that is, offset, from each other, and the separation distance is within 1 mm, specifically, for example, 0.05 mm on average. However, such a structure is not limiting, and the end portion of the first electrode 31 may be in contact with the first light reflecting layer 41, or the end portion of the first electrode 31 may be formed to extend onto the edge portion of the first light reflecting layer 41.

Further, for example, after steps similar to [Step-1100] to [Step-1130] of Embodiment 11 are carried out, the light emitting element manufacturing substrate 11 is removed to expose the first surface 21a of the first compound semiconductor layer 21, and then, the first light reflecting layer 41 and the first electrode 31 may be formed on the first surface 21a of the first compound semiconductor layer 21. Further, in forming the first light reflecting layer 41 on the first surface 21a of the first compound semiconductor layer 21, the first compound semiconductor layer 21 may be etched to form a recess in the first surface 21a of the first compound semiconductor layer 21, and the first light reflecting layer 41 may be formed in the recess. In addition, in this case, where the side wall of the recess is formed into a forward-tapered shape, the light emitting element of the second-C configuration can be obtained. That is, the first light reflecting layer 41 has a region (inclined portion) by which light from the second light reflecting layer 42 is reflected or scattered toward the outside of a resonator structure configured of the first light reflecting layer 41 and the second light reflecting layer 42.

Embodiment 16

Embodiment 16 is a modification of Embodiment 6 to Embodiment 10, but relates to a light emitting element having the third configuration, specifically, a light emitting element having the third-A configuration. More specifically, the light emitting element of Embodiment 16 is a surface-emitting laser element (light emitting element) (vertical cavity laser, VCSEL) that emits laser light from the top surface of the first compound semiconductor layer 21 via the first light reflecting layer 41.

Figure 28:
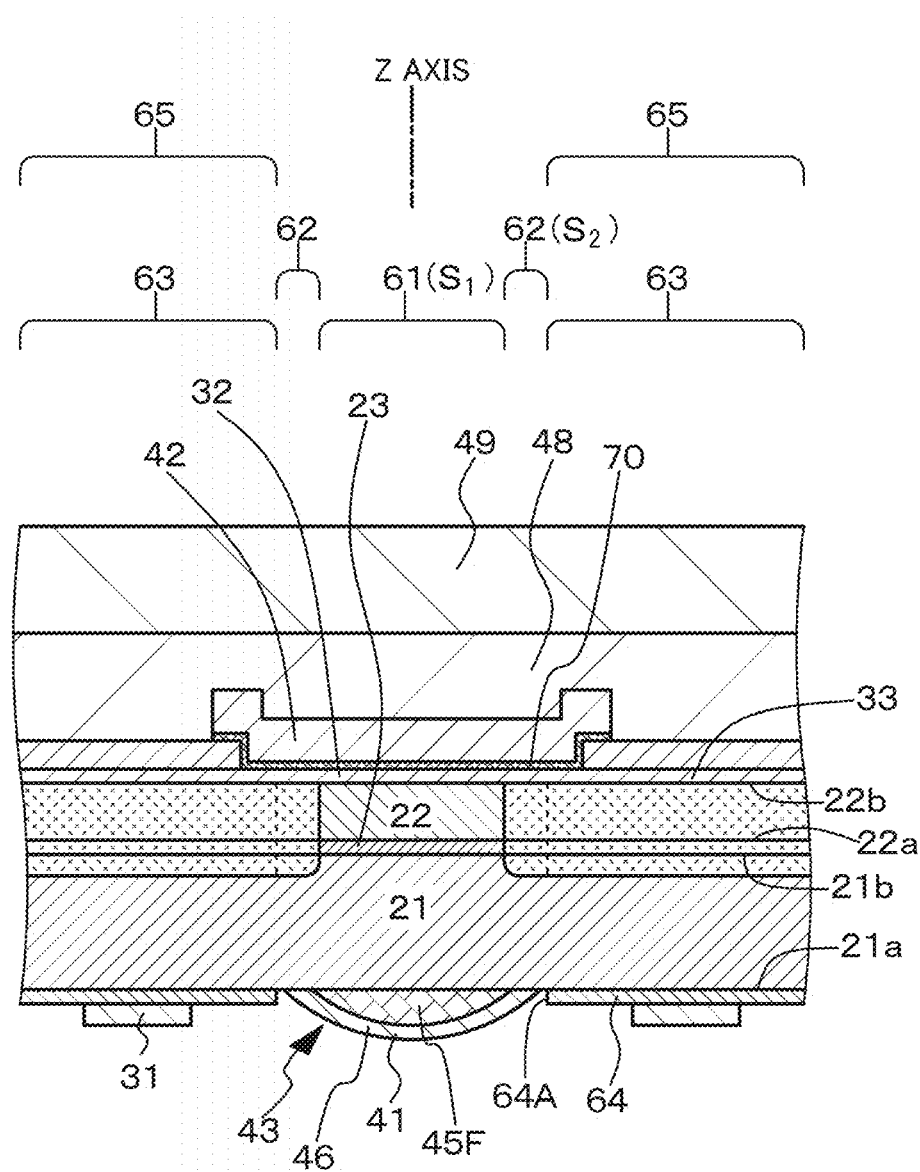
FIG. 28 is a schematic partial end view of a light emitting element of Embodiment 16.

The light emitting element of Embodiment 16 having a schematic partial end view shown in FIG. 28 includes:

(a) the light emitting structure 20 which is formed by layering
the first compound semiconductor layer 21 that is composed of a GaN-based compound semiconductor and has the first surface 21a and the second surface 21b that is opposite to the first surface 21a, the active layer (light emitting layer) 23 that is composed of a GaN-based compound semiconductor and is in contact with the second surface 21b of the first compound semiconductor layer 21, and the second compound semiconductor layers 22 that is composed of a GaN-based compound semiconductor and has the first surface 22a and the second surface 22b that is opposite to the first surface 22a, the first surface 22a being in contact with the active layer 23, (b) the second electrode 32 formed on the second surface 22b of the second compound semiconductor layer 22;

(c) the second light reflecting layer 42 formed on the second electrode 32 with an intermediate layer interposed therebetween;

(d) a mode loss action site 64 that is provided on the first surface 21a of the first compound semiconductor layer 21 and constitutes a mode loss action region 65 acting on a variation in the oscillation mode loss, (e) the first light reflecting layer 41 that is formed to extend from above the first surface 21a side of the first compound semiconductor layer 21 onto the mode loss action site 64, and (f) the first electrode 31 electrically connected to the first compound semiconductor layer 21. In the light emitting element of Embodiment 16, the first electrode 31 is formed on the first surface 21a of the first compound semiconductor layer 21.

The light emitting structure 20 is formed with a current injection region 61, a current non-injection inner region 62 surrounding the current injection region 61, and a current non-injection outer region 63 surrounding the current non-injection inner region 62, and an orthogonal projection image of a mode loss action region 65 and an orthogonal projection image of the current non-injection outer region 63 overlap with each other. Here, the light emitting structure 20 is formed with the current non-injection regions 62 and 63, but in the illustrated example, these regions are formed to extend in the thickness direction from the second compound semiconductor layer 22 onto the first compound semiconductor layer 21. However, the current non-injection regions 62 and 63 may be formed in a region on the second electrode side of the second compound semiconductor layer 22 in the thickness direction, may be formed in the entire second compound semiconductor layer 22, or may be formed in the second compound semiconductor layer 22 and the active layer 23.

The configurations of the light emitting structure 20, the pad electrode 33, the first light reflecting layer 41, the intermediate layer 70, and the second light reflecting layer 42 can be the same as in Embodiment 11, and the configurations of the bonding layer 48 and the support substrate 49 can be the same as in Embodiment 15. A circular opening 64A is formed in the mode loss action site 64, and the first surface 21a of the first compound semiconductor layer 21 is exposed at the bottom of the opening 64A.

The mode loss action site (mode loss action layer) 64 is composed of a dielectric material such as $SiO_2$ and is formed on the first surface 21a of the first compound semiconductor layer 21. The optical thickness $t_0$ of the mode loss action site 64 can be set to a value deviating from an integral multiple of ¼ of the oscillation wavelength $\lambda_0$. Alternatively, the optical thickness $t_0$ of the mode loss action site 64 can be set to an integral multiple of ¼ of the oscillation wavelength $\lambda_0$. That is, the optical thickness $t_0$ of the mode loss action site 64 can be set to a thickness that does not disturb the phase of the light generated in the light emitting element and does not break the standing wave. However, this thickness does not have to be exactly an integral multiple of ¼ in a strict sense, and it is sufficient if $$(\lambda_0/4n_{m\text{-}loss}) \times m - (\lambda_0/8n_{m\text{-}loss}) \leq t_0 \leq (\lambda_0/4n_{m\text{-}loss}) \times 2m + (\lambda_0/8n_{m\text{-}loss})$$

is satisfied. Specifically, the optical thickness $t_0$ of the mode loss action site 64 is preferably about 25 to 250 when the value of ¼ of the oscillation wavelength $\lambda_0$ is "100". By adopting these configurations, it is possible to change the phase difference (control the phase difference) between the laser light passing through the mode loss action site 64 and the laser light passing through the current injection region 61, to control the oscillation mode loss with a higher degree of freedom, and to further increase the design freedom of the light emitting element.

In Embodiment 16 the shape of the boundary between the current injection region 61 and the current non-injection inner region 62 was circular (diameter: 8 μm), and the shape of the boundary between the current non-injection inner region 62 and the current non-injection outer region 63 was circular (diameter: 15 μm). That is, assuming that the area of the orthogonal projection image of the current injection region 61 is $S_1'$ and the area of the orthogonal projection image of the current non-injection inner region 62 is $S_2'$, $$0.01 \leq S_1'/(S_1' + S_2') \leq 0.7 \text{ is satisfied. Specifically,}$$

$$S_1'/(S_1' + S_2') = 8^2/15^2 = 0.28.$$

In the light emitting element of Embodiment 16, assuming that the optical distance from the active layer 23 in the current injection region 61 to the first surface of the first compound semiconductor layer 21 is $L1'$, and the optical distance from the active layer 23 in the mode loss action region 65 to the top surface (the surface that is opposite to the first electrode 31) of the mode loss action site 64 is $L0'$, $$L0' > L1'$$

is satisfied. Specifically, $$L0'/L1' = 1.01$$

The generated laser light having a higher order mode is dissipated toward the outside of the resonator structure composed of the first light reflecting layer 41 and the second light reflecting layer 42 by the mode loss action region 65, whereby the oscillation mode loss is increased. That is, the resulting light field intensities in the fundamental mode and the higher order mode decrease as the distance from the Z axis increases in the orthogonal projection image of the mode loss action region 65 due to the presence of the mode loss action region 65 acting on a variation in the oscillation mode loss (see the conceptual diagram of FIG. 22B), but a decrease in the light field intensity in the higher order mode is larger than a decrease in the light field intensity in the fundamental mode, the fundamental mode can be further stabilized, the threshold current can be reduced and the relative light field intensity in the fundamental mode can be increased.

In the light emitting element of Embodiment 16, the current non-injection inner region 62 and the current non-injection outer region 63 are formed by ion implantation into the light emitting structure 20, as in Embodiment 11. For example, boron was selected as the ion species, but the boron ion is not limiting.

Hereinafter, a method for manufacturing the light emitting element of Embodiment 16 will be described.

[Step-1600]

First, the light emitting structure 20 can be obtained by carrying out a step similar to [Step-1100] of Embodiment 11. Next, the current non-injection inner region 62 and the current non-injection outer region 63 can be formed in the light emitting structure 20 by carrying out a step similar to [Step-1110] of Embodiment 11.

[Step-1610]

Next, the second electrode 32 is formed on the second surface 22b of the second compound semiconductor layer 22 by, for example, a lift-off method, and the pad electrode 33 is further formed on the basis of a well-known method. After that, the intermediate layer 70 and the second light reflecting layer 42 are formed to extend from above the second electrode 32 onto the pad electrode 33 on the basis of a well-known method.

[Step-1620]

After that, the second light reflecting layer 42 is fixed to the support substrate 49 via the bonding layer 48.

[Step-1630]

Next, the light emitting element manufacturing substrate 11 is removed to expose the first surface 21a of the first compound semiconductor layer 21. Specifically, first, the thickness of the light emitting element manufacturing substrate 11 is reduced based on a mechanical polishing method, and then the remaining portion of the light emitting element manufacturing substrate 11 is removed based on a CMP method. In this way, the first surface 21a of the first compound semiconductor layer 21 is exposed.

[Step-1640]

After that, the mode loss action site (mode loss action layer) 64 having an opening 64A and composed of $SiO_2$ is formed on the first surface 21a of the first compound semiconductor layer 21 on the basis of a well-known method.

[Step-1650]

Next, the first light reflecting layer 41 configured of the concave mirror portion 43 composed of a base portion 45F and the multilayer light reflecting film 46 is formed on the first surface 21a of the first compound semiconductor layer 21 exposed at the bottom of the opening 64A of the mode loss action site 64, and then the first electrode 31 is formed. In this way, the light emitting element of Embodiment 16 having the structure shown in FIG. 28 can be obtained.

[Step-1660]

After that, the light emitting element is separated by performing so-called element separation, and the side surface or the exposed surface of the layered structure or the light emitting structure is covered with, for example, an insulating film composed of $SiO_2$. Then, the light emitting element of Embodiment 16 is completed by packaging and sealing.

In the light emitting element of Embodiment 16, the light emitting structure is also formed with the current injection region, the current non-injection inner region surrounding the current injection region, and the current non-injection outer region surrounding the current non-injection inner region, and the orthogonal projection image of the mode loss action region and the orthogonal projection image of the current non-injection outer region also overlap with each other. Therefore, as shown in a conceptual diagram of in FIG. 22B, a variation (specifically, an increase in Embodiment 16) in an oscillation mode loss can be set to a desired state. Moreover, since control of the oscillation mode loss and control of the light emitting state of the light emitting element can be performed independently, the degree of freedom of control and the degree of freedom in designing the light emitting element can be increased. Specifically, by setting the current injection region, the current non-injection region, and the mode loss action region in the above-mentioned predetermined arrangement relationship, the magnitude relationship of the oscillation mode loss caused by the mode loss action region with respect to the fundamental mode and the higher order mode can be controlled, and the fundamental mode can be further stabilized by relatively increasing the oscillation mode loss caused to the higher order mode with respect to the oscillation mode loss caused to the fundamental mode. It is also possible to reduce the influence of the reverse lens effect. Moreover, since the light emitting element of Embodiment 16 has the concave mirror portion 43, generation of diffraction loss can be suppressed more reliably.

Also in Embodiment 16, similarly to Embodiment 12, the current non-injection inner region 62 and the current non-injection outer region 63 can be formed by plasma irradiation of the second surface of the second compound semiconductor layer 22, by ashing treatment of the second surface of the second compound semiconductor layer 22, or by reactive ion etching (RIE) treatment of the second surface of the second compound semiconductor layer 22 (light emitting element having the third-B configuration). Since the current non-injection inner region 62 and the current non-injection outer region 63 are thus exposed to plasma particles, conductivity of the second compound semiconductor layer 22 is deteriorated, and the current non-injection inner region 62 and the current non-injection outer region 63 are brought into a high-resistance state. That is, the current non-injection inner region 62 and the current non-injection outer region 63 are formed by exposure of the second surface 22b of the second compound semiconductor layer 22 to plasma particles.

Further, similarly to Embodiment 13, a configuration can be used in which the second light reflecting layer 42 has a region that reflects or scatters the light from the first light reflecting layer 41 toward the outside (that is, toward the mode loss action region 65) of the resonator structure configured of the first light reflecting layer 41 and the second light reflecting layer 42 (light emitting element having the third-C configuration). Alternatively, similarly to Embodiment 15, in forming the first light reflecting layer 41 on the first surface 21a of the first compound semiconductor layer 21, a recessed portion is formed on the first surface 21a of the first compound semiconductor layer 21 by etching the first compound semiconductor layer 21 and the first light reflecting layer 41 is formed in the recessed portion, but the side wall of the recessed portion may be tapered forward.

Further, similarly to Embodiment 14, a projecting portion may be formed on the first surface 21a side of the first compound semiconductor layer 21, and the mode loss action site (mode loss action layer) 64 may be formed on a region of the first surface 21a of the first compound semiconductor layer 21 surrounding the projecting portion (light emitting element having the third-D configuration). The mode loss action site (mode loss action layer) 64 may be formed on a region of the first surface 21a of the first compound semiconductor layer 21 surrounding the projecting portion. The projecting portion occupies the current injection region 61, the current injection region 61, and the current non-injection inner region 62. As a result, the generated laser light having the higher order mode is confined in the current injection region 61 and the current non-injection inner region 62 by the mode loss action region 65, and thus the oscillation mode loss is reduced. That is, the resulting light field intensities in the fundamental mode and the higher order mode increase in the orthogonal projection image of the current injection region 61 and the current non-injection inner region 62 due to the presence of the mode loss action region 65 acting on a variation in the oscillation mode loss. In the modification example of the light emitting element of Embodiment 16 having such a configuration, it is also possible to suppress the oscillation mode loss caused by the mode loss action region 65 for various modes, and not only oscillate the transverse mode in multiple modes, but also reduce the threshold value of laser oscillation. Further, as shown by the conceptual diagram of FIG. 22C, the resulting light field intensities in the fundamental mode and the higher order mode can be increased in the orthogonal projection images of the current injection region and the current non-injection inner region due to the presence of the mode loss action region 65 acting on a variation (specifically, a decrease in the modification example of the light emitting element of Embodiment 16) in an oscillation mode loss.

In some cases, a projecting portion (mesa structure) may be formed on the first surface 21a side of the first compound semiconductor layer 21, and the region of the first compound semiconductor layer 21 surrounding the projecting portion may be used as a mode loss action region (mode loss action site). That is, in such cases, the formation of the mode loss action layer may be omitted, and the mode loss action site may be configured of the region of the first compound semiconductor layer surrounding the projecting portion. The first light reflecting layer 41 may be formed on the top surface of the projecting portion. The projecting portion occupies the current injection region 61, the current injection region 61, and the current non-injection inner region 62. This is also why the generated laser light having the higher order mode is confined in the current injection region 61 and the current non-injection inner region 62 by the mode loss action region, and thus the oscillation mode loss is reduced. That is, the resulting light field intensities in the fundamental mode and the higher order mode increase in the orthogonal projection image of the current injection region 61 and the current non-injection inner region 62 due to the presence of the mode loss action region acting on a variation in the oscillation mode loss. In the modification example of the light emitting element of Embodiment 16 having such a configuration, it is also possible to suppress the oscillation mode loss caused by the mode loss action region for various modes, and not only oscillate the transverse mode in multiple modes, but also reduce the threshold value of laser oscillation. Further, as shown by the conceptual diagram of FIG. 22C, the resulting light field intensities in the fundamental mode and the higher order mode can be increased in the orthogonal projection images of the current injection region and the current non-injection inner region due to the presence of the mode loss action region acting on a variation (specifically, a decrease in the modification example of the light emitting element of Embodiment 16) in an oscillation mode loss.

While the present disclosure has been described based on preferred examples, the present disclosure is not to be limited to these examples. The configurations and structures of the light emitting elements described in the examples are merely illustrative and can be modified, as appropriate, and methods for manufacturing the light emitting elements can also be modified, as appropriate. In some cases, a surface-emitting laser element in which light is emitted from the top surface of the second compound semiconductor layer via the second light reflecting layer can be realized by suitably selecting the bonding layer and the support substrate. By removing the support substrate after forming the first light reflecting layer and the first electrode, a surface-emitting laser element in which light is emitted from the top surface of the second compound semiconductor layer via the second light reflecting layer can also be completed. Alternatively, by fixing the first light reflecting layer to a second support substrate and then removing the support substrate to expose the second light reflecting layer, a surface-emitting laser element in which light is emitted from the top surface of the second compound semiconductor layer via the second light reflecting layer can also be completed.

The present disclosure can also take the following configurations.

[A01]
<Light Emitting Element>
A light emitting element including:
a layered structure configured by layering
a first light reflecting layer configured by layering a plurality of thin films,
a light emitting structure, and
a second light reflecting layer configured by layering a plurality of thin films, wherein
the light emitting structure is configured by layering, from the first light reflecting layer side,
a first compound semiconductor layer,
an active layer, and
a second compound semiconductor layer,
an electrode and an intermediate layer are formed between the second compound semiconductor layer and the second light reflecting layer from the second compound semiconductor layer side, and
assuming that the surface of the intermediate layer facing the electrode is a first surface and the surface of the intermediate layer in contact with the second light reflecting layer is a second surface, the value of a surface roughness of the second surface is less than the value of a surface roughness of the first surface.

[A02]
The light emitting element according to [A01], wherein the value of the root mean square roughness Rq of the first surface of the intermediate layer in a region within a radius of 20 μm from a light emitting center is 1.0 nm.

[A03]
The light emitting element according to [A01], wherein the value of the root mean square roughness Rq of the first surface of the intermediate layer in a region where a light emission intensity is (1/e) or more of a maximum light emitting intensity is 1.0 nm or less.

[A04]
The light emitting element according to any one of [A01] to [A03], wherein the value of the root mean square roughness Rq of the first surface of the intermediate layer in a region within a radius of 1 μm from a light emitting center is 2.0 nm or less.

[A05]
The light emitting element according to any one of [A01] to [A04], wherein the optical thickness of the intermediate layer is larger than the optical thickness of the first layer of the second light reflecting layer in contact with the intermediate layer.

[A06]
The light emitting element according to [A05], wherein assuming that the refractive index of the material constituting the intermediate layer is $n_M$, the refractive index of the material constituting the first layer of the second light reflecting layer in contact with the intermediate layer is $n_1$, and the wavelength of the main light emitted from the light emitting element is $\lambda_0$, the intermediate layer has a thickness exceeding ($\lambda_0/4\ n_M$), and the first layer of the second light reflecting layer in contact with the intermediate layer has a thickness of ($\lambda_0/4n_1$).

[A07]

The light emitting element according to [A06], wherein the intermediate layer has a thickness of ($\lambda_0/2\ n_M$) or more.

[A08]

The light emitting element according to [A05], wherein the optical thickness of the intermediate layer is more than twice the optical thickness of the first layer of the second light reflecting layer in contact with the intermediate layer.

[A09]

The light emitting element according to any one of [A01] to [A08], wherein assuming that the refractive index of the material constituting the electrode is $n_0$ and the refractive index of the material constituting the intermediate layer is $n_M$, $$0.8 < n_0/n_M < 1.2$$

is satisfied.

[A10]

The light emitting element according to [A09], wherein $$0.95 < n_0/n_M < 1.05$$

is satisfied.

[A11]

The light emitting element according to any one of [A01] to [A08], wherein assuming that the refractive index of the material constituting the electrode is no and the refractive index of the material constituting the intermediate layer is $n_M$, $$|n_0 - n_M| \leq 0.1$$

is satisfied.

[A12]

The light emitting element according to any one of [A01] to [A11], wherein the material constituting the intermediate layer and the material constituting the first layer of the second light reflecting layer in contact with the intermediate layer are different, and the material constituting the intermediate layer and the material constituting the second layer of the second light reflecting layer in contact with the first layer are the same.

[A13]

The light emitting element according to any one of [A01] to [A11], wherein the material constituting the intermediate layer and the material constituting the first layer of the second light reflecting layer in contact with the intermediate layer are different, the material constituting the intermediate layer and the material constituting the second layer of the second light reflecting layer in contact with the first layer are different, and the material constituting the first layer of the second light reflecting layer and the material constituting the second layer of the second light reflecting layer are different.

[A14]

The light emitting element according to any one of [A01] to [A13], wherein the active layer is located in the vicinity of the maximum amplitude portion of the light field intensity distribution of the light emitted from the light emitting element, and the intermediate layer is located in the vicinity of the minimum amplitude portion of the light field intensity distribution.

[A15]

The light emitting element according to any one of [A01] to [A14], wherein the first compound semiconductor layer is formed on a substrate having a plurality of parallel grooves (vertical streaks) on the surface.

[A16]

The light emitting element according to [A15], wherein the substrate is configured of a GaN substrate having a {20-21} plane as a main surface.

[B01]

The light emitting element according to any one of [A01] to [A16], wherein the first light reflecting layer has a concave mirror portion, and the second light reflecting layer has a flat shape.

[B02]

The light emitting element according to [B01], wherein assuming that the cavity length is $L_{OR}$, $$1 \times 10^{-5} m \leq L_{OR}$$

is satisfied.

[B03]

The light emitting element according to [B01] or [B02], wherein the figure drawn by an interface of a part of the concave mirror portion of the first light reflecting layer facing the light emitting structure when the first light reflecting layer is cut in a virtual plane including the layering direction of the layered structure is a part of a circle or a part of a parabola.

[C01]

<Light Emitting Element Having First Configuration>

The light emitting element according to any one of [B01] to [B03], wherein a current injection region and a current non-injection region surrounding the current injection region are provided in the second compound semiconductor layer, and the shortest distance $D_{CI}$ from the area center of gravity of the current injection region to the boundary between the current injection region and the current non-injection region satisfies the following formula.

$$D_{CI} \geq \omega_0/2$$

where $$\omega_0^2 \equiv (\lambda_0/\pi)\{L_{OR}(R_{DBR}-L_{OR})\}^{1/2}$$

here $\lambda_0$: oscillation wavelength $L_{OR}$: cavity length $R_{DBR}$: radius of curvature of the concave mirror portion of the first light reflecting layer.

[C02]

The light emitting element according to [C01], further including a mode loss action site that is provided on the second surface of the second compound semiconductor layer and constitutes a mode loss action region acting on a variation in an oscillation mode loss, a second electrode formed to extend from above the second surface of the second compound semiconductor layer onto the mode loss action site, and a first electrode electrically connected to the first compound semiconductor layer, wherein the second light reflecting layer is formed on the second electrode with an intermediate layer interposed therebetween, the light emitting structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other.

[C03]

The light emitting element according to [C01] or [C02], wherein the radius $r'_{DBR}$ of the effective region in the concave mirror portion of the first light reflecting layer satisfies $$\omega_0 \le r'_{DBR} \le 20 \cdot \omega_0.$$

[C04]

The light emitting element according to any one of [C01] to [C03], wherein $D_{CI} \ge \omega_0$ is satisfied.

[C05]

The light emitting element according to any one of [C01] to [C04], wherein $R_{DBR} \le 1 \times 10^{-3}$ m is satisfied.

[D01]

<Light Emitting Element Having Second Configuration>

A light emitting element according to any one of [A01] to [B03], further including a mode loss action site that is provided on the second surface of the second compound semiconductor layer and constitutes a mode loss action region acting on a variation in an oscillation mode loss, a second electrode formed to extend from above the second surface of the second compound semiconductor layer onto the mode loss action site, and a first electrode electrically connected to the first compound semiconductor layer, wherein the second light reflecting layer is formed on the second electrode with an intermediate layer interposed therebetween, the light emitting structure is formed with a current injection region, a current non-injection inner region surrounding the current injection region, and a current non-injection outer region surrounding the current non-injection inner region, and an orthogonal projection image of the mode loss action region and the orthogonal projection image of the current non-injection outer region overlap with each other.

[D02]

The light emitting element according to [D01], wherein the current non-injection outer region is located below the mode loss action region.

[D03]

The light emitting element according to [D01] or [D02], wherein assuming that the area of the orthogonal projection image of the current injection region is $S_1$ and the area of the orthogonal projection image of the current non-injection inner region is $S_2$, $$0.01 \le S_1/(S_1+S_2) \le 0.7$$

is satisfied.

[D04]

The light emitting element according to any one of [D01] to [D03], wherein the current non-injection inner region and the current non-injection outer region are formed by ion implantation into the light emitting structure.

[D05]

The light emitting element according to [D04], wherein the ion species is at least one kind of ion selected from the group consisting of boron, proton, phosphorus, arsenic, carbon, nitrogen, fluorine, oxygen, germanium and silicon.

[D06]

<Light Emitting Element Having Second-B Configuration>

The light emitting element according to any one of [D01] to [D05], wherein the current non-injection inner region and the current non-injection outer region are formed by plasma irradiation of the second surface of the second compound semiconductor layer, by ashing treatment of the second surface of the second compound semiconductor layer, or by reactive ion etching treatment of the second surface of the second compound semiconductor layer.

[D07]

<Light Emitting Element Having Second-C Configuration>

The light emitting element according to any one of [D01] to [D06], wherein the second light reflecting layer has a region that reflects or scatters the light from the first light reflecting layer toward the outside of the resonator structure configured of the first light reflecting layer and the second light reflecting layer.

[D08]

The light emitting element according to any one of [D04] to [D07], wherein assuming that the optical distance from the active layer in the current injection region to the second surface of the second compound semiconductor layer is $L_2$ and the optical distance from the active layer in the mode loss action region to the top surface of the mode loss action site is $L_0$, $$L_0 > L_2$$

is satisfied.

[D09]

The light emitting element according to any one of [D04] to [D08], wherein the generated light having a higher order mode is scattered toward the outside of the resonator structure configured of the first light reflecting layer and the second light reflecting layer by the mode loss action region, and thus the oscillation mode loss increases.

[D10]

The light emitting element according to any one of [D04] to [D09], wherein the mode loss action site is composed of a dielectric material, a metal material, or an alloy material.

[D11]

The light emitting element according to [D10], wherein the mode loss action site is composed of a dielectric material, and the optical thickness of the mode loss action site is a value deviating from an integral multiple of ¼ of the wavelength of light generated in the light emitting element.

[D12]

The light emitting element according to [D10], wherein the mode loss action site is composed of a dielectric material, and the optical thickness of the mode loss action site is an integral multiple of ¼ of the wavelength of light generated in the light emitting element.

[D13]

<Light Emitting Element Having Second-D Configuration>

The light emitting element according to any one of [D01] to [D03], wherein a projecting portion is formed on the second surface side of the second compound semiconductor layer, and the mode loss action site is formed on a region of the second surface of the second compound semiconductor layer surrounding the projecting portion.

[D14]

The light emitting element according to [D13], wherein assuming that the optical distance from the active layer in the current injection region to the second surface of the second compound semiconductor layer is $L_2$ and the optical distance from the active layer in the mode loss action region to the top surface of the mode loss action site is $L_0$, $$L_0 < L_2$$

is satisfied.

[D15]

The light emitting element according to [D13] or [D14], wherein the generated light having a higher order mode is confined in the current injection region and the current non-injection inner region by the mode loss action region, and thus the oscillation mode loss is reduced.

[D16]

The light emitting element according to any one of [D13] to [D15], wherein the mode loss action site is composed of a dielectric material, a metal material, or an alloy material.

[D17]

The light emitting element according to any one of [D01] to [D16], wherein the second electrode is composed of a transparent conductive material.

[E01]
<Light Emitting Element Having Third Configuration>

The light emitting element according to any one of [A01] to [B03], further including a second electrode formed on the second surface of the second compound semiconductor layer,
- a second light reflecting layer formed on the second electrode with an intermediate layer interposed therebetween,
- a mode loss action site provided on the first surface of the first compound semiconductor layer and constituting a mode loss action region acting on a variation in an oscillation mode loss, and
- a first electrode electrically connected to the first compound semiconductor layer, wherein
- the first light reflecting layer is formed to extend from above the first surface of the first compound semiconductor layer onto the mode loss action site, the light emitting structure is formed with a current injection region, a current non-injection inner region surrounding the current injection region, and a current non-injection outer region surrounding the current non-injection inner region, and the orthogonal projection image of the mode loss action region and the orthogonal projection image of the current non-injection outer region overlap with each other.

[E02]

The light emitting element according to [E01], wherein assuming that the area of the projected image in the current injection region is $S_1$ and the area of the projected image in the current non-injection inner region is $S_2$, $$0.01 \leq S_1'/(S_1'+S_2') \leq 0.7$$

is satisfied.

[E03]
<Light Emitting Device Having Third-A Configuration>

The light emitting element according to [E01] or [E02], wherein the current non-injection inner region and the current non-injection outer region are formed by ion implantation into the light emitting structure.

[E04]

The light emitting element according to [E03], wherein the ion species is at least one kind of ion selected from the group consisting of boron, proton, phosphorus, arsenic, carbon, nitrogen, fluorine, oxygen, germanium, and silicon.

[E05]
<Light Emitting Device Having Third-B Configuration>

The light emitting element according to [E01] or [E04], wherein the current non-injection inner region and the current non-injection outer region are formed by plasma irradiation of the second surface of the second compound semiconductor layer, by ashing treatment of the second surface of the second compound semiconductor layer, or by reactive ion etching treatment of the second surface of the second compound semiconductor layer.

[E06]
<Light Emitting Element Having Third-C Configuration>

The light emitting element according to any one of [E01] to [E05], wherein the second light reflecting layer has a region that reflects or scatters the light from the first light reflecting layer toward the outside of the resonator structure configured of the first light reflecting layer and the second light reflecting layer.

[E07]

The light emitting element according to any one of [E03] to [E06], wherein assuming that the optical distance from the active layer in the current injection region to the first surface of the first compound semiconductor layer is $L_1'$ and the optical distance from the active layer in the mode loss action region to the top surface of the mode loss action site is $L_0'$, $$L_0' > L_1'$$

is satisfied.

[E08]

The light emitting element according to any one of [E03] to [E07], wherein the generated light having a higher order mode is scattered toward the outside of the resonator structure configured of the first light reflecting layer and the second light reflecting layer by the mode loss action region, and thus the oscillation mode loss increases.

[E09]

The light emitting element according to any one of [E03] to [E08], wherein the mode loss action site is composed of a dielectric material, a metal material, or an alloy material.

[E10]

The light emitting element according to [E09], wherein the mode loss action site is composed of a dielectric material, and the optical thickness of the mode loss action site is a value deviating from an integral multiple of ¼ of the wavelength of light generated in the light emitting element.

[E11]

The light emitting element according to [E09], wherein
- the mode loss action site is composed of a dielectric material, and
- the optical thickness of the mode loss action site is an integral multiple of ¼ of the wavelength of light generated in the light emitting element.

[E12]
<Light Emitting Element Having Third-D Configuration>

The light emitting element according to any one of [E01] or [E02], wherein
- a projecting portion is formed on the first surface side of the first compound semiconductor layer, and
- the mode loss action site is formed on a region of the first surface of the first compound semiconductor layer surrounding the projecting portion.

[E13]
  The light emitting element according to [E12], wherein assuming that the optical distance from the active layer in the current injection region to the first surface of the first compound semiconductor layer is $L_1'$ and the optical distance from the active layer in the mode loss action region to the top surface of the mode loss action site is $L_0'$, $$L_0' < L_1'$$

is satisfied.

[E14]
  The light emitting element according to any one of [E01] or [E02], wherein
  a projecting portion is formed on the first surface side of the first compound semiconductor layer, and
  the mode loss action site is configured of a region of the first surface of the first compound semiconductor layer surrounding the projecting portion.

[E15]
  The light emitting element according to any one of [E12] to [E14], wherein the generated light having a higher order mode is confined in the current injection region and the current non-injection inner region by the mode loss action region, and thus the oscillation mode loss is reduced.

[E16]
  The light emitting element according to any one of [E12] to [E15], wherein the mode loss action site is composed of a dielectric material, a metal material, or an alloy material.

[E17]
  The light emitting element according to any one of [E01] to [E16], wherein the second electrode is composed of a transparent conductive material.

[F01]
  The light emitting element according to any one of [B01] to [E08], wherein a compound semiconductor substrate is arranged between the first surface of the first compound semiconductor layer and the first light reflecting layer.

[F02]
  The light emitting element according to [F01], wherein the compound semiconductor substrate is composed of a GaN substrate.

[F03]
  The light emitting element according to [F01] or [F02], wherein
  the concave mirror portion of the first light reflecting layer is configured of a base portion composed of a protruding portion of the compound semiconductor substrate and a multilayer light reflecting film formed on the surface of at least a part of the base portion.

[F04]
  The light emitting element according to [F01] or [F02], wherein
  the concave mirror portion of the first light reflecting layer is configured of a base portion formed on the compound semiconductor substrate and a multilayer light reflecting film formed on the surface of at least a part of the base portion.

[F05]
  The light emitting element according to any one of [B01] to [E08], wherein the first light reflecting layer is formed on the first surface of the first compound semiconductor layer.

[F06]
  The light emitting element according to any one of [B01] to [F05], wherein the value of the thermal conductivity of the light emitting structure is higher than the value of the thermal conductivity of the first light reflecting layer.

[F07]
  The light emitting element according to any one of [B01] to [F06], wherein assuming that the radius of curvature of the concave mirror portion of the light emitting element is $R_{DBR}$, $$R_{DBR} \leq 1 \times 10^{-3} m$$

is satisfied.

[F08]
  The light emitting element according to any one of [B01] to [F07], wherein a convex shape portion is formed around the first light reflecting layer, and the first light reflecting layer does not protrude from the convex shape portion.

[G01]
  <Method for Manufacturing Light Emitting Element>
  A method for manufacturing a light emitting element, including the steps of:
    forming a light emitting structure composed of a GaN-based compound semiconductor in which
      a first compound semiconductor layer having a first surface and a second surface that is opposite to the first surface,
      an active layer facing the second surface of the first compound semiconductor layer, and
      a second compound semiconductor layer having a first surface facing the active layer and a second surface that is opposite to the first surface
    are layered
    on a compound semiconductor substrate, then
    forming a second electrode, an intermediate layer, and a second light reflecting layer on the second compound semiconductor layer, next
    fixing the second light reflecting layer to a support substrate, then
    reducing the thickness of the compound semiconductor substrate, then
    forming a base portion composed of a protruding portion at an exposed surface of the compound semiconductor substrate, or forming a base portion composed of a protruding portion on an exposed surface of the compound semiconductor substrate, and then
    forming a first light reflecting layer on at least a part of the base portion, and
    forming a first electrode electrically connected to the first compound semiconductor layer, wherein
    the base portion constitutes a concave mirror portion, and
    the second light reflecting layer has a flat shape.

REFERENCE SIGNS LIST

11 Compound semiconductor substrate (light emitting element manufacturing substrate, GaN substrate)
11a First surface of compound semiconductor substrate (light emitting element manufacturing substrate) facing first compound semiconductor layer
11a' Protruding portion on first surface of compound semiconductor substrate
11a" Recess
11b Second surface of compound semiconductor substrate (light emitting element manufacturing substrate) facing first compound semiconductor layer
11A Convex shape portion
12 Groove (vertical streak)
20 Light emitting structure
21 First compound semiconductor layer
21a First surface of first compound semiconductor layer 21b Second surface of first compound semiconductor layer
21d, 21e Protruding portion of first surface of first compound semiconductor layer
22 Second compound semiconductor layer
22a First surface of second compound semiconductor layer
22b Second surface of second compound semiconductor layer
23 Active layer (light emitting layer)
24 Current constriction layer (insulating layer)
25 Opening provided in current constriction layer (insulating layer)
26 Dielectric layer
31 First electrode
32 Second electrode
33 Pad electrode
41 First light reflecting layer
41A Inclined portion formed in first compound semiconductor layer
42 Second light reflecting layer
42A Forward-tapered inclined portion formed in second light reflecting layer
43 Concave mirror portion
43A Concave portion
43a Interface of effective region of concave mirror portion of first light reflecting layer facing light emitting structure
44 Effective region of concave mirror portion of first light reflecting layer
45A, 45B, 45D, 45E, 45F Base portion
45c Protruding portion
46 Multilayer light reflecting film
47 Planarizing film
48 Bonding layer
49 Support substrate
51, 61 Current injection region
52, 62 Current non-injection inner region
53,63 Current non-injection outer region
54, 64 Mode loss action site (mode loss action layer)
54A, 54B, 64A Opening formed at the mode loss action site
55, 65 Mode loss action region
70 Intermediate layer (planarizing layer)
71 First surface of intermediate layer
72 Second surface of intermediate layer

The invention claimed is:

1. A light emitting element, comprising:
a layered structure that includes:
  a first light reflecting layer that includes a first plurality of thin films;
  a light emitting structure; and
  a second light reflecting layer that includes a second plurality of thin films, wherein
    the light emitting structure is between the first light reflecting layer and the second light reflecting layer, and
    the light emitting structure includes:
      a first compound semiconductor layer on the first light reflecting layer;
      an active layer on the first compound semiconductor layer; and
      a second compound semiconductor layer on the active layer;
an intermediate layer between the second compound semiconductor layer and the second light reflecting layer; and
an electrode between the intermediate layer and the second compound semiconductor layer, wherein
  a first surface of the intermediate layer faces the electrode,
  a second surface of the intermediate layer is in contact with the second light reflecting layer, and
  a value of a surface roughness of the second surface of the intermediate layer is less than a value of a surface roughness of the first surface of the intermediate layer.

2. The light emitting element according to claim 1, wherein
a value of a root mean square roughness Rq of a region of the first surface of the intermediate layer is 1.0 nm or less, and
the region is within a radius of 20 μm from a light emitting center of the light emitting element.

3. The light emitting element according to claim 1, wherein
a value of a root mean square roughness Rq of a region of the first surface of the intermediate layer is 1.0 nm or less, and
in the region, a light emission intensity is (1/e) or more of a maximum light emitting intensity.

4. The light emitting element according to claim 1, wherein
a value of a root mean square roughness Rq of a region of the first surface of the intermediate layer is 2.0 nm or less, and
the region is within a radius of 1 μm from a light emitting center of the light emitting element.

5. The light emitting element according to claim 1, wherein
an optical thickness of the intermediate layer is larger than an optical thickness of a first thin film of the second plurality of thin films of the second light reflecting layer, and
the first thin film of the second light reflecting layer is in contact with the intermediate layer.

6. The light emitting element according to claim 5, wherein
the intermediate layer has a thickness exceeding $(\lambda_0/4 n_M)$, and
the first thin film of the second light reflecting layer has a thickness of $(\lambda_0/4n_1)$,
where
  $n_M$ is a refractive index of a material of the intermediate layer,
  $n_1$ is a refractive index of a material of the first thin film of the second light reflecting layer, and
  $\lambda_0$ is a wavelength of main light emitted from the light emitting element.

7. The light emitting element according to claim 6, wherein the intermediate layer has a thickness of $(\lambda_0/2 n_M)$ or more.

8. The light emitting element according to claim 1, wherein
$0.8 < n_0/n_M < 1.2$ is satisfied,
where
  $n_0$ is a refractive index of a material of the electrode, and
  $n_M$ is a refractive index of a material of the intermediate layer.

9. The light emitting element according to claim 8, wherein $0.95 < n_0/n_M < 1.05$ is satisfied.

10. The light emitting element according to claim 1, wherein $|n_O - n_M| \leq 0.1$ is satisfied, where
- $n_O$ is a refractive index of a material of the electrode, and
- $n_M$ is a refractive index of a material of the intermediate layer.

11. The light emitting element according to claim 1, wherein
- a material of the intermediate layer is different from a material of a first thin film of the second plurality of thin films of the second light reflecting layer,
- the first thin film of the second light reflecting layer is in contact with the intermediate layer,
- the material of the intermediate layer is same as a material of a second thin film of the second plurality of thin films of the second light reflecting layer, and
- the second thin film of the second light reflecting layer is in contact with the first thin film of the second light reflecting layer.

12. The light emitting element according to claim 1, wherein
- a material of the intermediate layer is different from a material of a first thin film of the second plurality of thin films of the second light reflecting layer,
- the first thin film of the second light reflecting layer is in contact with the intermediate layer,
- the material of the intermediate layer is different from a material of a second thin film of the second plurality of thin films of the second light reflecting layer,
- the second thin film of the second light reflecting layer is in contact with the first thin film of the second light reflecting layer, and
- the material of the first thin film of the second light reflecting layer is different from the material of the second thin film of the second light reflecting layer.

13. The light emitting element according to claim 1, wherein
- the active layer is in a vicinity of a maximum amplitude portion of a light field intensity distribution of light emitted from the light emitting element, and
- the intermediate layer is in a vicinity of a minimum amplitude portion of the light field intensity distribution.

14. The light emitting element according to claim 1, further comprising a substrate, wherein
- the first compound semiconductor layer is on a surface of the substrate, and
- the surface of the substrate has a plurality of parallel grooves.

15. The light emitting element according to claim 14, wherein the substrate includes a GaN substrate having a {20-21} plane as a main surface.

16. A light emitting element, comprising:
- a substrate, wherein a surface of the substrate has a plurality of grooves;
- a layered structure that includes:
- a first light reflecting layer that includes a first plurality of thin films;
- a light emitting structure; and
- a second light reflecting layer that includes a second plurality of thin films,
- wherein the light emitting structure is between the first light reflecting layer and the swecond light reflecting layer, and
- the light emitting structure includes:
- a first compound semiconductor layer on the first light reflecting layer and the surface of the substrate;
- an active layer on the first compound semiconductor layer; and
- a second compound semiconductor layer on the active layer; an intermediate layer between the second compound semiconductor layer and the second light reflecting layer; and
- an electrode between the intermediate layer and the second compound semiconductor layer, wherein a first surface of the intermediate layer faces the electrode, a second surface of the intermediate layer is in contact with the second light reflecting layer, and a value of a surface roughness of the second surface of the intermediate layer is less than a value of a surface roughness of the first surface of the intermediate layer.

* * * * *